(12) United States Patent
Yanagigawa

(10) Patent No.: US 9,698,773 B2
(45) Date of Patent: Jul. 4, 2017

(54) SEMICONDUCTOR DEVICE

(71) Applicant: Renesas Electronics Corporation, Kanagawa (JP)

(72) Inventor: Hiroshi Yanagigawa, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/806,022

(22) Filed: Jul. 22, 2015

(65) Prior Publication Data

US 2016/0043714 A1      Feb. 11, 2016

(30) Foreign Application Priority Data

Aug. 6, 2014   (JP) .................. 2014-160452

(51) Int. Cl.
*H03B 1/00*      (2006.01)
*H03K 3/00*      (2006.01)
*H03K 17/687*    (2006.01)
*H03K 17/081*    (2006.01)

(52) U.S. Cl.
CPC ..... *H03K 17/687* (2013.01); *H03K 17/08104* (2013.01); *H03K 2217/0063* (2013.01); *H03K 2217/0072* (2013.01)

(58) Field of Classification Search
CPC ..................................................... H03K 17/687
USPC .................................................... 327/109–112
See application file for complete search history.

(56) References Cited

U.S. PATENT DOCUMENTS 8,217,487 B2 *   7/2012   Choi ................... H03K 17/063
                                                        257/500

FOREIGN PATENT DOCUMENTS

JP        2007-184677 A        7/2007

* cited by examiner

*Primary Examiner* — Lincoln Donovan
*Assistant Examiner* — Metasebia Retebo
(74) *Attorney, Agent, or Firm* — Mattingly & Malur, PC

(57) ABSTRACT

The present invention is provided to easily manufacture an IPD as any of a high-side switch and a low-side switch. A level shifting circuit is coupled to an input terminal, a first terminal, and a grounding terminal. Drive power of the level shifting circuit is supplied from the first terminal. An output signal of the level shifting circuit is input to a driver circuit. The driver circuit is coupled to the first terminal and a second terminal. Drive power of the driver circuit is supplied from the first terminal. A transistor has a gate electrode coupled to the driver circuit, a source coupled to the second terminal, and a drain coupled to a third terminal.

9 Claims, 40 Drawing Sheets

A-A' (PKG)

A-A' (PKG)

A-A' (PKG)

A-A' (PKG)

A-A' (PKG)

SEMICONDUCTOR DEVICE

CROSS-REFERENCE TO RELATED APPLICATIONS

The disclosure of Japanese Patent Application No. 2014-160452 filed on Aug. 6, 2014 including the specification, drawings and abstract is incorporated herein by reference in its entirety.

BACKGROUND

The present invention relates to a semiconductor device and, for example, to a technique applicable to an IPD (Intelligent Power Device).

There is a case that a load (for example, a motor of a car) is driven by using a semiconductor device. In such a case, an IPD is sometimes used as a semiconductor device. Patent literature 1 describes an example of an IPD. The IPD is provided with a transistor (switch) on a high potential side. In other words, the IPD is a high-side switch. The gate electrode of the transistor is coupled to a driver circuit. The on/off state of the gate electrode is controlled by the driver circuit. In the IPD, the drive power of the driver circuit is supplied directly from a power supply.

LITERATURE OF RELATED ART

Patent Literature

Patent Literature 1
Japanese Unexamined Patent Application Publication No. 2007-184677

SUMMARY

As described above, there is a case that an IPD is used as a high-side switch. In another case, an IPD is used as a low-side switch. In the low-side switch, a transistor (switch) is provided on the low potential side with respect to a load. The inventors of the present invention have examined structures which can be easily manufactured as any of high-side and low-side switches. The other subjects and a novel feature will be apparent from the description of the specification and the appended drawings.

According to an embodiment, a semiconductor device includes a power supply terminal, a grounding terminal, an input terminal, a first terminal, a second terminal, and a third terminal. The semiconductor device also includes a level shifting circuit, a driver circuit, a first transistor, and a first element. The level shifting circuit is coupled to the input terminal, the first terminal, and the grounding terminal. An output signal of the level shifting circuit is input to the driver circuit. The driver circuit is coupled to the first and second terminals. The first transistor has a gate electrode coupled to the driver circuit, a source coupled to the second terminal, and a drain coupled to the third terminal. The first element is a diode or a second transistor. The first element is coupled to the first terminal.

According to another embodiment, a semiconductor device has a power supply terminal, a grounding terminal, an input terminal, a first terminal, and a second terminal. The semiconductor device also has a level shifting circuit, a driver circuit, a first transistor, and a first element. The level shifting circuit is coupled to the input terminal, the first terminal, and the grounding terminal. An output signal of the level shifting circuit is input to the driver circuit. The driver circuit is coupled to the first and second terminals. The first transistor has a gate electrode coupled to the driver circuit, a source coupled to the second terminal, and a drain coupled to the power supply terminal. The first element is a diode or a second transistor. The first element couples the power supply terminal to the first terminal.

According to further another embodiment, a semiconductor device includes a power supply terminal, a grounding terminal, an input terminal, a first terminal, and a second terminal. The semiconductor device also includes a level shifting circuit, a driver circuit, a first transistor, and a first element. The level shifting circuit is coupled to the input terminal, the first terminal, and the grounding terminal. An output signal of the level shifting circuit is input to the driver circuit. The driver circuit is coupled to the first terminal and the grounding terminal. The first transistor has a gate electrode coupled to the driver circuit, a source coupled to the grounding terminal, and a drain coupled to the second terminal. The first element couples the power supply terminal to the first terminal.

According to the embodiment, an IPD can be easily manufactured as any of a high-side switch and a low-side switch.

DETAILED DESCRIPTION

Figure 1:
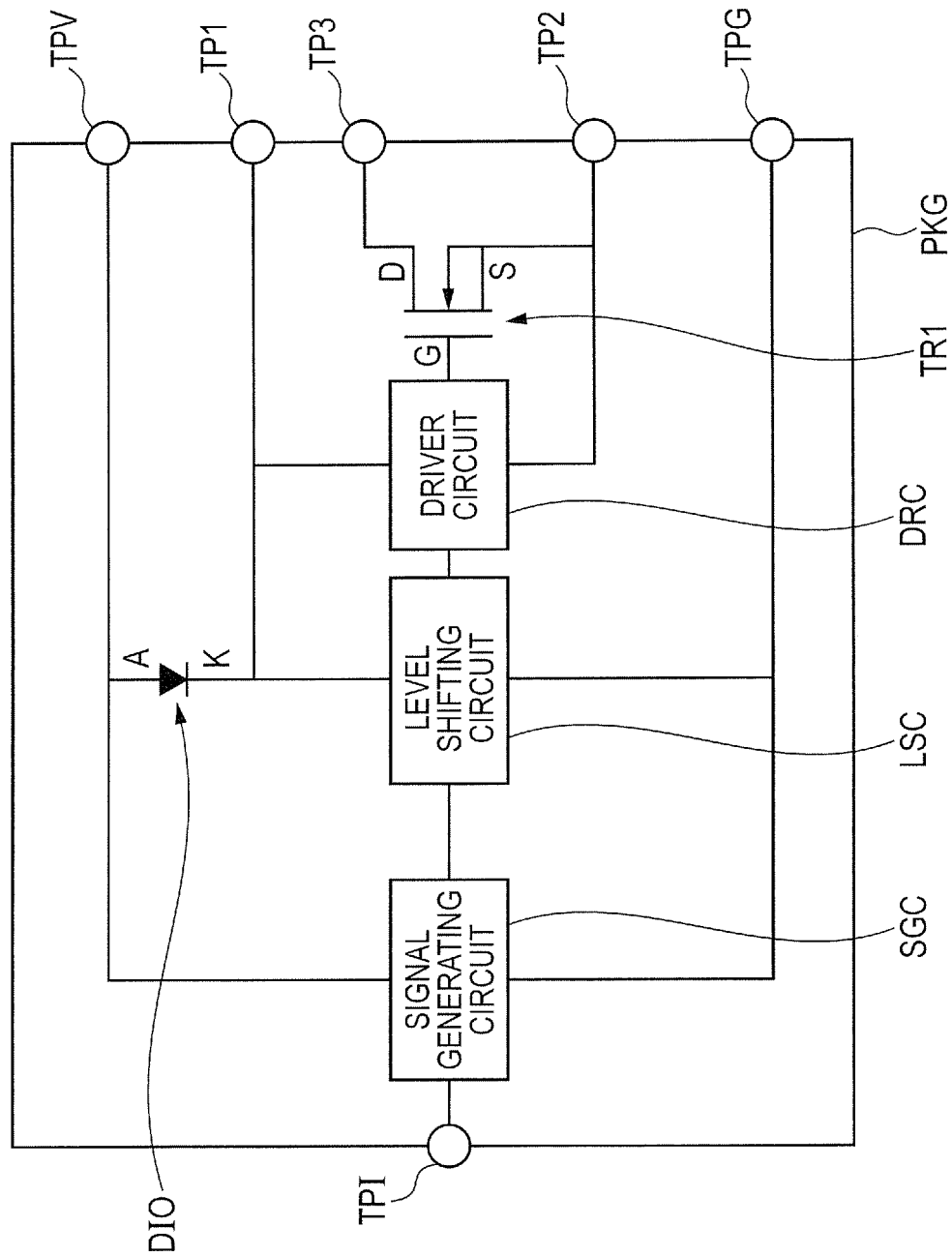
FIG. 1 is a diagram illustrating the circuit configuration of a semiconductor device according to a first embodiment.

Hereinafter, embodiments will be described with reference to the drawings. In all of the drawings, similar reference numerals are designated to similar components and repetitive description will not be given.

First Embodiment

FIG. 1 is a diagram illustrating the circuit configuration of a semiconductor device according to a first embodiment. The semiconductor device has a semiconductor package PKG. The semiconductor package PKG has a power supply terminal TPV, a grounding terminal TPG, an input terminal TPI, a first terminal TP1, a second terminal TP2, and a third terminal TP3. Each of the terminals is, for example, a lead. The semiconductor package PKG further includes a signal generating circuit SGC, a level shifting circuit LSC, a driver circuit DRC, a transistor TR1 (first transistor), and a diode DIO (first element).

The signal generating circuit SGC is coupled to the power supply terminal TPV, the grounding terminal TPG, and the input terminal TPI. On the basis of input voltage of the input terminal TPI, the signal generating circuit SGC outputs a high signal (first voltage) or a low signal (second voltage lower than the first voltage) to the level shifting circuit LSC. Concretely, when the input voltage of the input terminal TPI is equal to or higher than a first threshold voltage, the signal generating circuit SGC outputs a high signal to the level shifting circuit LSC. On the other hand, when the input voltage of the input terminal TPI is lower than the first threshold voltage, the signal generating circuit SGC outputs a low signal to the level shifting circuit LSC. In this case, the high signal is a voltage of the power supply terminal TPV (power supply voltage).

The level shifting circuit LSC accepts the output signal of the signal generating circuit SGC. On the other hand, drive power of the level shifting circuit LSC is supplied from the first terminal TP1. Concretely, the level shifting circuit LSC is coupled to the first terminal TP1 and the grounding terminal TPG. In this case, as will be described later, drive power of the level shifting circuit LSC is supplied by voltage between the first terminal TP1 and the grounding terminal TPG. When the voltage of the signal generating circuit SGC is a high signal, the level shifting circuit LSC boosts the high signal. In this case, the level shifting circuit LSC transmits the boosted signal to the driver circuit DRC. On the other hand, when the signal generating circuit SGC is a low signal, the level shifting circuit LSC transmits a signal (for example, 0V) of a potential lower than the low signal to the driver circuit DRC.

The driver circuit DRC accepts the output signal of the level shifting circuit LSC. On the other hand, the drive power of the driver circuit DRC is supplied from the first terminal TP1. Concretely, the driver circuit DRC is coupled to the first terminal TP1 and a second terminal TP2. In this case, as will be described later, the drive power of the driver circuit DRC is supplied according to the voltage between the first terminal TP1 and the second terminal TP2. The driver circuit DRC drives the transistor TR1. Concretely, the driver circuit DRC controls the on/off state of the transistor TR1 by sending the above-described signal from the level shifting circuit LSC to the transistor TR1.

The gate electrode (G) of the transistor TR1 is coupled to the driver circuit DRC. In the example illustrated in the diagram, the transistor TR1 is an n-type MOSFET. The source (S) of the transistor TR1 is coupled to the second terminal TP2 and the drain (D) is coupled to the third terminal TP3.

The diode DIO couples the power supply terminal TPV to the first terminal TP1. In the example illustrated in the diagram, the anode (A) of the diode DIO is coupled to the power supply terminal TPV, and the cathode (K) is coupled to the first terminal TP1. In other words, the direction from the power supply terminal TPV to the first terminal TP1 in the diode DIO is a forward direction.

Figure 2:
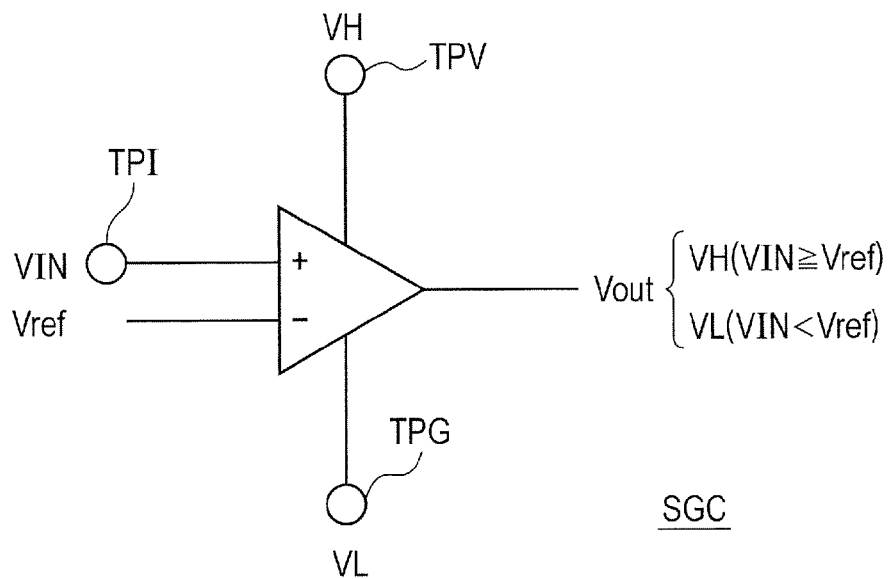
FIG. 2 is a diagram illustrating an example of a circuit configuration of a signal generating circuit depicted in FIG. 1.

FIG. 2 is a diagram illustrating an example of the circuit configuration of the signal generating circuit SGC depicted in FIG. 1. In the example illustrated in the diagram, the signal generating circuit SGC is a comparator. To the non-inversion input terminal (+) of the comparator, an input voltage VIN of the input terminal TPI is supplied. On the other hand, to the inversion input terminal (−) of the comparator, a first threshold voltage Vref is supplied. Further, to the comparator, a power supply voltage VH is supplied from the power supply terminal TPV, and a grounding potential VL is supplied from the grounding terminal TPG. In the example illustrated in the diagram, when the input voltage VIN is equal to or higher than the first threshold voltage Vref, the comparator outputs the grounding potential VL as the output voltage Vout.

Figure 3:
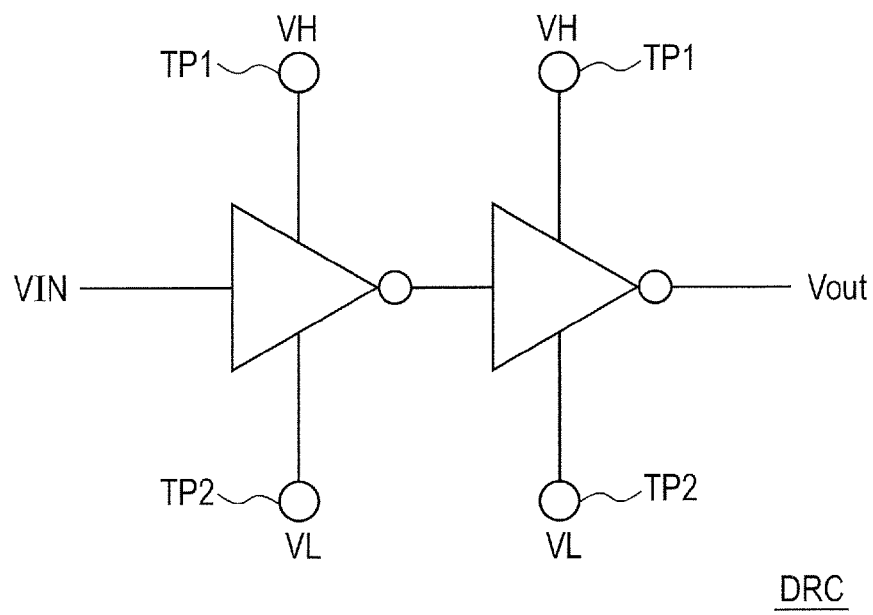
FIG. 3 is a diagram illustrating an example of a circuit configuration of a driver circuit depicted in FIG. 1.

FIG. 3 is a diagram illustrating an example of the circuit configuration of the driver circuit DRC depicted in FIG. 1. In the example illustrated in the diagram, the driver circuit DRC is a circuit in which two inverters are coupled in series. In the example illustrated in the diagram, the input voltage VIN is inverted twice and becomes the output voltage Vout. In this case, the output voltage Vout is almost equal to the input voltage VIN. In each of the inverters, current is amplified.

Figure 4:
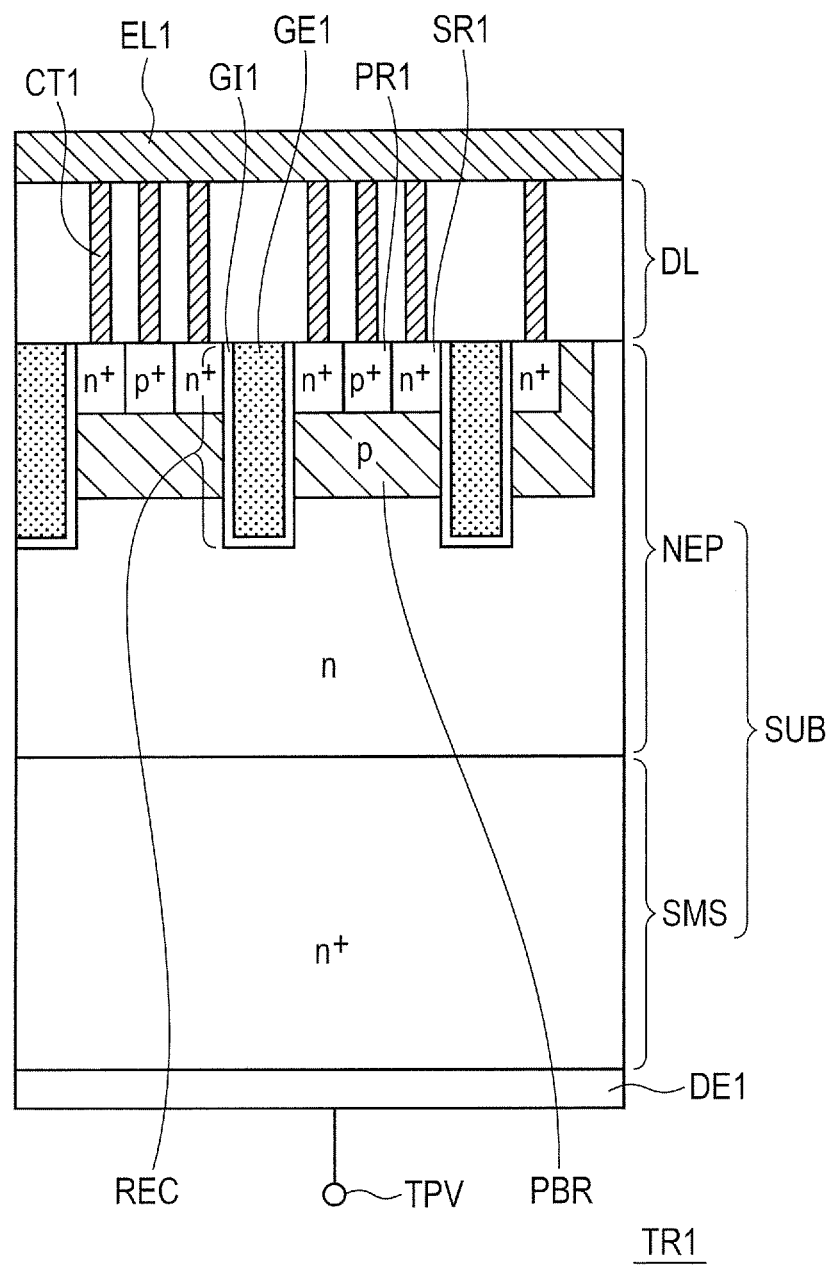
FIG. 4 is a cross section illustrating an example of the configuration of a transistor depicted in FIG. 1.

FIG. 4 is a cross section illustrating an example of the configuration of the transistor TR1 depicted in FIG. 1. The transistor TR1 is formed by using a substrate SUB. The transistor TR1 is a vertical power transistor.

The substrate SUB has a semiconductor substrate SMS and a first-conduction-type semiconductor layer NEP. The semiconductor substrate SMS is, for example, a silicon substrate. In the example illustrated in the diagram, the semiconductor substrate SMS is a first-conduction-type substrate. The semiconductor substrate SMS has impurity concentration higher than that of the first-conduction-type semiconductor layer NEP. The first-conduction-type semiconductor layer NEP is, for example, an epitaxial layer formed on the semiconductor substrate SMS. In the first-conduction-type semiconductor layer NEP, a second-conduction-type base region PBR is formed. The transistor TR1 is formed by using the second-conduction-type base region PBR.

In the example illustrated in the diagram, the first conduction type is the n type, and the second conduction type is the p type. Alternatively, the first conduction type may be the p type, and the second conduction type may be the n type. Hereinafter, description will be given on assumption that the first conduction type is the n type, and the second conduction type is the p type.

The transistor TR1 has a drain electrode DE1 on the back side of the substrate SUB. The drain electrode DE1 is formed by, for example, aluminum (Al). As will be described in detail, the transistor TR1 has a source (source region SR1) in the face on the side opposite to the drain electrode DE1 of the substrate SUB. With the configuration, the transistor TR1 becomes a vertical transistor.

In the second-conduction-type base region PBR, a plurality of recesses REC are formed. The bottom of each of the recesses REC is positioned deeper than the bottom of the second-conduction-type base region PBR. Along the bottom face and the inner face of each of the recesses REC, a gate insulating film GI1 is formed. Further, a gate electrode GE1 is buried in each of the recesses REC. The gate insulating film GI1 is formed by, for example, a silicon oxide film ($SiO_2$). The gate electrode GE1 is formed of, for example, aluminum (Al).

In the example illustrated in the diagram, the second-conduction-type base region PBR has source regions SR1 on both sides of the recess REC. Further, the second-conduction-type base region PBR has a second-conduction-type region PR1 between the neighboring source regions SR1. The source region SR1 is a first-conduction-type region. The second-conduction-type region PR1 is a region whose impurity concentration is higher than that of the second-conduction-type base region PBR. More specifically, the second-conduction-type region PR1 is a conduction-type region for supplying a reference potential to the second-conduction-type base region PBR. As illustrated in the diagram, the source region SR1 and the second-conduction-type region PR1 are shallower than the second-conduction-type base region PBR.

On the substrate SUB, an insulating layer DL (for example, a silicon oxide film ($SiO_2$)) is formed. In the insulating layer DL, a contact CT1 is buried. Further, on the insulating film DL, an electrode EL1 is provided. The source region SR1 and the second-conduction-type region PR1 are coupled to the electrode EL1 via the contact CT1. The contact CT1 and the electrode EL1 are made of, for example, aluminum (Al).

Figure 5:
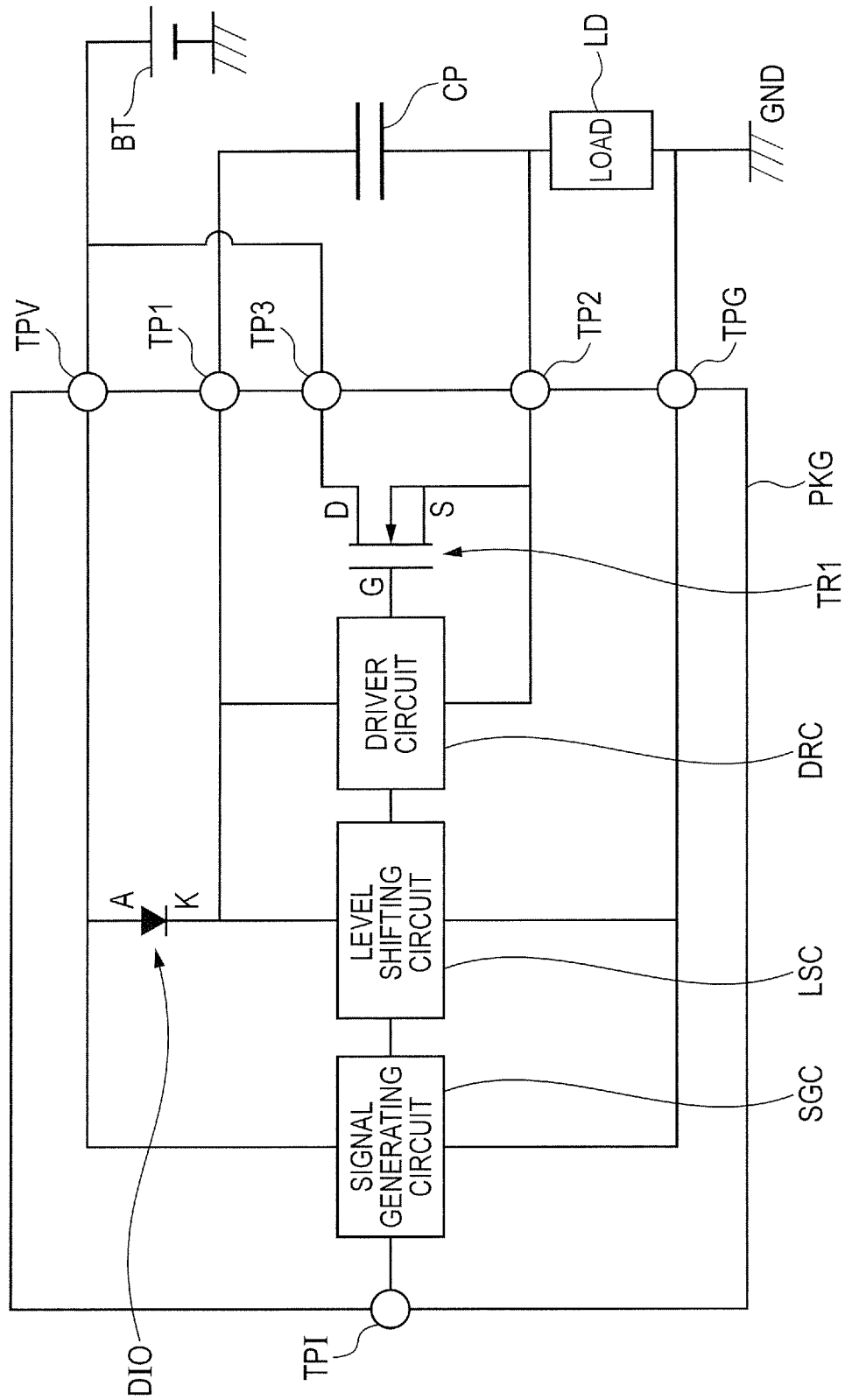
FIG. 5 is a diagram illustrating a first example of the circuit configuration of an electronic device according to the first embodiment.

FIG. 5 is a diagram illustrating a first example of the circuit configuration of an electronic device according to the embodiment. The electronic device is used for, for example, a vehicle (such as a car). The electronic device has the semiconductor package PKG. The electronic device also includes a power supply BT, a load LD, and a capacitor CP. The power supply BT is, for example, a battery mounted in the vehicle. The load LD is, for example, an electric part (such as a motor and a head lamp) mounted in the vehicle.

In the example illustrated in the diagram, the semiconductor package PKG is used as a high-side switch of the load LD. Concretely, the power supply BT, the load LD, and the capacitor CP are provided on the outside of the semiconductor package PKG. In this case, the semiconductor package PKG and the capacitor CP are provided, for example, over the same circuit board (not illustrated). The power supply BT supplies power supply voltage to the power supply terminal TPV and the third terminal TP3. The load LD couples the second terminal TP2 to the grounding terminal TPG. The capacitor CP coupels the second terminal TP2 to the first terminal TP1. The grounding terminal TPG is grounded.

Figure 6:
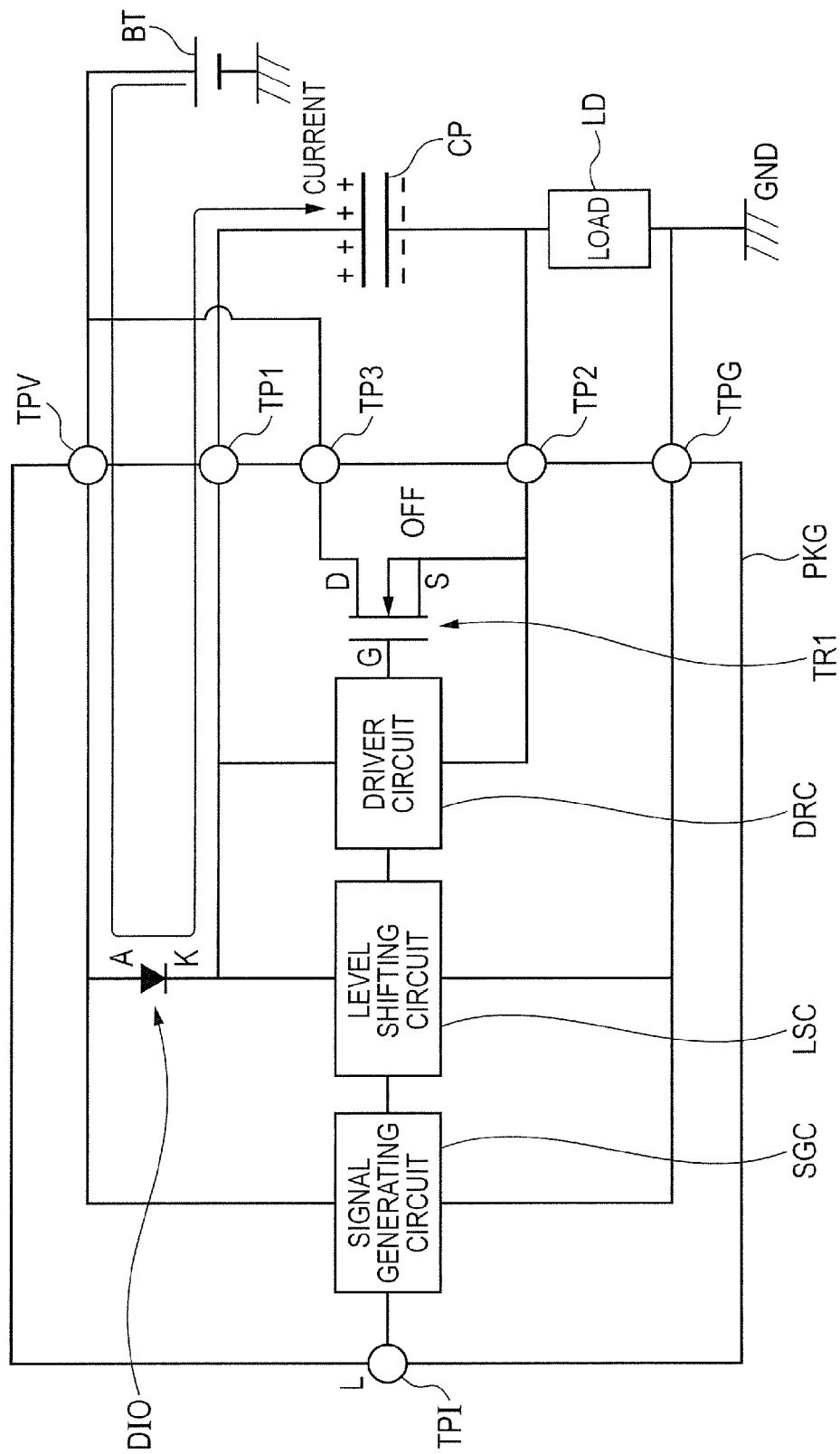
FIG. 6 is a diagram for explaining operation of the electronic device illustrated in FIG. 5.
Figure 7:
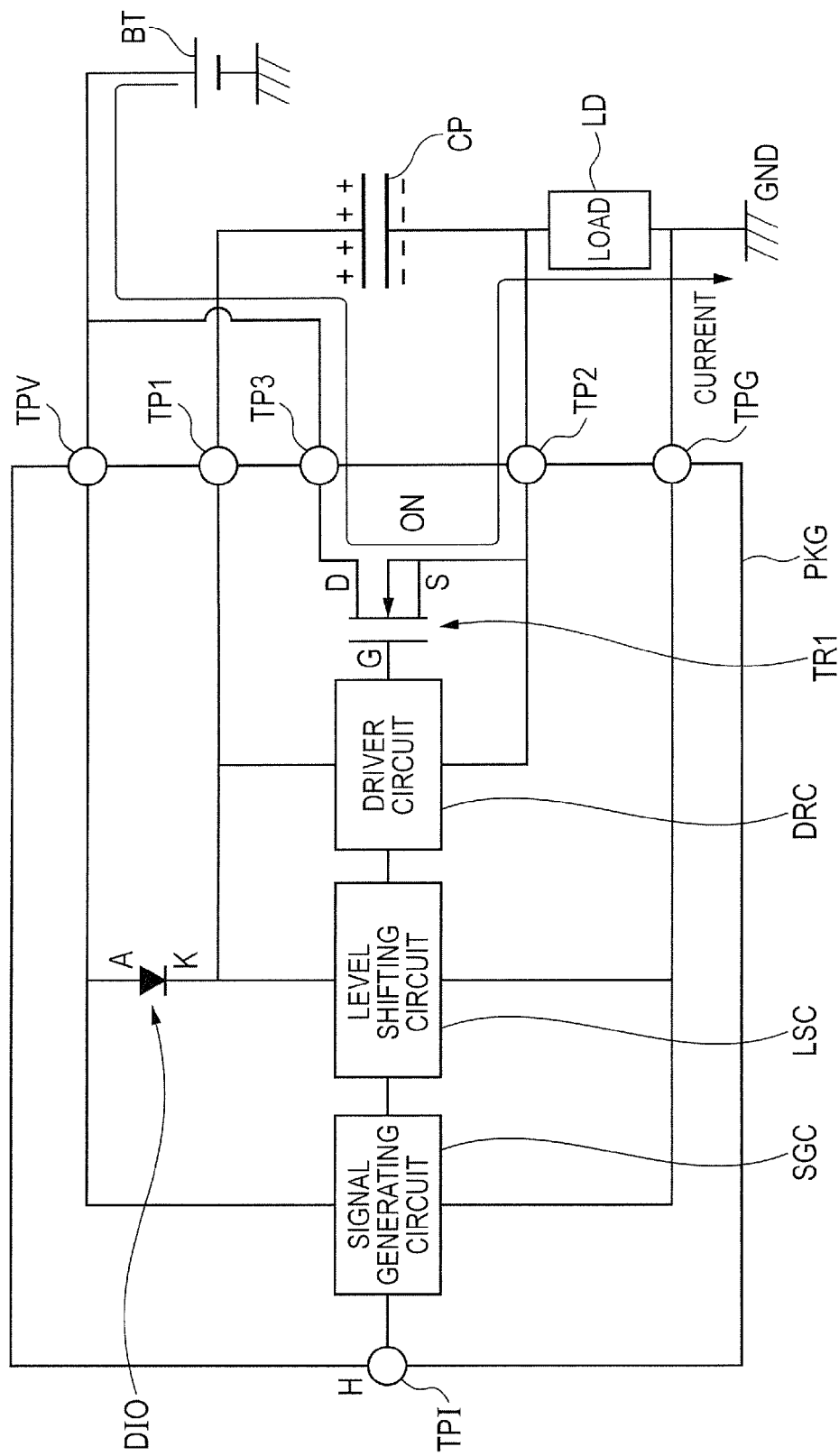
FIG. 7 is a diagram for explaining operation of the electronic device illustrated in FIG. 5.

Each of FIGS. 6 and 7 is a diagram for explaining operation of the electronic device illustrated in FIG. 5. An example illustrated in FIG. 6 relates to the case where the input voltage of the input terminal TPI is a low (L) level voltage (voltage lower than the above-described first threshold voltage). In this case, the transistor TR1 is in an off state. An example illustrated in FIG. 7 relates to the case where the input voltage of the input terminal TPI is a high (H) level voltage (voltage equal to or higher than the above-described first threshold voltage). In this case, the transistor TR1 is in an on state.

First, in the example illustrated in FIG. 6, the capacitor CP is charged by the power supply BT. Specifically, as described above, the transistor TR1 is in the off state. In this case, no current flows in the transistor TR1. Consequently, as illustrated in the diagram, current flows from the power supply BT, via the power supply terminal TPV, the diode DIO, and the first terminal TP1, to the capacitor CP. In this case, the capacitor CP is charged with the above-described current. When charging progresses, in the capacitor CP, the potential on the first terminal TP1 side (the potential on the + side in the diagram) becomes higher than the potential on the second terminal TP2 side (the potential on the − side).

Next, in the example illustrated in FIG. 7, each of the power supply voltage to the level shifting circuit LSC and the power supply voltage to the driver circuit DRC is given by the capacitor CP. Specifically, as described above, the transistor TR1 is in the on state. Consequently, as illustrated in the diagram, current flows from the power supply BT to the ground (GND) via the first terminal TP1, the transistor TR1, the second terminal TP2, and the load LD. In this case, in the capacitor CP, the potential on the second terminal TP2 side (the potential on the − side in the diagram) is increased by the power supply voltage of the power supply BT. Accordingly, in the capacitor CP, the potential on the first terminal TP1 side (the potential on the + side in the diagram) increases only by the amount of the voltage increased on the second terminal TP2 side. In this case, the potential of the first terminal TP1 can be made higher than the power supply voltage of the power supply BT. In other words, the capacitor CP can function as a boot strap capacitor.

In the above-described case, by the capacitor CP, the potential of the first terminal TP1 becomes higher than any of the potential of the second terminal TP2 and the potential of the grounding terminal TPG. Consequently, the capacitor CP can function as each of the power supply of the signal generating circuit SGC and the power supply of the driver circuit DRC.

Figure 8:
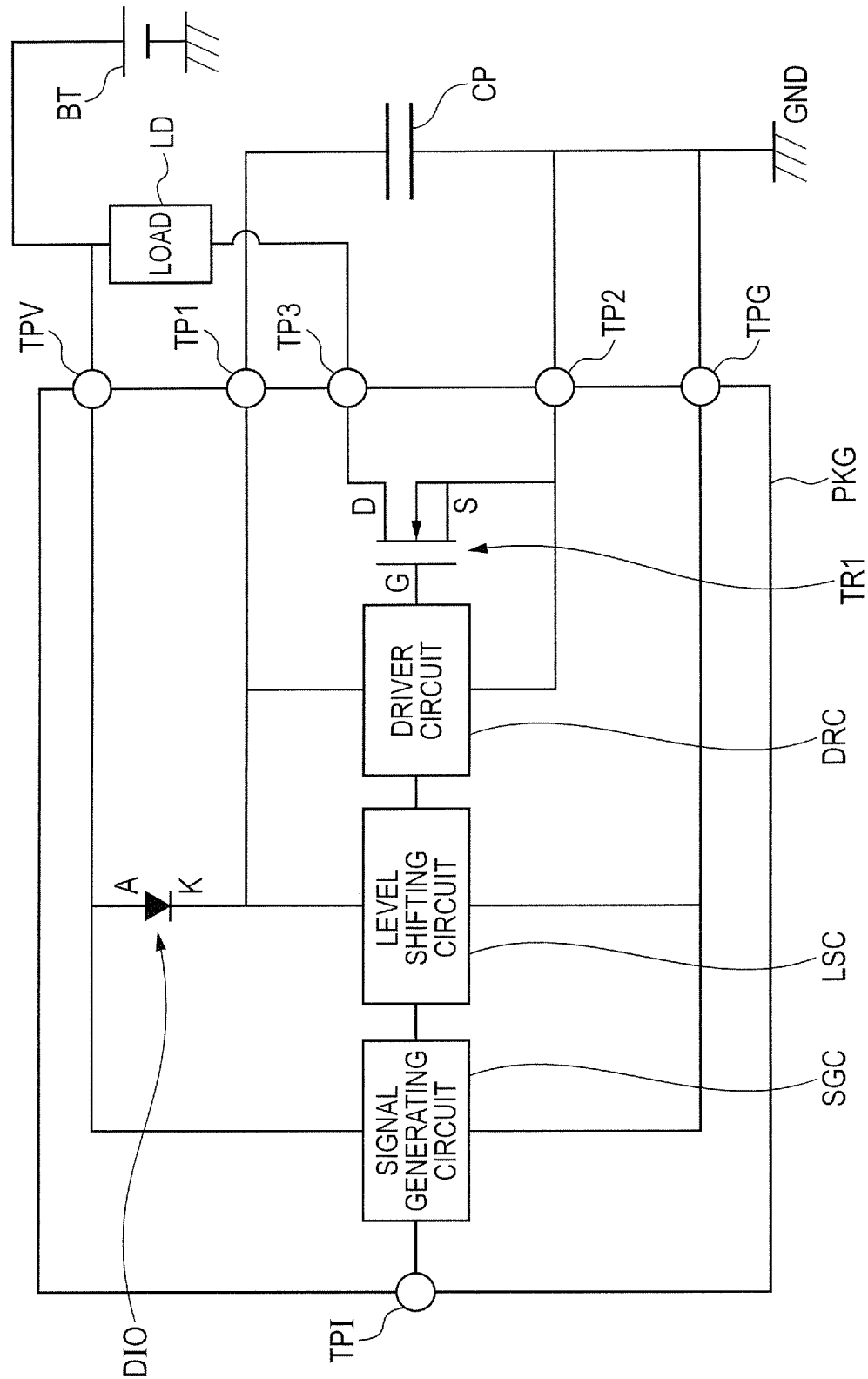
FIG. 8 is a diagram illustrating a second example of the circuit configuration of the electronic device according to the first embodiment.

FIG. 8 is a diagram illustrating a second example of the circuit configuration of the electronic device according to the embodiment. Like the example illustrated in FIG. 5, the electronic device is also used for, for example, a vehicle (such as a car). The electronic device has the semiconductor package PKG illustrated in FIG. 1. Like the example illustrated in FIG. 5, the electronic device also includes the power supply BT, the load LD, and the capacitor CP.

In the example illustrated in the diagram, the semiconductor package PKG is used as a low-side switch of the load LD. Concretely, the power supply BT, the load LD, and the capacitor CP are provided on the outside of the semiconductor package PKG. In this case, the semiconductor package PKG and the capacitor CP are provided, for example, over the same circuit board (not illustrated). The power supply BT is coupled to the power supply terminal TPV, and is also coupled to the third terminal TP3 via the load LD. The capacitor CP couples the second terminal TP2 to the first terminal TP1. The second terminal TP2 and the grounding terminal TPG are grounded.

Figure 9:
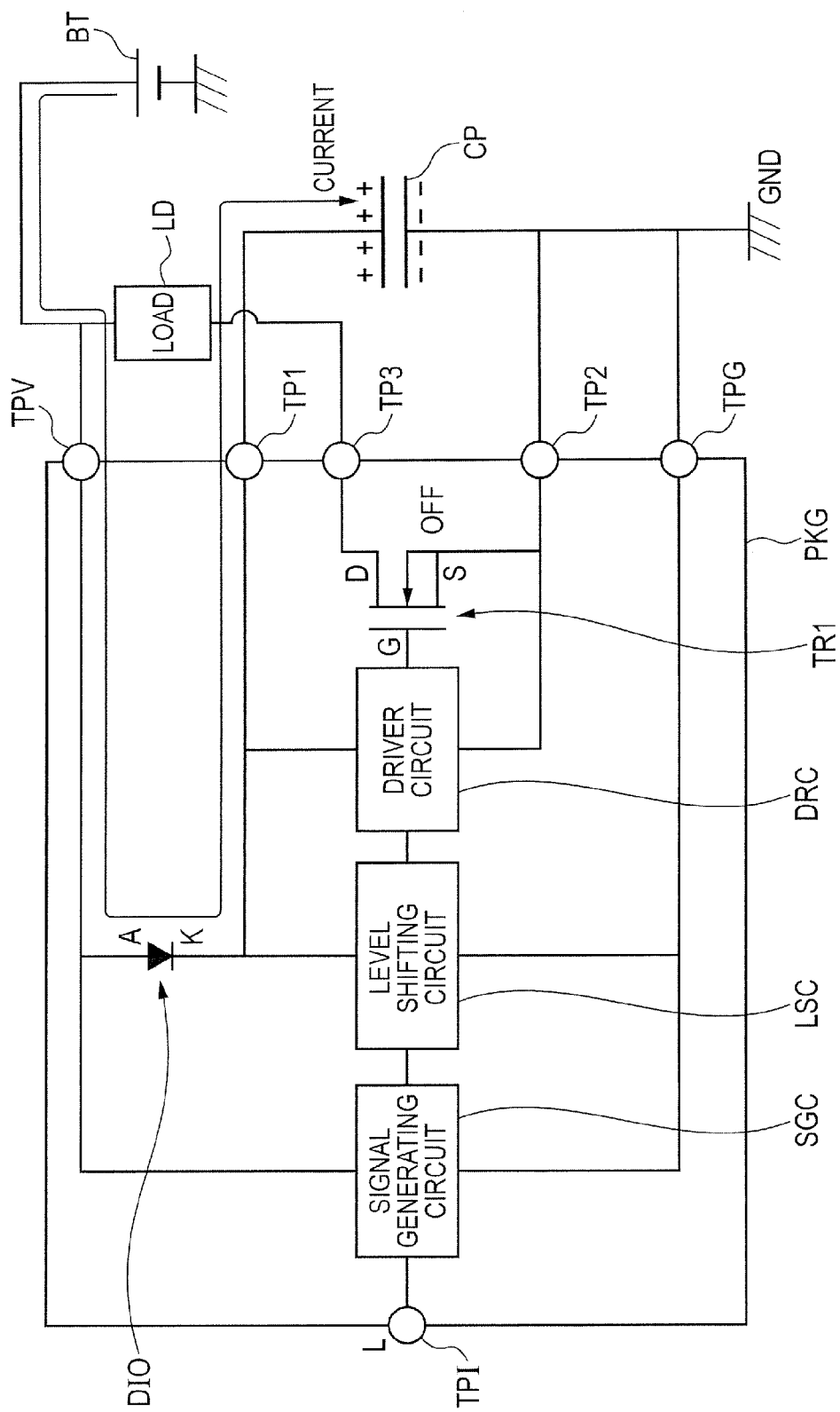
FIG. 9 is a diagram for explaining the operation of the electronic device illustrated in FIG. 8.
Figure 10:
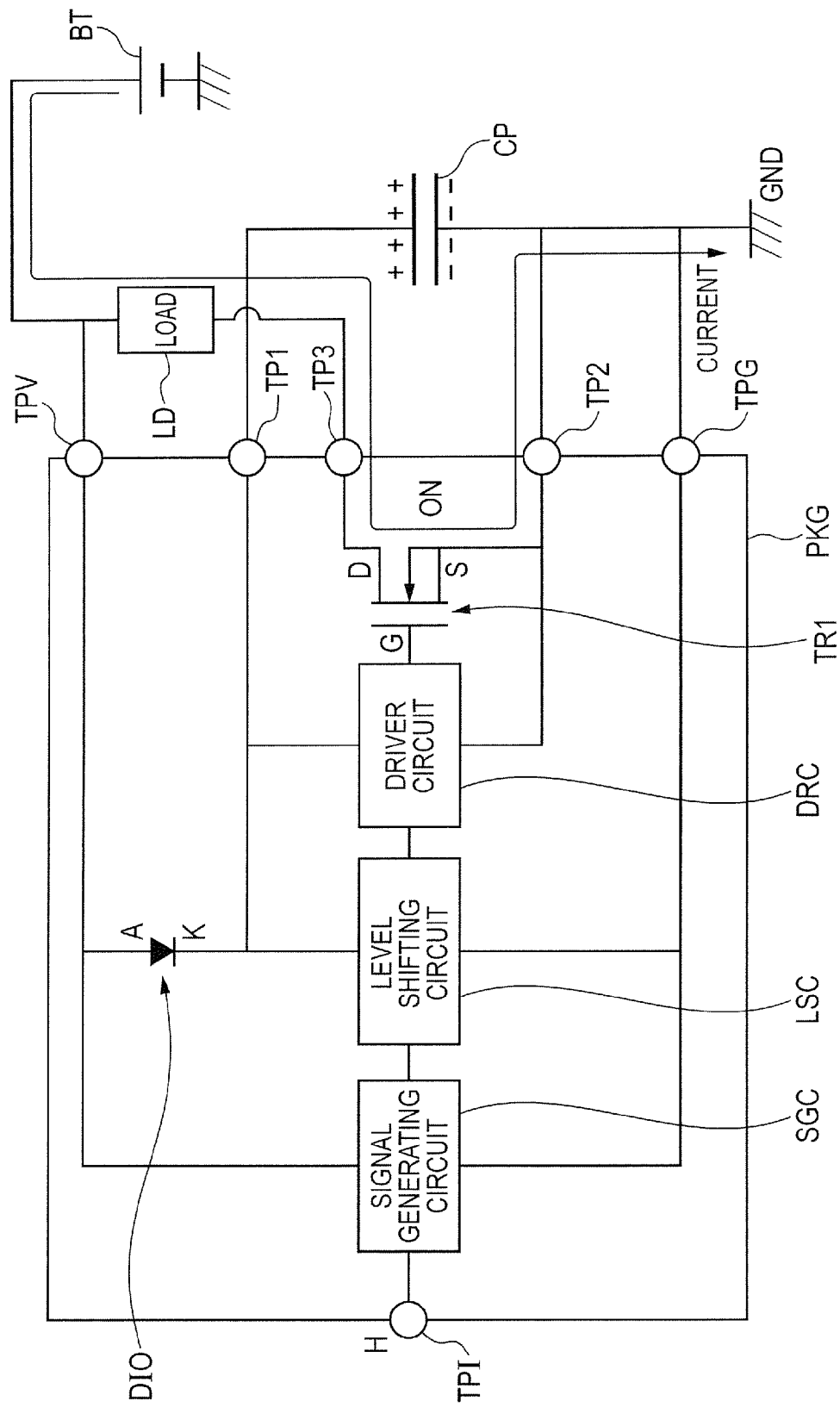
FIG. 10 is a diagram for explaining the operation of the electronic device illustrated in FIG. 8.

Each of FIGS. 9 and 10 is a diagram for explaining operation of the electronic device illustrated in FIG. 8. An example illustrated in FIG. 9 relates to the case where the input voltage of the input terminal TPI is a low (L) level voltage (voltage lower than the above-described first threshold voltage). In this case, the transistor TR1 is in an off state. An example illustrated in FIG. 10 relates to the case where the input voltage of the input terminal TPI is a high (H) level voltage (voltage equal to or higher than the above-described first threshold voltage). In this case, the transistor TR1 is in an on state.

First, in the example illustrated in FIG. 9, the capacitor CP is charged by the power supply BT. Specifically, as described above, the transistor TR1 is in the off state. In this case, no current flows in the transistor TR1. Consequently, as illustrated in the diagram, current flows from the power supply BT to the capacitor CP via the power supply terminal TPV, the diode DIO, and the first terminal TP1. In this case, the capacitor CP is charged with the above-described current. When charging progresses, in the capacitor CP, the potential on the first terminal TP1 side (the potential on the + side in the diagram) becomes higher than the potential on the second terminal TP2 side (the potential on the − side in the diagram).

Next, in the example illustrated in FIG. 10, each of the power supply voltage to the level shifting circuit LSC and the power supply voltage to the driver circuit DRC is given by the capacitor CP. Specifically, as described above, the transistor TR1 is in the on state. Consequently, current flows from the power supply BT to the ground (GND) via the load LD, the third terminal TP3, the transistor TR1, and the second terminal TP2. Also in the example illustrated in the diagram, the second terminal TP2 remains grounded. Accordingly, in the capacitor CP, the potential on the first terminal TP1 side (the potential on the + side in the diagram) remains higher than the potential on the second terminal TP2 side (the potential on the − side in the diagram). Consequently, the potential of the first terminal TP1 can be made higher than any of the potential of the second terminal TP2 and the potential of the grounding terminal TPG.

In the above-described case, by the capacitor CP, the potential of the first terminal TP1 becomes higher than any of the potential of the second terminal TP2 and the potential of the grounding terminal TPG. Consequently, the capacitor CP can function as each of the power supply of the signal generating circuit SGC and the power supply of the driver circuit DRC.

Figure 11:
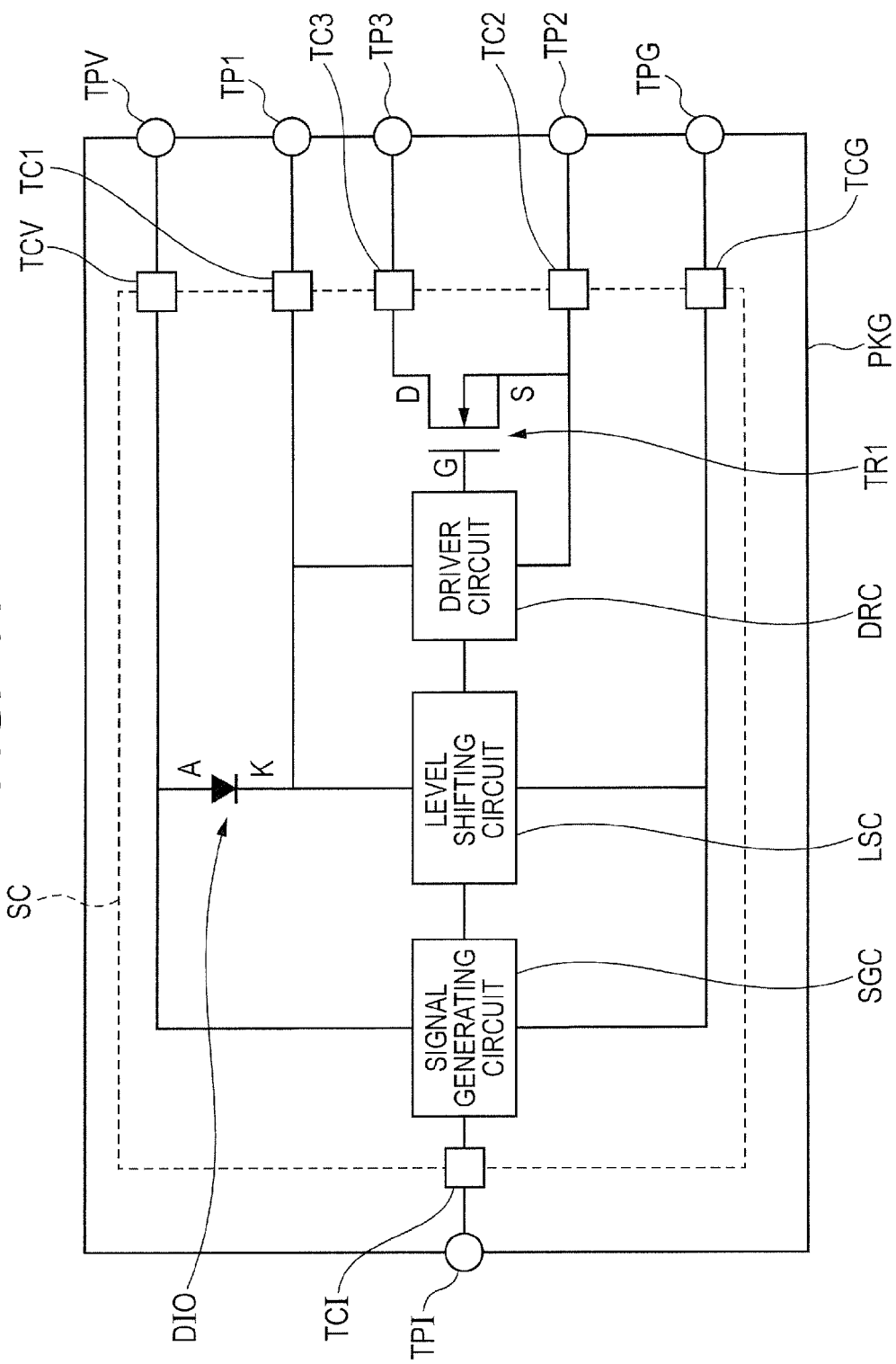
FIG. 11 is a diagram illustrating the details of a semiconductor package depicted in FIG. 1.

FIG. 11 is a diagram illustrating the details of the semiconductor package PKG depicted in FIG. 1. In the example illustrated in the diagram, a semiconductor chip SC is provided in the semiconductor package PKG. The semiconductor chip SC has the signal generating circuit SGC, the level shifting circuit LSC, the driver circuit DRC, the transistor TR1, and the diode DIO. The semiconductor chip SC also includes a power supply terminal TCV, a grounding terminal TCG, an input terminal TCI, a first terminal TC1, a second terminal TC2, and a third terminal TC3. Each of the terminals is, for example, a pad. The semiconductor package PKG has the power supply terminal TPV, the grounding terminal TPG, the input terminal TPI, the first terminal TP1, the second terminal TP2, and the third terminal TP3.

The power supply terminal TCV, the grounding terminal TCG, the input terminal TCI, the first terminal TC1, the second terminal TC2, and the third terminal TC3 are coupled to the power supply terminal TPV, the grounding terminal TPG, the input terminal TPI, the first terminal TP1, the second terminal TP2, and the third terminal TP3, respectively. In this case, the terminals (for example, pads) of the semiconductor chip SC are coupled to the terminals (for example, leads) of the semiconductor package PKG via, for example, bonding members (such as bonding wires or bonding ribbons).

Figure 12:
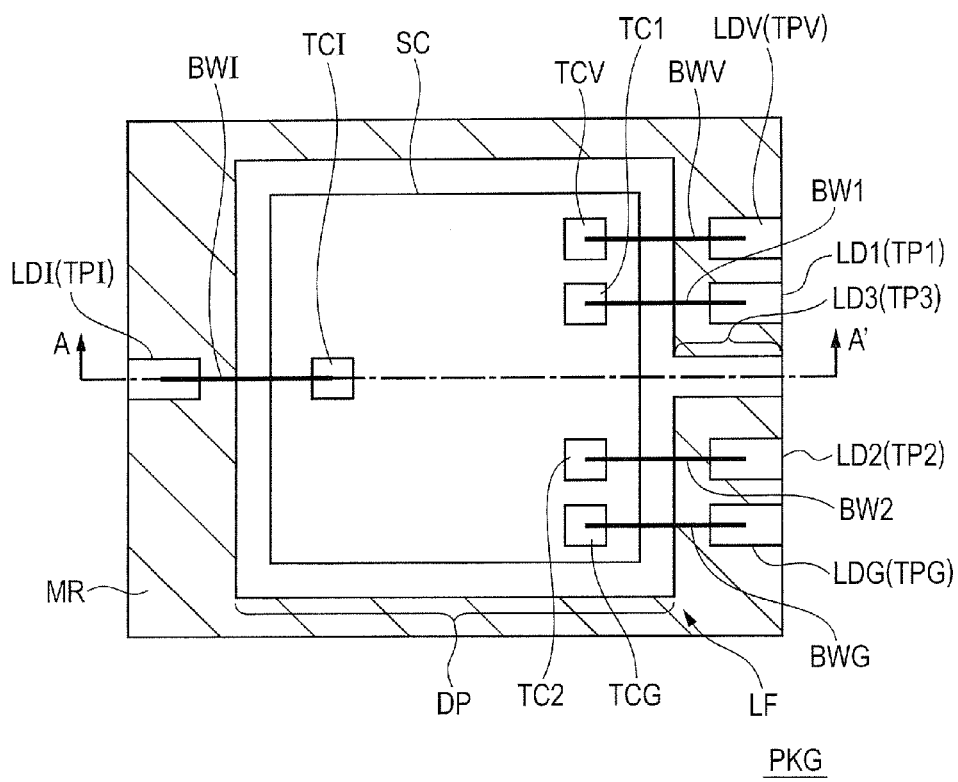
FIG. 12 is a plan view illustrating an example of the configuration of the semiconductor package depicted in FIG. 11.
Figure 13:
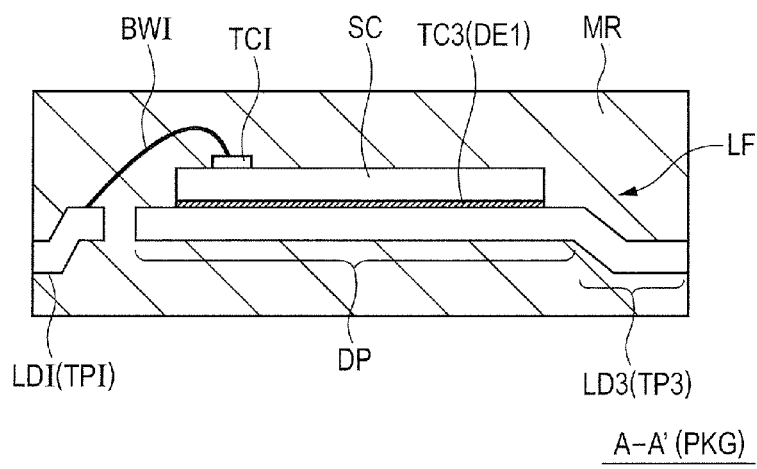
FIG. 13 is a cross section taken along line A-A' of FIG. 12.

FIG. 12 is a plan view illustrating an example of the configuration of the semiconductor package PKG depicted in FIG. 11. FIG. 13 is a cross section taken along line A-A' of FIG. 12. The semiconductor package PKG has the semiconductor chip SC, a lead frame LF, and a sealing resin MR. The lead frame LF has a die pad DP and a plurality of leads (LD1, LD2, LD3, LDV, LDG, and LDI). The semiconductor chip SC is mounted on the die pad DP. The semiconductor chip SC is sealed by the sealing resin MR.

As illustrated in FIG. 12, the power supply terminal TCV is coupled to the lead LDV (power supply terminal TPV) via a bonding wire BWV. The grounding terminal TCG is coupled to the lead LDG (grounding terminal TPG) via a bonding wire BWG. The input terminal TCI is coupled to the lead LDI (input terminal TPI) via a bonding wire BWI. The first terminal TC1 is coupled to the lead LD1 (first terminal TP1) via a bonding wire BW1. The second terminal TC2 is coupled to the lead LD2 (second terminal TP2) via a bonding wire BW2.

As illustrated in FIG. 13, the semiconductor chip SC has the third terminal TC3 (electrode pad) on the face opposed to the die pad DP. In the example illustrated in the diagram, the semiconductor chip SC has the transistor TR1 (vertical transistor) illustrated in FIG. 4. Consequently, the third terminal TC3 becomes a back-surface electrode (drain electrode DE1) of the semiconductor chip Sc. The lead LD3 (third terminal TP3) is integral with the die pad DP. The die pad DP is coupled to the third terminal TC3 (drain electrode DE1) of the semiconductor chip SC. Consequently, the third terminal TC3 is coupled to the lead LD3 via the die pad DP.

As described above, according to the embodiment, the semiconductor package PKG can be used as a high-side switch as illustrated in FIGS. 5 to 7. As illustrated in FIGS. 8 to 10, the semiconductor package PKG can be also used as a low-side switch. In both of the case of using the semiconductor package PKG as a high-side switch and the case of using the semiconductor package PKG as a low-side switch, the configuration of the semiconductor package PKG is the same. As described above, according to the embodiment, the semiconductor package PKG can be used as a high-side switch or a low-side switch depending on a use.

Second Embodiment

Figure 14:
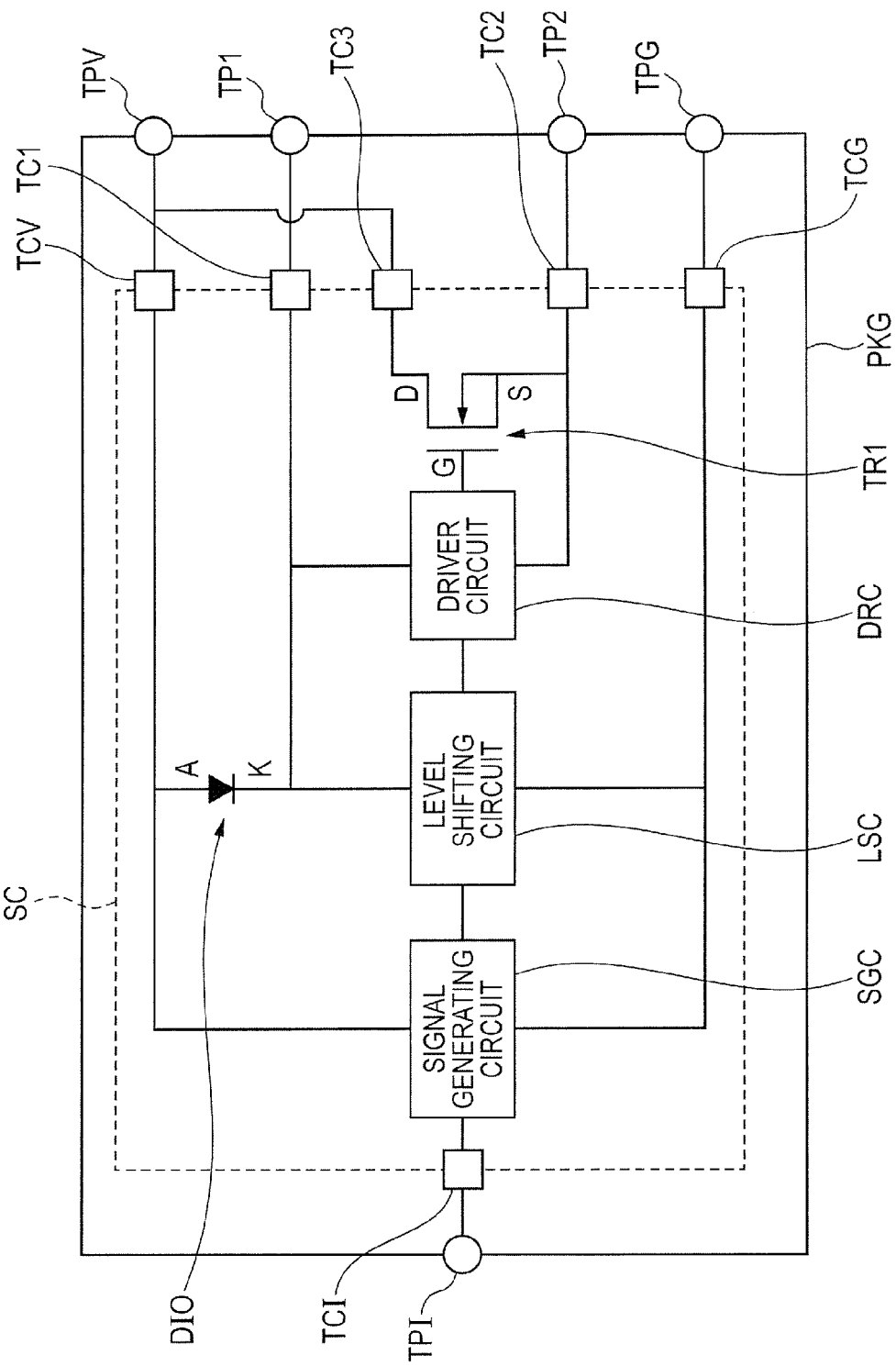
FIG. 14 is a diagram illustrating a first example of the circuit configuration of a semiconductor device according to a second embodiment.

FIG. 14 is a diagram illustrating a first example of the circuit configuration of a semiconductor device according to a second embodiment and corresponds to FIG. 11 of the first embodiment. The semiconductor device of the second embodiment has a configuration similar to that of the semiconductor device of the first embodiment except for the following points.

In the example illustrated in the diagram, the semiconductor chip SC has a configuration similar to that of the semiconductor chip SC according to the first embodiment (FIG. 11). The semiconductor chip SC has the power supply terminal TCV, the grounding terminal TCG, the input terminal TCI, the first terminal TC1, the second terminal TC2, and the third terminal TC3. On the other hand, the semiconductor chip PKG has the power supply terminal TPV, the grounding terminal TPG, the input terminal TPI, the first terminal TP1, and the second terminal TP2. The power supply terminal TCV and the third terminal TC3 are coupled to the power supply terminal TPV. On the other hand, the coupling terminal TCG, the input terminal TCI, the first terminal TC1, and the second terminal TC2 are coupled to the grounding terminal TPG, the input terminal TPI, the first terminal TP1, and the second terminal TP2, respectively. In this case, the semiconductor package PKG can be used as a high-side switch of the load LD as illustrated in FIGS. 5 to 7.

Figure 15:
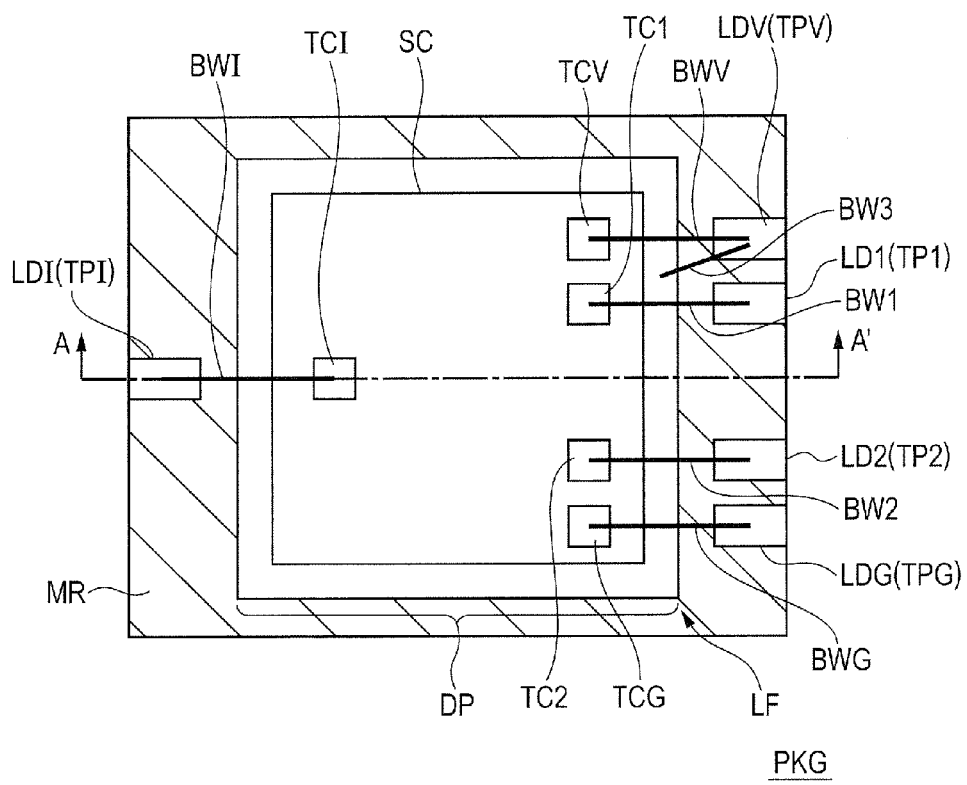
FIG. 15 is a plan view illustrating a first example of the configuration of a semiconductor package depicted in FIG. 14.
Figure 16:
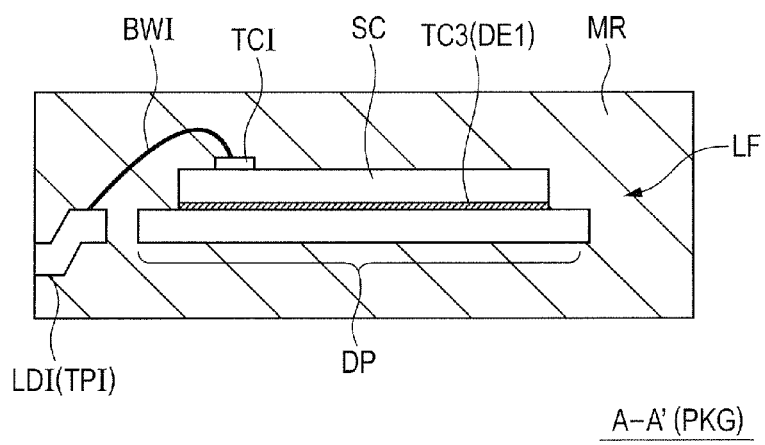
FIG. 16 is a cross section taken along line A-A' of FIG. 15.

FIG. 15 is a plan view illustrating a first example of the configuration of the semiconductor package PKG depicted in FIG. 14 and corresponds to FIG. 12 of the first embodiment. FIG. 16 is a cross section taken along line A-A' of FIG. 15 and corresponds to FIG. 13 of the first embodiment. The semiconductor package PKG illustrated in the diagram has a configuration similar to that of the semiconductor package PKG according to the first embodiment (FIGS. 12 and 13) except for the following points.

Each of the leads of the lead frame LF is isolated from the die pad DP. The lead LDV (power supply terminal TPV) is coupled to the power supply terminal TCV via the bonding wire BWV. Further, the lead LDV is coupled to the die pad DP via the bonding wire BW3. To the die pad DP, the third terminal TC3 is coupled. In such a manner, the lead LDV is coupled to the power supply terminal TCV and the third terminal TC3. Further, the lead LDG (grounding terminal TPG) is coupled to the grounding terminal TCG via the bonding wire BWG. The lead LDI (input terminal TPI) is coupled to the input terminal TCI via the bonding wire BWI. The lead LD1 (first terminal TP1) is coupled to the first terminal TC1 via the bonding wire BW1. The lead LD2 (second terminal TP2) is coupled to the second terminal TC2 via the bonding wire BW2.

Figure 17:
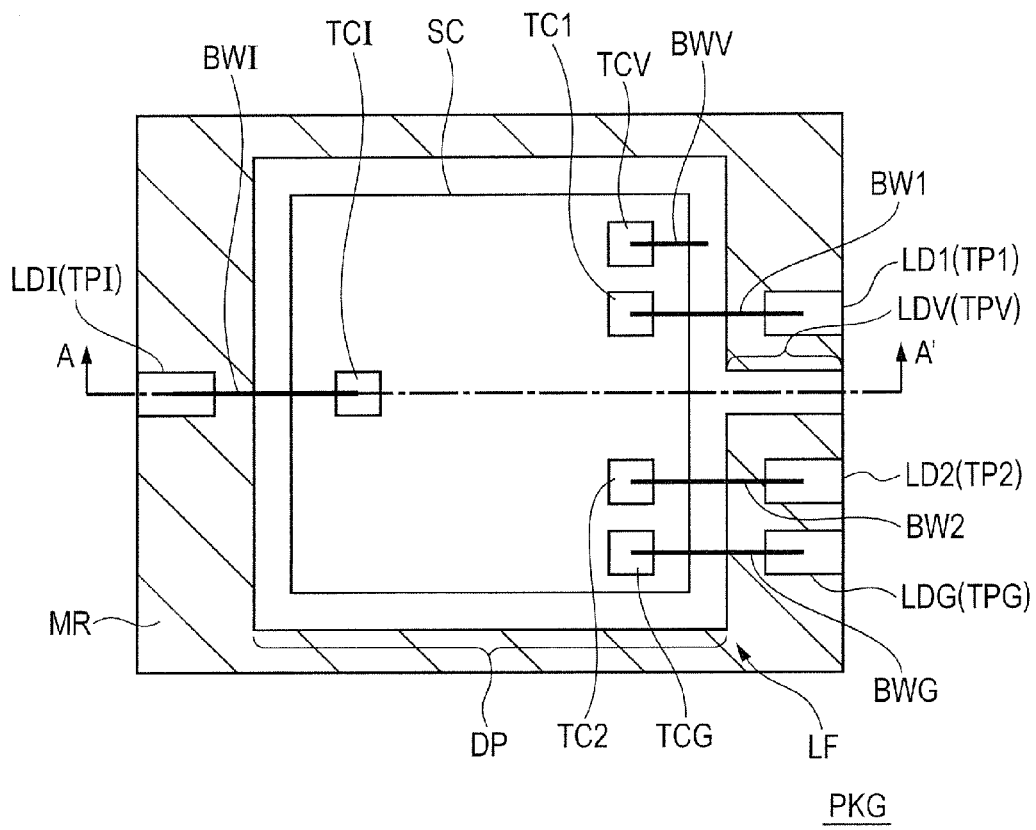
FIG. 17 is a plan view illustrating a second example of the configuration of the semiconductor package depicted in FIG. 14.
Figure 18:
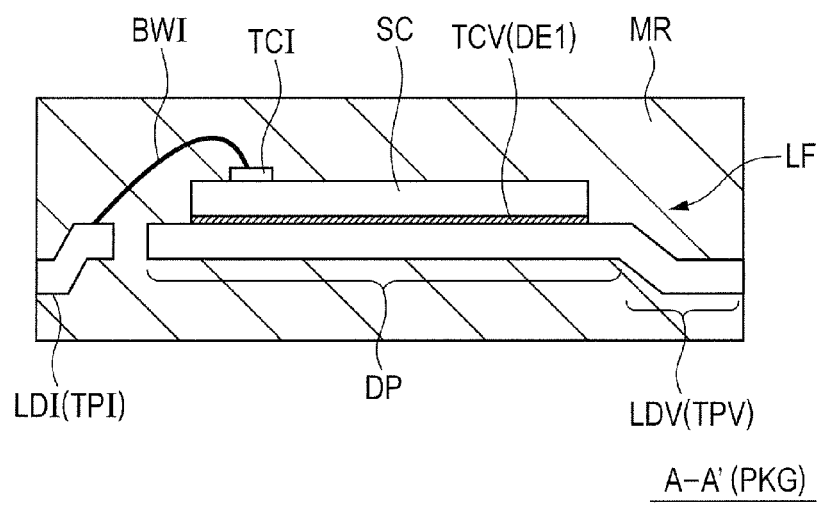
FIG. 18 is a cross section taken along line A-A' of FIG. 17.

FIG. 17 is a plan view illustrating a second example of the configuration of the semiconductor package PKG depicted in FIG. 14 and corresponds to FIG. 12 of the first embodiment. FIG. 18 is a cross section taken along line A-A' of FIG. 17 and corresponds to FIG. 13 of the first embodiment. The semiconductor package PKG illustrated in the diagram has a configuration similar to that of the semiconductor package PKG according to the first embodiment (FIGS. 12 and 13) except for the following points.

Each of the leads of the lead frame LF is isolated from the die pad DP except for the lead LDV (power supply terminal TPV). The lead LDV is integral with the die pad DP. Consequently, the lead LDV is electrically coupled to the die pad DP. The die pad DP is coupled to the power supply terminal TCV via the bonding wire BWV. To the die pad DP, the third terminal TC3 is coupled. In such a manner, the lead LDV is coupled to the power supply terminal TCV and the third terminal TC3. Further, the lead LDG (grounding terminal TPG) is coupled to the grounding terminal TCG via the bonding wire BWG. The lead LDI (input terminal TPI) is coupled to the input terminal TCI via the bonding wire BWI. The lead LD1 (first terminal TP1) is coupled to the first terminal TC1 via the bonding wire BW1. The lead LD2 (second terminal TP2) is coupled to the second terminal TC2 via the bonding wire BW2.

Figure 19:
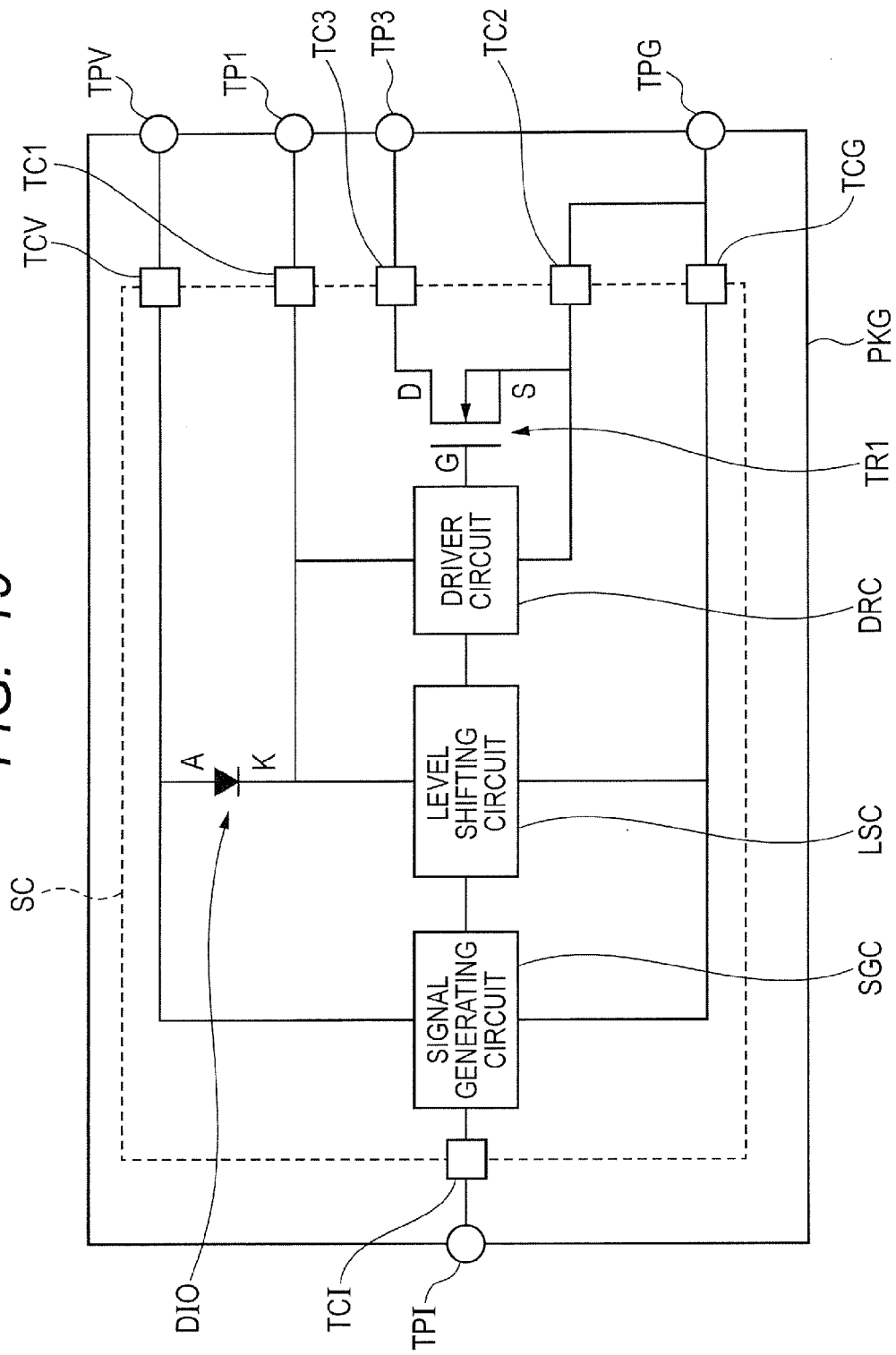
FIG. 19 is a diagram illustrating a second example of the circuit configuration of the semiconductor device according to the second embodiment.

FIG. 19 is a diagram illustrating a second example of the circuit configuration of the semiconductor device according to the embodiment and corresponds to FIG. 11 of the first embodiment. The semiconductor device according to the embodiment has a configuration similar to that of the semiconductor device according to the first embodiment except for the following points.

In the example illustrated in the diagram, the semiconductor chip SC has a configuration similar to that of the semiconductor chip SC according to the first embodiment (FIG. 11). The semiconductor chip SC has the power supply terminal TCV, the grounding terminal TCG, the input terminal TCI, the first terminal TC1, the second terminal TC2, and the third terminal TC3. On the other hand, the semiconductor package PKG has the power supply terminal TPV, the grounding terminal TPG, the input terminal TPI, the first terminal TP1, and the third terminal TP3. The grounding terminal TCG and the second terminal TC2 are coupled to the grounding terminal TPG. On the other hand, the power supply terminal TCV, the input terminal TCI, the first terminal TC1, and the third terminal TC3 are coupled to the power supply terminal TPV, the input terminal TPI, the first terminal TP1, and the third terminal TP3, respectively. In this case, the semiconductor package PKG can be used as a low-side switch of the load LD as illustrated in FIGS. 8 to 10.

Figure 20:
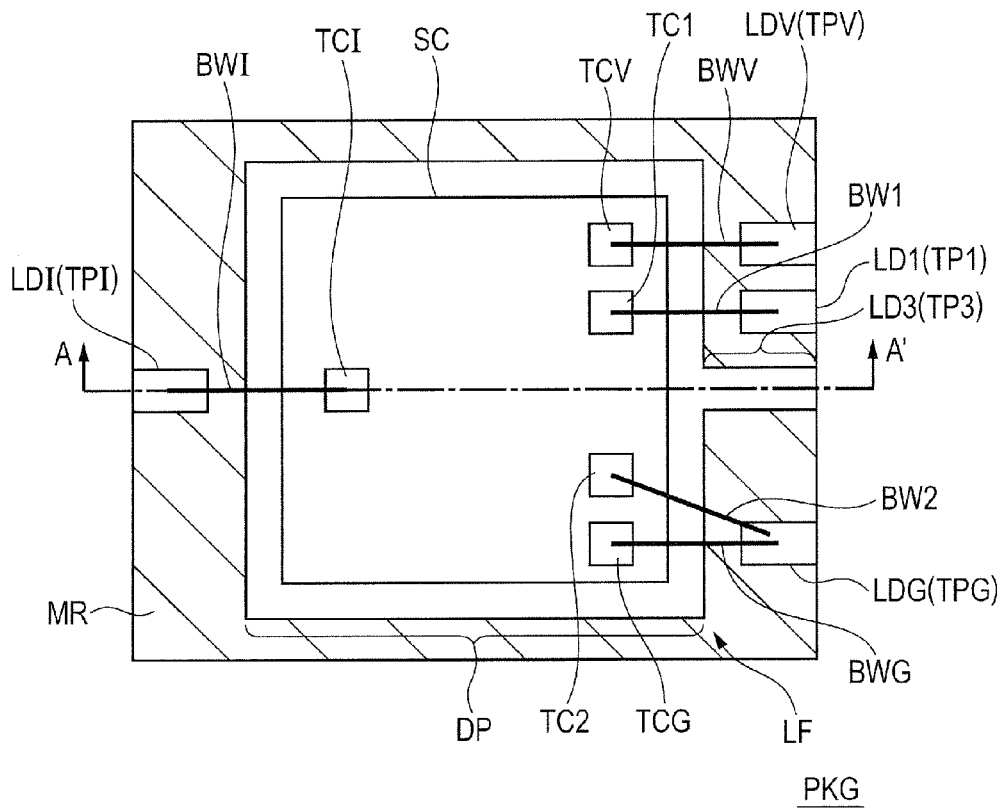
FIG. 20 is a plan view illustrating an example of the configuration of a semiconductor package depicted in FIG. 19.
Figure 21:
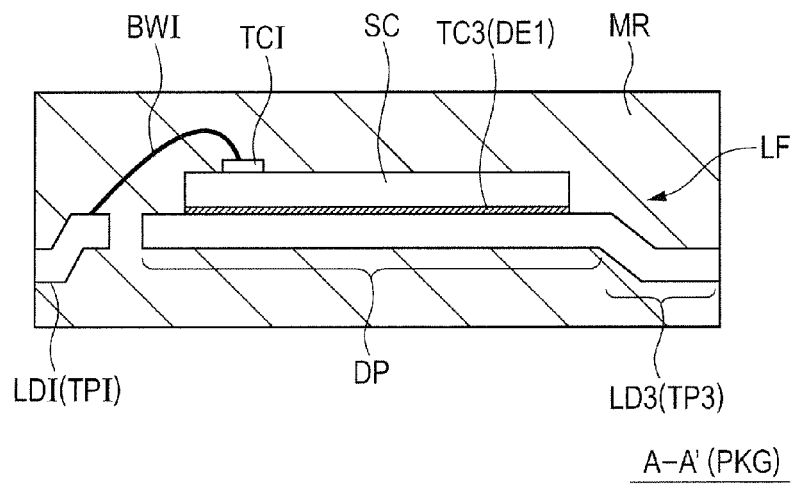
FIG. 21 is a cross section taken along line A-A' of FIG. 20.

FIG. 20 is a plan view illustrating an example of the configuration of the semiconductor package PKG depicted in FIG. 19 and corresponds to FIG. 12 of the first embodiment. FIG. 21 is a cross section taken along line A-A' of FIG. 20 and corresponds to FIG. 13 of the first embodiment. The semiconductor package PKG illustrated in the diagram has a configuration similar to that of the semiconductor package PKG according to the first embodiment (FIGS. 12 and 13) except for the following points.

Each of the leads of the lead frame LF is isolated from the die pad DP except for the lead LD3 (third terminal TP3). The lead LD3 is integral with the die pad DP. Consequently, the lead LD3 is electrically coupled to the die pad DP. To the die pad DP, the third terminal TC3 is coupled. In such a manner, the lead LD3 is coupled to the third terminal TC3. Further, the lead LDG (grounding terminal TPG) is coupled to the grounding terminal TCG via the bonding wire BWG. The lead LDG is coupled to the second terminal TC2 via the bonding wire BW2. The lead LDV (power supply terminal TPV) is coupled to the power supply terminal TCV via the bonding wire BWV. The lead LDI (input terminal TPI) is coupled to the input terminal TCI via the bonding wire BWI. The lead LD1 (first terminal TP1) is coupled to the first terminal TC1 via the bonding wire BW1.

According to the embodiment, as illustrated in FIG. 14, the semiconductor package PKG can be used as a high-side switch. As illustrated in FIG. 19, the semiconductor package PKG can be also used as a low-side switch. In both of the case of using the semiconductor package PKG as a high-side switch and the case of using the semiconductor package PKG as a low-side switch, the configuration of the semiconductor chip SC is the same. Only by changing the coupling relations between the terminals of the semiconductor chip SC and the terminals of the semiconductor package PKG, the semiconductor package PKG can be manufactured as any of the high-side switch and the low-side switch.

Further, according to the embodiment, in the case of using the semiconductor package PKG as a high-side switch (FIG. 14), the semiconductor package PKG does not have to include the third terminal TP3 (FIG. 11). In the case of using the semiconductor package PKG as a low-side switch (FIG. 19), the semiconductor package PKG does not have to include the second terminal TP2 (FIG. 11). Consequently, according to the embodiment, as compared with the first embodiment, the number of terminals (leads) of the semiconductor package PKG can be decreased.

Third Embodiment

Figure 22:
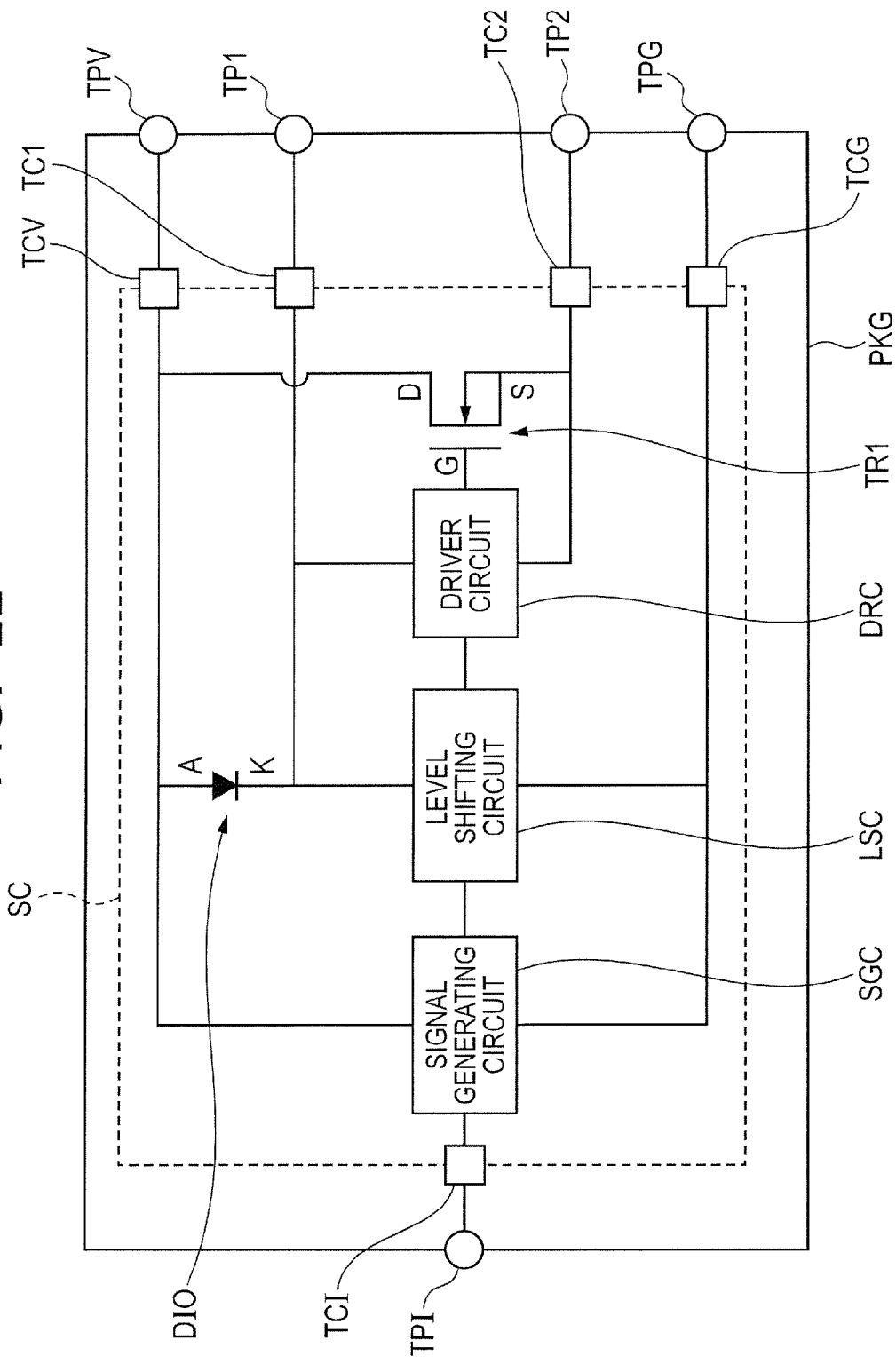
FIG. 22 is a diagram illustrating a first example of the circuit configuration of a semiconductor device according to a third embodiment.

FIG. 22 is a diagram illustrating a first example of the circuit configuration of a semiconductor device according to a third embodiment and corresponds to FIG. 11 of the first embodiment. The semiconductor device of the third embodiment has a configuration similar to that of the semiconductor device of the first embodiment except for the following points.

In the example illustrated in the diagram, the semiconductor chip SC has the power supply terminal TCV, the grounding terminal TCG, the input terminal TCI, the first terminal TC1, and the second terminal TC2. On the other hand, the semiconductor chip PKG has the power supply terminal TPV, the grounding terminal TPG, the input terminal TPI, the first terminal TP1, and the second terminal TP2. The power supply terminal TCV, the grounding terminal TCG, the input terminal TCI, the first terminal TC1, and the second terminal TC2 are coupled to the power supply terminal TPV, the grounding terminal TPG, the input terminal TPI, the first terminal TP1, and the second terminal TP2, respectively. In this case, the semiconductor package PKG can be used as a high-side switch of the load LD as illustrated in FIGS. 5 to 7.

Specifically, the power supply terminal TCV is coupled to the drain (D) of the transistor TR1. Further, the power supply terminal TCV is coupled to the diode DIO and the signal generating circuit SGC. In this case, the power supply terminal TCV is coupled to, for example, the above-described elements (the transistor TR1, the diode DIO, and the signal generating circuit SGC) via a wire included in the semiconductor chip SC (for example, a wire buried in a multilayer wiring layer positioned over the substrate).

Figure 23:
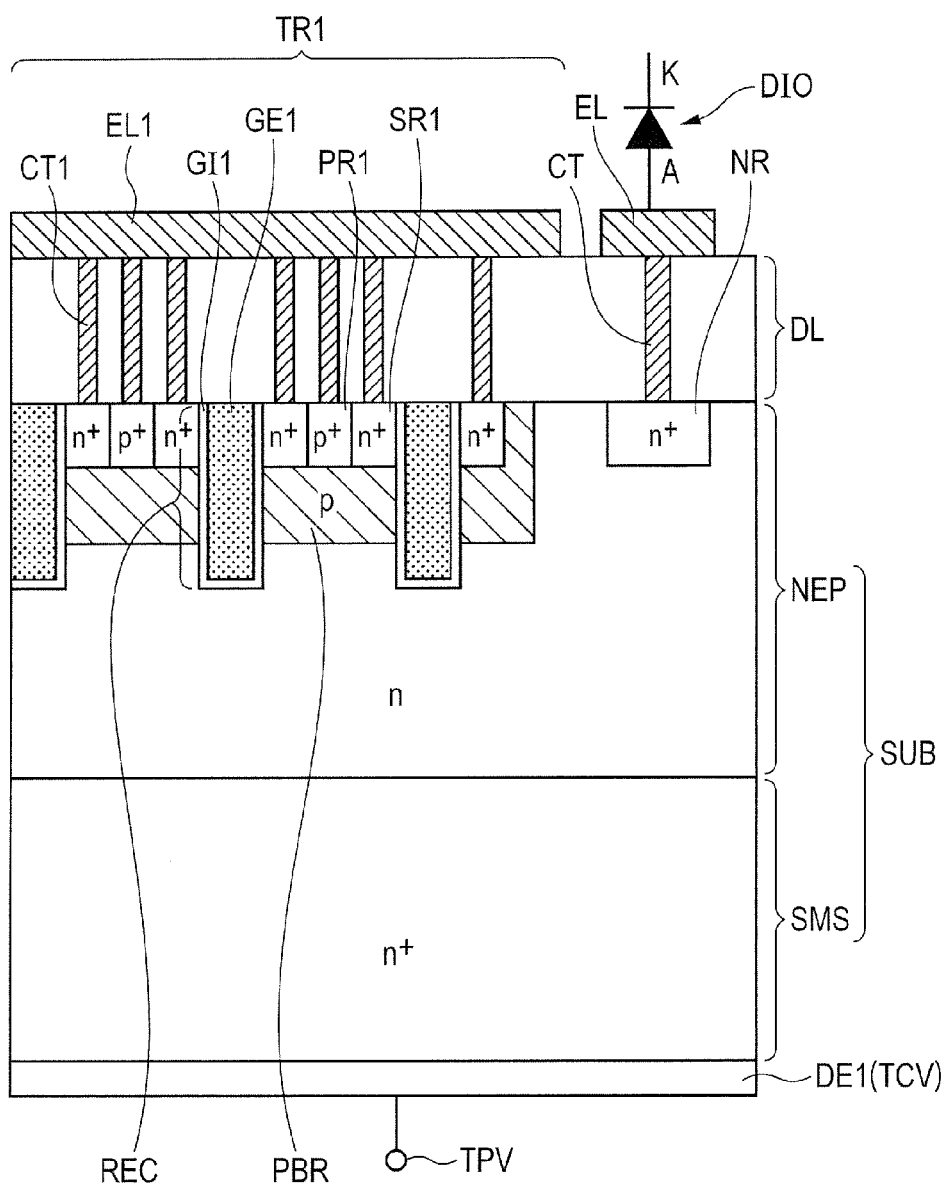
FIG. 23 is a cross section illustrating an example of the configuration of the semiconductor device depicted in FIG. 22.

FIG. 23 is a cross section illustrating an example of the configuration of the semiconductor device depicted in FIG. 22. In the example illustrated in the diagram, the semiconductor device has the transistor TR1. The transistor TR1 in the example illustrated in the diagram has a configuration similar to that of the transistor TR1 in the example illustrated in FIG. 4.

In the example illustrated in the diagram, the first-conduction-type semiconductor layer NEP has a first-conduction-type region NR. The impurity concentration of the first-conduction-type region NR is higher than that of the first-conduction-type semiconductor layer NEP. The first-conduction-type region NR is coupled to the electrode EL via the contact CT buried in the insulating layer DL. The electrode EL is coupled to the diode DIO. In this case, the diode DIO is coupled to the drain electrode DE1 via the substrate SUB, the contact CT, and the electrode EL. In other words, the element (for example, the level shifting circuit LSC (FIG. 22)) coupled to the cathode (K) of the diode DIO is coupled to the power supply terminal TPV via the drain electrode DE1 and the substrate SUB.

Figure 24:
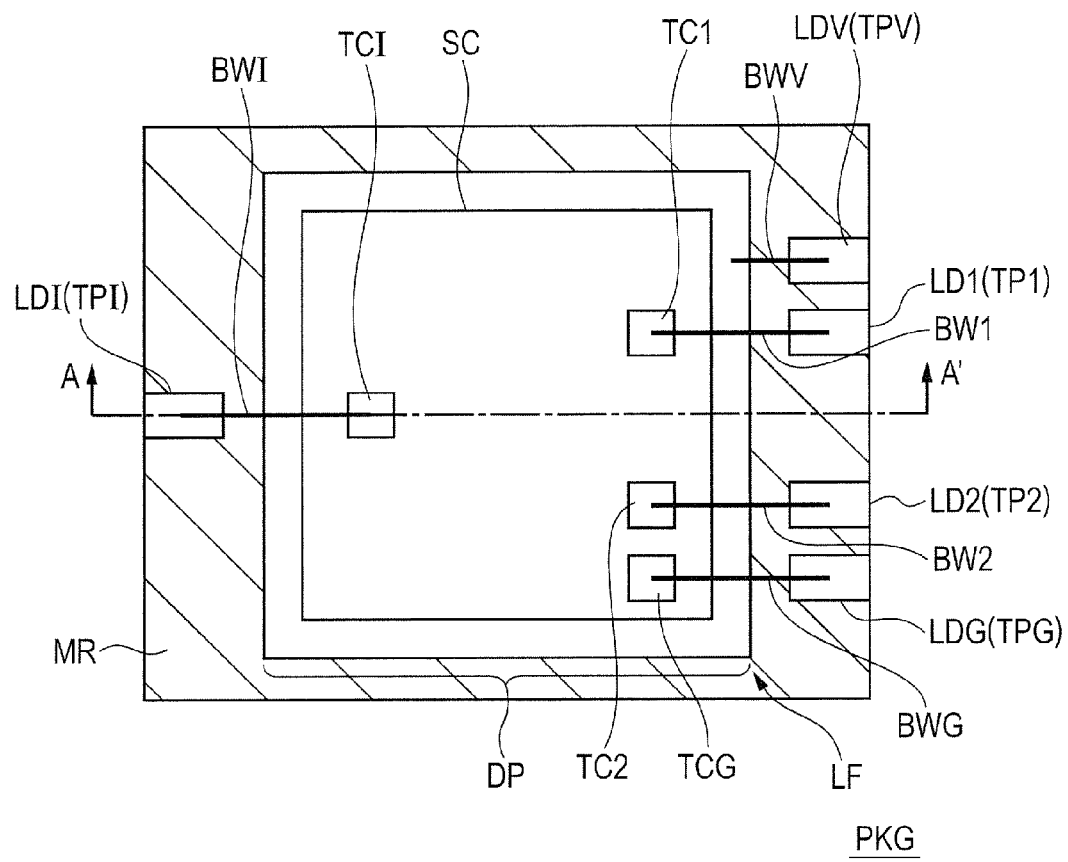
FIG. 24 is a plan view illustrating a first example of the configuration of a semiconductor package depicted in FIG. 22.
Figure 25:
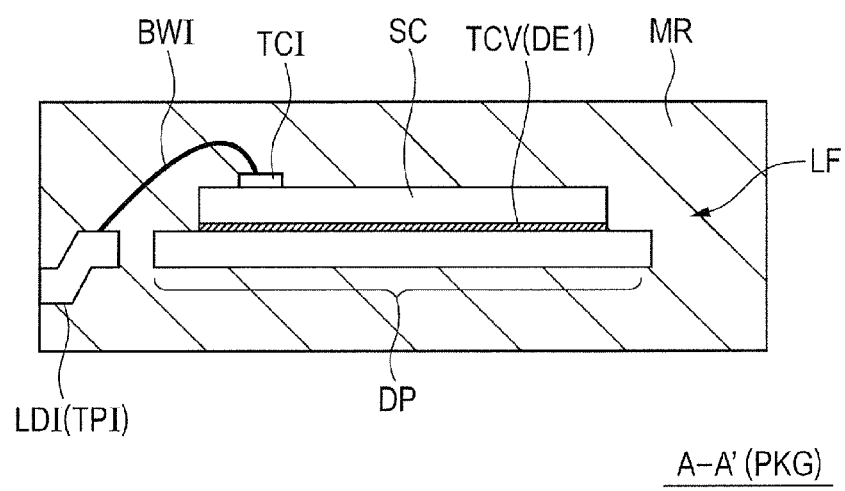
FIG. 25 is a cross section taken along line A-A' of FIG. 24.

FIG. 24 is a plan view illustrating a first example of the configuration of a semiconductor package PKG depicted in FIG. 22 and corresponds to FIG. 12 of the first embodiment. FIG. 25 is a cross section taken along line A-A' of FIG. 24 and corresponds to FIG. 13 of the first embodiment. In the example illustrated in the diagram, the semiconductor chip SC has a structure according to the example illustrated in FIG. 23. The semiconductor package PKG illustrated in the diagram has a configuration similar to that of the semiconductor package PKG according to the first embodiment (FIGS. 12 and 13) except for the following points.

Each of the leads of the lead frame LF is isolated from the die pad DP. The lead LDV (power supply terminal TPV) is coupled to the die pad DP via the bonding wire BWV. To the die pad DP, the power supply terminal TCV is coupled. In such a manner, the lead LDV is coupled to the power supply terminal TCV. Further, the lead LDG (grounding terminal TPG) is coupled to the grounding terminal TCG via the bonding wire BWG. The lead LDI (input terminal TPI) is coupled to the input terminal TCI via the bonding wire BWI. The lead LD1 (first terminal TP1) is coupled to the first terminal TC1 via the bonding wire BW1. The lead LD2 (second terminal TP2) is coupled to the second terminal TC2 via the bonding wire BW2.

Figure 26:
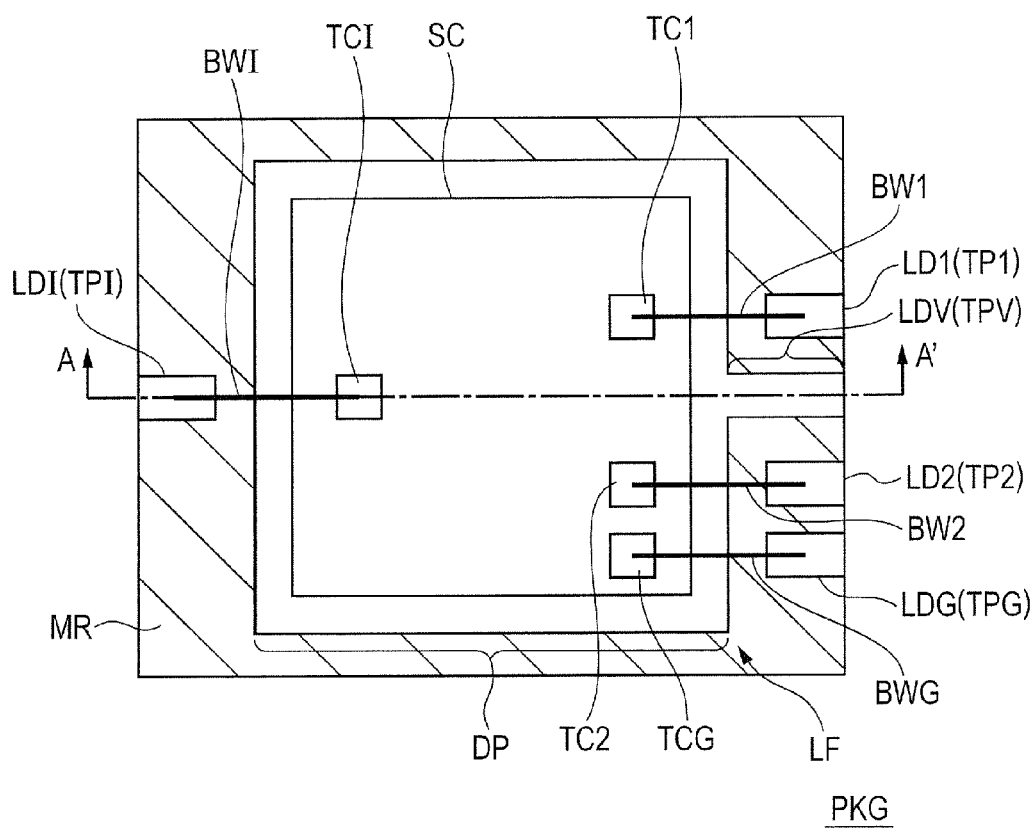
FIG. 26 is a plan view illustrating a second example of the configuration of the semiconductor package depicted in FIG. 22.
Figure 27:
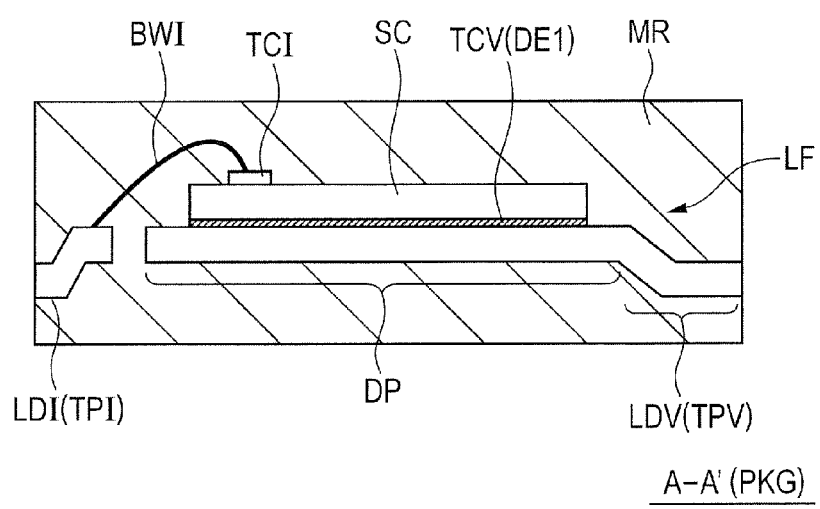
FIG. 27 is a cross section taken along line A-A' of FIG. 26.

FIG. 26 is a plan view illustrating a second example of the configuration of the semiconductor package PKG depicted in FIG. 14 and corresponds to FIG. 12 of the first embodiment. FIG. 27 is a cross section taken along line A-A' of FIG. 26 and corresponds to FIG. 13 of the first embodiment. In the example illustrated in the diagram, the semiconductor chip SC has a structure of the example illustrated in FIG. 23. The semiconductor package PKG illustrated in the diagram has a configuration similar to that of the semiconductor package PKG according to the first embodiment (FIGS. 12 and 13) except for the following points.

Each of the leads of the lead frame LF is isolated from the die pad DP except for the lead LDV (power supply terminal TPV). The lead LDV is integral with the die pad DP. Consequently, the lead LDV is electrically coupled to the die pad DP. To the die pad DP, the power supply terminal TCV is coupled. In such a manner, the lead LDV is coupled to the power supply terminal TCV. Further, the lead LDG (grounding terminal TPG) is coupled to the grounding terminal TCG via the bonding wire BWG. The lead LDI (input terminal TPI) is coupled to the input terminal TCI via the bonding wire BWI. The lead LD1 (first terminal TP1) is coupled to the first terminal TC1 via the bonding wire BW1. The lead LD2 (second terminal TP2) is coupled to the second terminal TC2 via the bonding wire BW2.

Figure 28:
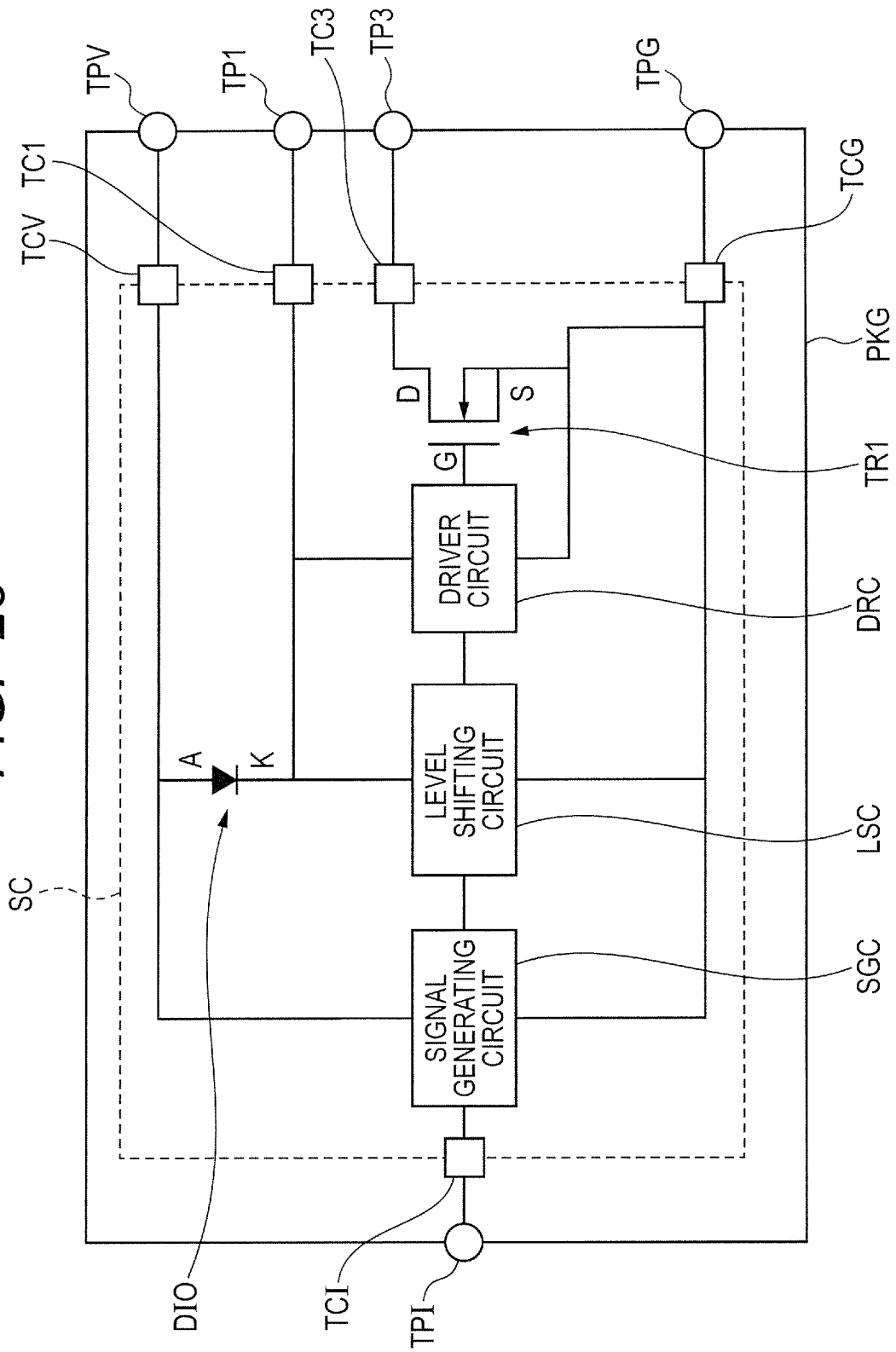
FIG. 28 is a diagram illustrating a second example of the circuit configuration of the semiconductor device according to the third embodiment.

FIG. 28 is a diagram illustrating a second example of the circuit configuration of the semiconductor device according to the embodiment and corresponds to FIG. 11 of the first embodiment. The semiconductor device according to the embodiment has a configuration similar to that of the semiconductor device according to the first embodiment except for the following points.

In the example illustrated in the diagram, the semiconductor chip SC has the power supply terminal TCV, the grounding terminal TCG, the input terminal TCI, the first terminal TC1, and the third terminal TC3. On the other hand, the semiconductor package PKG has the power supply terminal TPV, the grounding terminal TPG, the input terminal TPI, the first terminal TP1, and the third terminal TP3. The power supply terminal TCV, the grounding terminal TCG, the input terminal TCI, the first terminal TC1, and the third terminal TC3 are coupled to the power supply terminal TPV, the grounding terminal TPG, the input terminal TPI, the first terminal TP1, and the third terminal TP3, respectively. In this case, the semiconductor package PKG can be used as a low-side switch of the load LD as illustrated in FIGS. 8 to 10.

Specifically, the grounding terminal TCG is coupled to the source (S) of the transistor TR1. Further, the grounding terminal TCG is coupled to the signal generating circuit SGC, the level shifting circuit LSC, and the driver circuit DRC. In this case, the grounding terminal TCG is coupled to, for example, the above-described elements (the transistor TR1, the signal generating circuit SGC, the level shifting circuit LSC, and the driver circuit DRC) via a wire included in the semiconductor chip SC (for example, a wire buried in a multilayer wiring layer positioned over the substrate).

Figure 29:
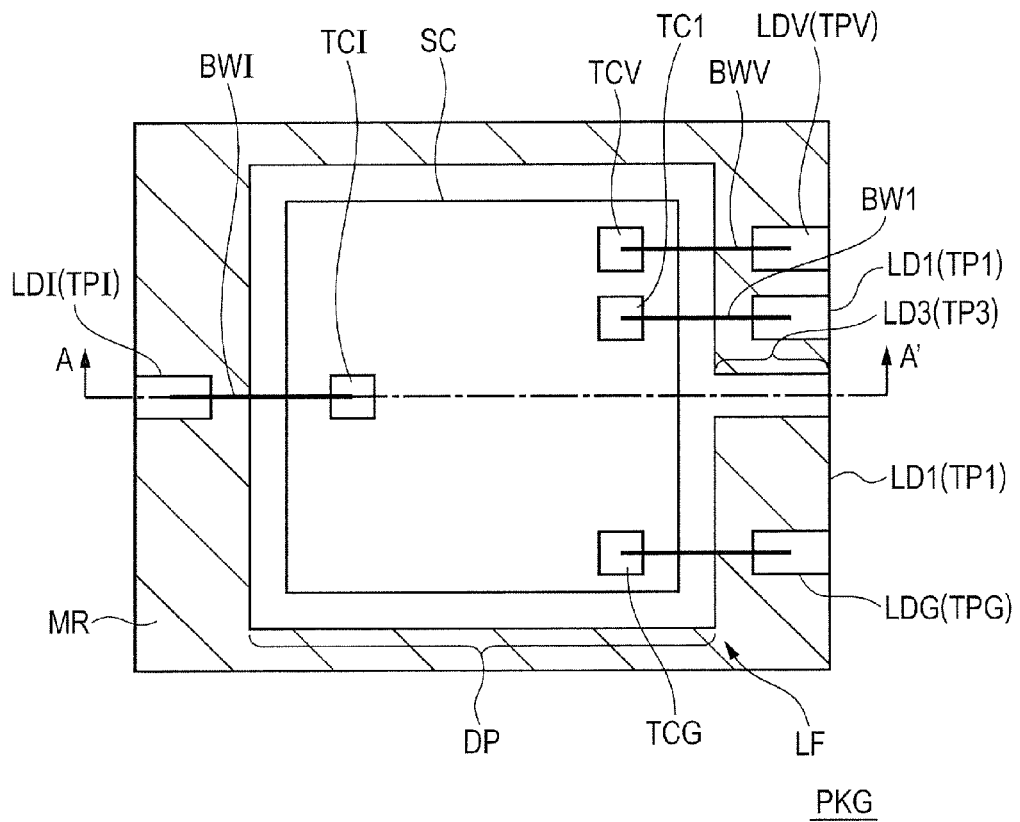
FIG. 29 is a plan view illustrating an example of the configuration of a semiconductor package depicted in FIG. 28.
Figure 30:
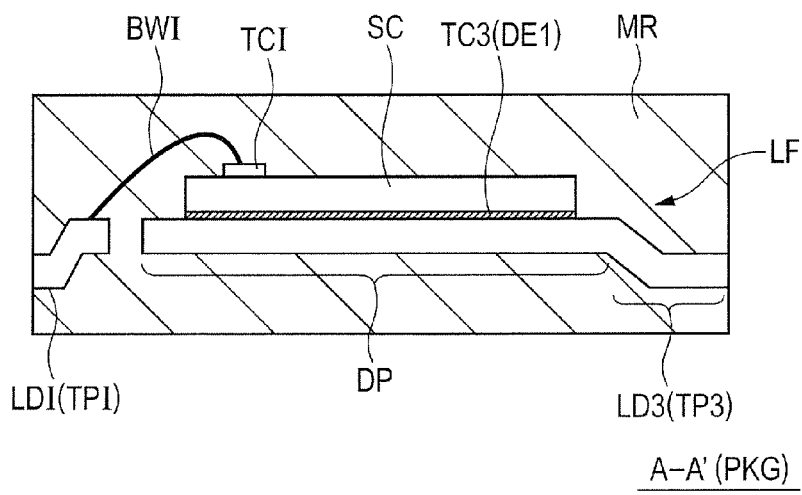
FIG. 30 is a cross section taken along line A-A' of FIG. 29.

FIG. 29 is a plan view illustrating an example of the configuration of the semiconductor package PKG depicted in FIG. 28 and corresponds to FIG. 12 of the first embodiment. FIG. 30 is a cross section taken along line A-A' of FIG. 29 and corresponds to FIG. 13 of the first embodiment. The semiconductor package PKG illustrated in the diagram has a configuration similar to that of the semiconductor package PKG according to the first embodiment (FIGS. 12 and 13) except for the following points.

Each of the leads of the lead frame LF is isolated from the die pad DP except for the lead LD3 (third terminal TP3). The lead LD3 is integral with the die pad DP. Consequently, the lead LD3 is electrically coupled to the die pad DP. To the die pad DP, the power supply terminal TCV is coupled. In such a manner, the lead LD3 is coupled to the power supply terminal TCV. Further, the lead LDG (grounding terminal TPG) is coupled to the grounding terminal TCG via the bonding wire BWG. The lead LDI (input terminal TPI) is coupled to the input terminal TCI via the bonding wire BWI. The lead LD1 (first terminal TP1) is coupled to the first terminal TC1 via the bonding wire BW1. The lead LD3 (third terminal TP3) is coupled to the third terminal TC3 via the bonding wire BW3.

As described above, according to the embodiment, as illustrated in FIG. 22, the semiconductor package PKG can be used as a high-side switch. As illustrated in FIG. 28, the semiconductor package PKG can be also used as a low-side switch. In this case, only by changing the coupling relations between the terminals of the semiconductor chip SC and the inner elements (for example, the transistor TR1) of the semiconductor chip SC, the semiconductor package PKG can be manufactured as any of the high-side switch and the low-side switch.

Further, according to the embodiment, in the case of using the semiconductor package PKG as a high-side switch (FIG. 22), the semiconductor package PKG does not have to include the third terminal TP3 (FIG. 11). In the case of using the semiconductor package PKG as a low-side switch (FIG. 28), the semiconductor package PKG does not have to include the second terminal TP2 (FIG. 11). Consequently, according to the embodiment, as compared with the first embodiment, the number of terminals (leads) of the semiconductor package PKG can be decreased.

First Modification

Figure 31:
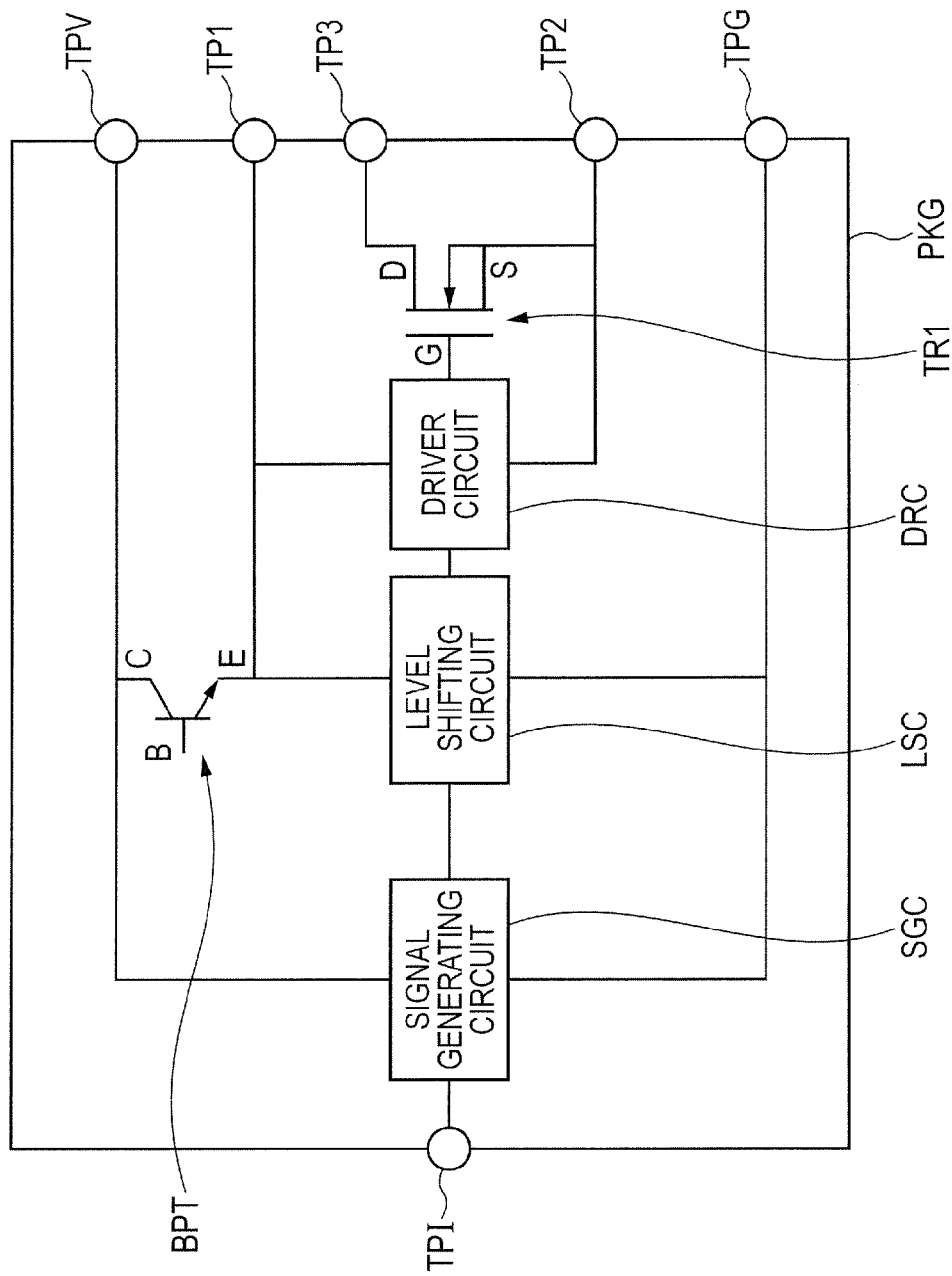
FIG. 31 is a diagram illustrating the circuit configuration of a semiconductor device according to a first modification.

FIG. 31 is a diagram illustrating the circuit configuration of a semiconductor device according to a first modification and corresponds to FIG. 1 of the first embodiment. The semiconductor device according to the modification has a configuration similar to that of the semiconductor device according to the first embodiment except for the point that a bipolar transistor BPT (second transistor) is provided in place of the diode DIO (FIG. 1). In the example illustrated in the diagram, the bipolar transistor BPT is an npn bipolar transistor. The collector (C) in the bipolar transistor BPT is coupled to the power supply terminal TPV, and the emitter (E) is coupled to the first terminal TP1.

Figure 32:
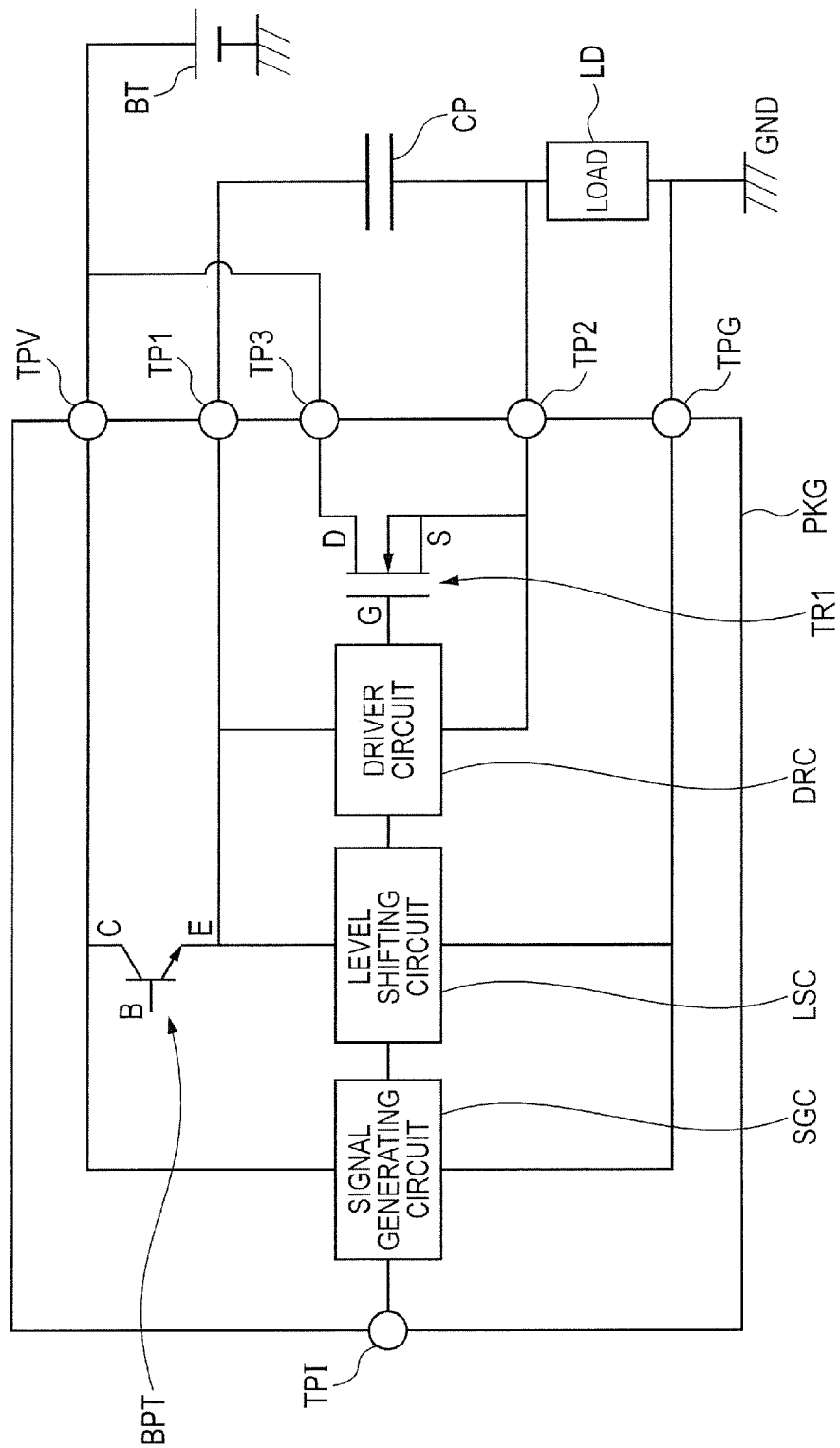
FIG. 32 is a diagram illustrating a first example of the circuit configuration of an electronic device according to the first modification.

FIG. 32 is a diagram illustrating a first example of the circuit configuration of an electronic device according to the first modification and corresponds to FIG. 5 of the first embodiment. An electronic device according to an example illustrated in the diagram has a configuration similar to that of the electronic device according to the example illustrated in FIG. 5 except for the point that the bipolar transistor BPT is provided in place of the diode DIO (FIG. 5).

Figure 33:
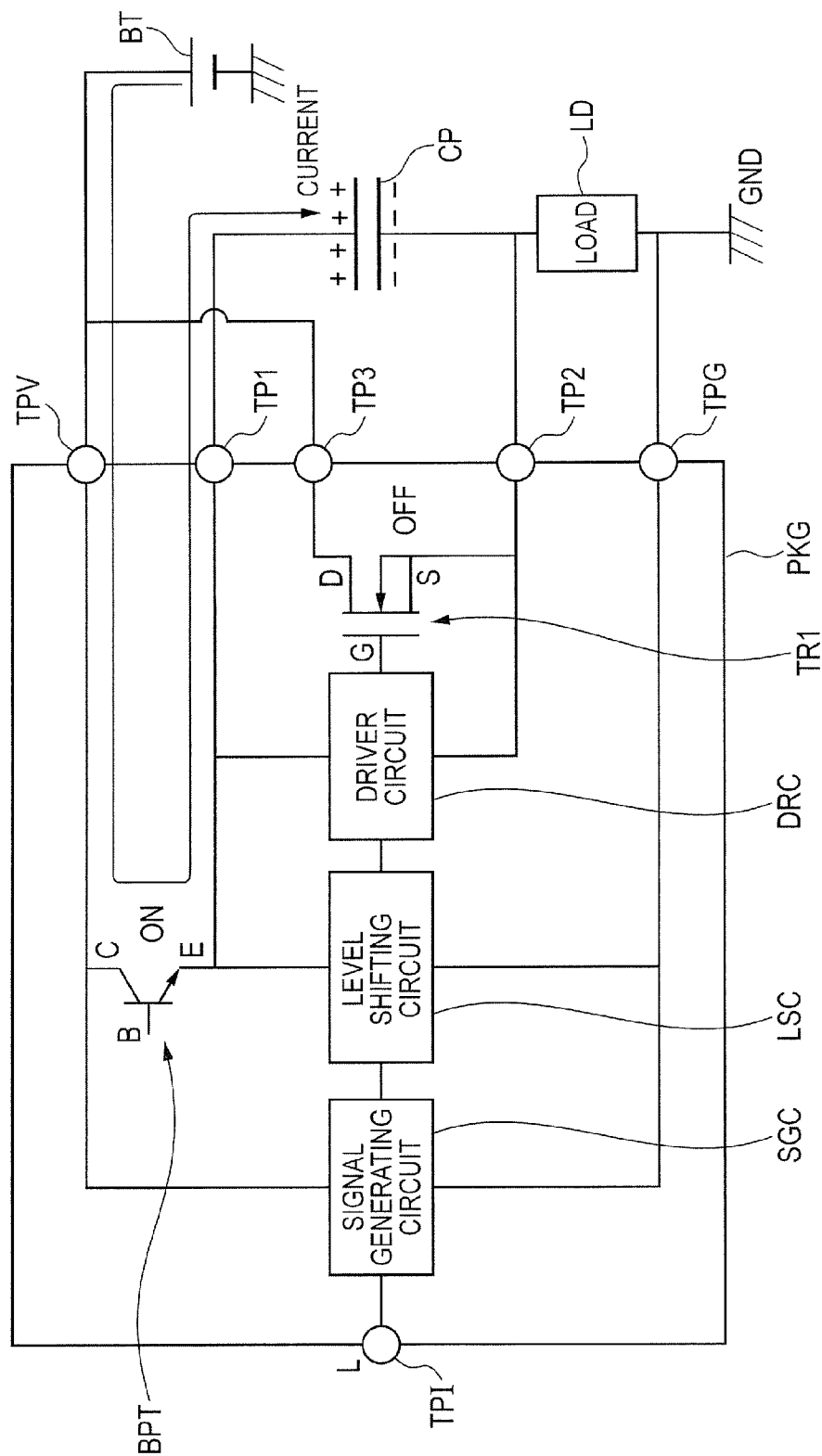
FIG. 33 is a diagram for explaining the operation of the electronic device illustrated in FIG. 32.
Figure 34:
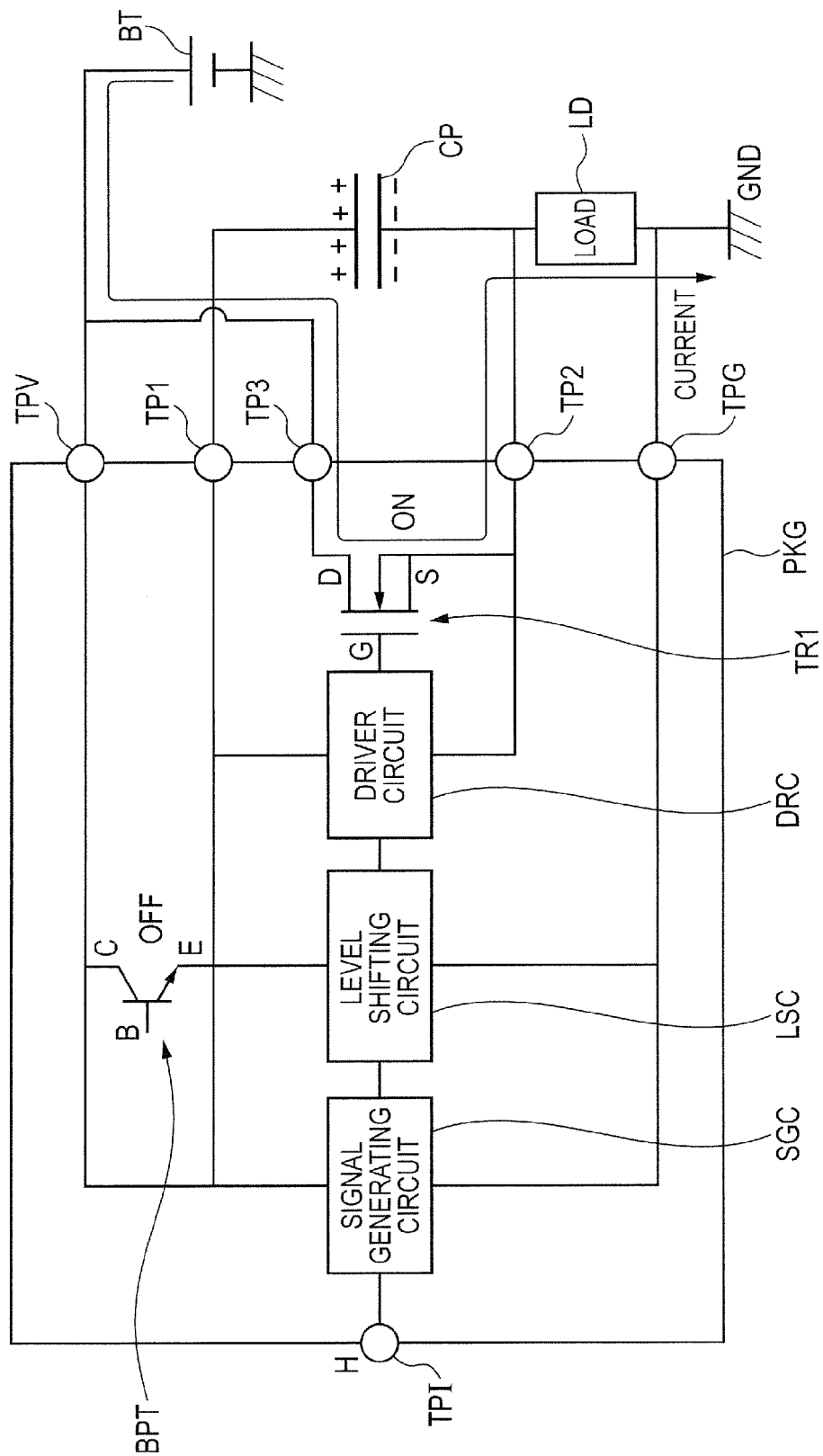
FIG. 34 is a diagram for explaining the operation of the electronic device illustrated in FIG. 32.

Each of FIGS. 33 and 34 is a diagram for explaining the operation of the electronic device illustrated in FIG. 32. FIG. 33 corresponds to FIG. 6 of the first embodiment. FIG. 34 corresponds to FIG. 7 of the first embodiment. In the example illustrated in FIG. 33, the transistor TR1 is in the off state, and the bipolar transistor BPT is in the on state. In the example illustrated in FIG. 34, the transistor TR1 is in the on state, and the bipolar transistor BPT is in the off state.

First, in the example illustrated in FIG. 33, the capacitor CP is charged by the power supply BT. Specifically, as described above, the transistor TR1 is in the off state and the bipolar transistor BPT is in the on state. Consequently, as illustrated in the diagram, current flows from the power supply BT to the capacitor CP via the power supply terminal TPV, the bipolar transistor BPT, and the first terminal TP1. In this case, the capacitor CP is charged with the above-described current. When charging progresses, in the capacitor CP, the potential on the first terminal TP1 side (the potential on the + side in the diagram) becomes higher than the potential on the second terminal TP2 side (the potential on the − side).

Next, in the example illustrated in FIG. 34, each of the power supply voltage to the level shifting circuit LSC and the power supply voltage to the driver circuit DRC is given by the capacitor CP. Specifically, as described above, the transistor TR1 is in the on state and the bipolar transistor BPT is in the off state. Consequently, as illustrated in the diagram, current flows from the power supply BT to the ground (GND) via the first terminal TP1, the transistor TR1, the second terminal TP2, and the load LD. In this case, in the capacitor CP, the potential on the second terminal TP2 side (the potential on the − side in the diagram) is increased by the power supply voltage of the power supply BT. Accordingly, in the capacitor CP, the potential on the first terminal TP1 side (the potential on the + side in the diagram) increases only by the amount of the voltage increased on the second terminal TP2 side. In this case, the potential of the first terminal TP1 can be made higher than the power supply voltage of the power supply BT. In other words, the capacitor CP can function as a boot strap capacitor.

Figure 35:
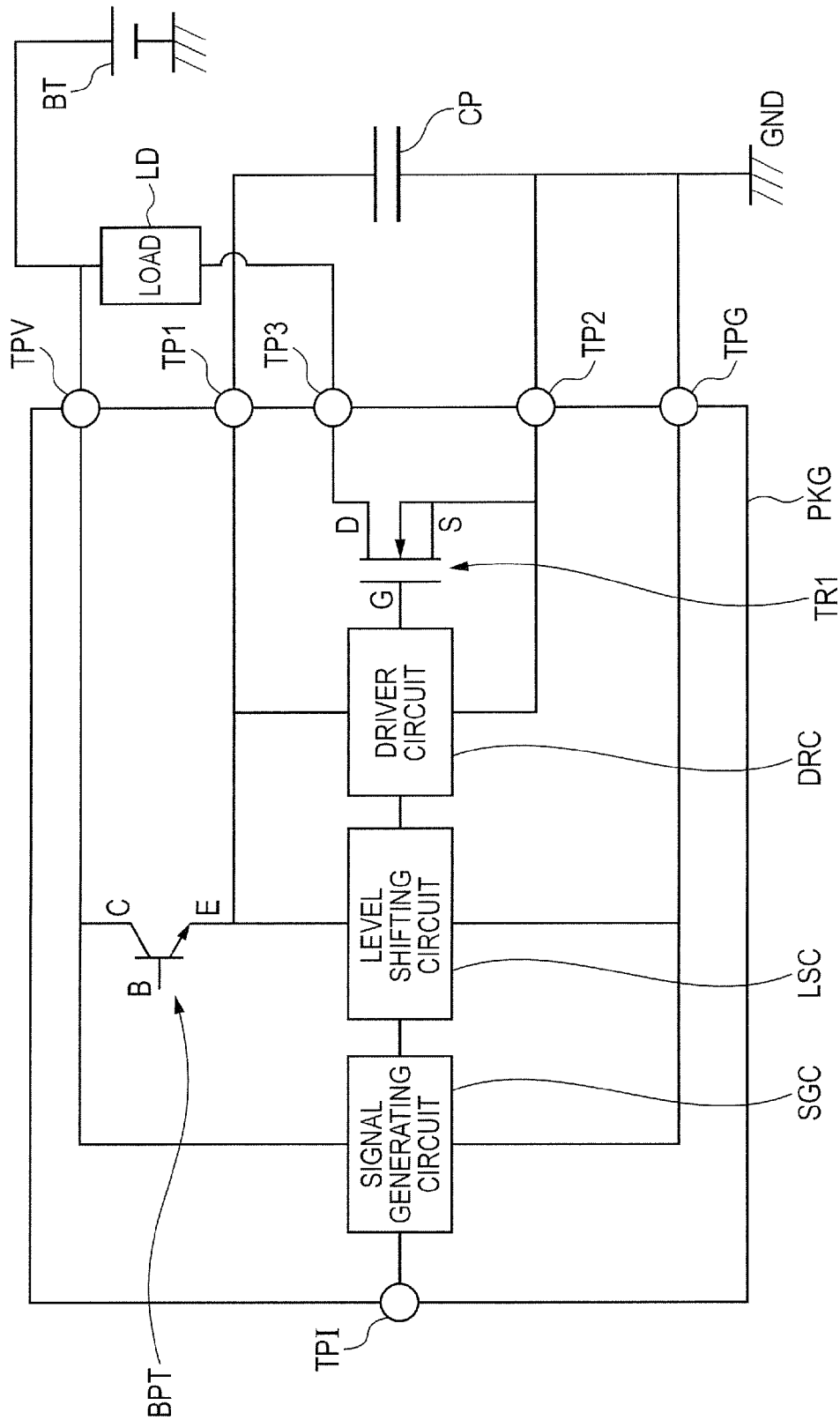
FIG. 35 is a diagram illustrating a second example of the circuit configuration of the electronic device according to the first modification.

FIG. 35 is a diagram illustrating a second example of the circuit configuration of the electronic device according to the modification and corresponds to FIG. 8 of the first embodiment. The electronic device in the example illustrated in the diagram has a configuration similar to that of the electronic device of the example illustrated in FIG. 8 except for the point that the bipolar transistor BPT is provided in place of the diode DIO (FIG. 8).

Figure 36:
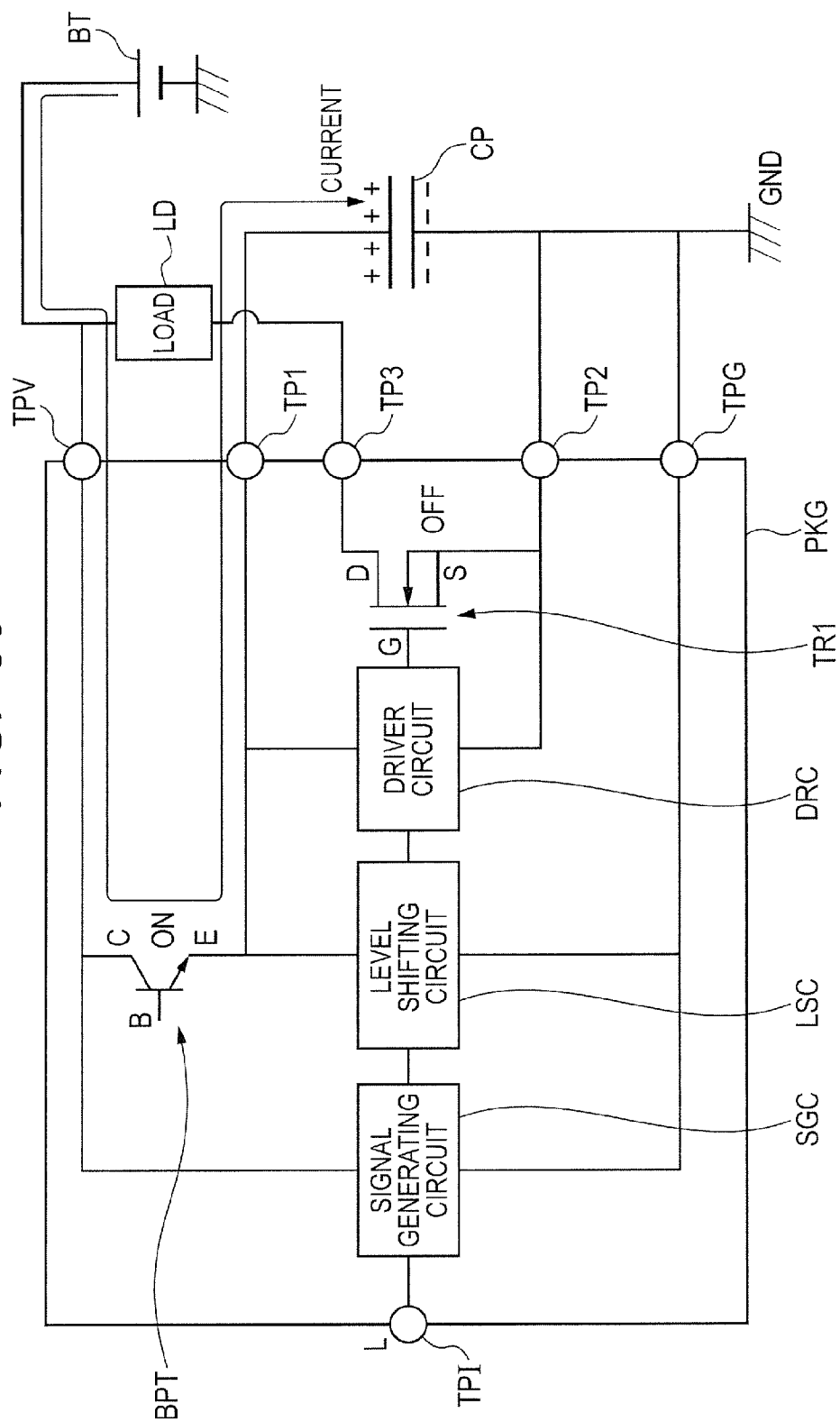
FIG. 36 is a diagram for explaining the operation of the electronic device illustrated in FIG. 35.
Figure 37:
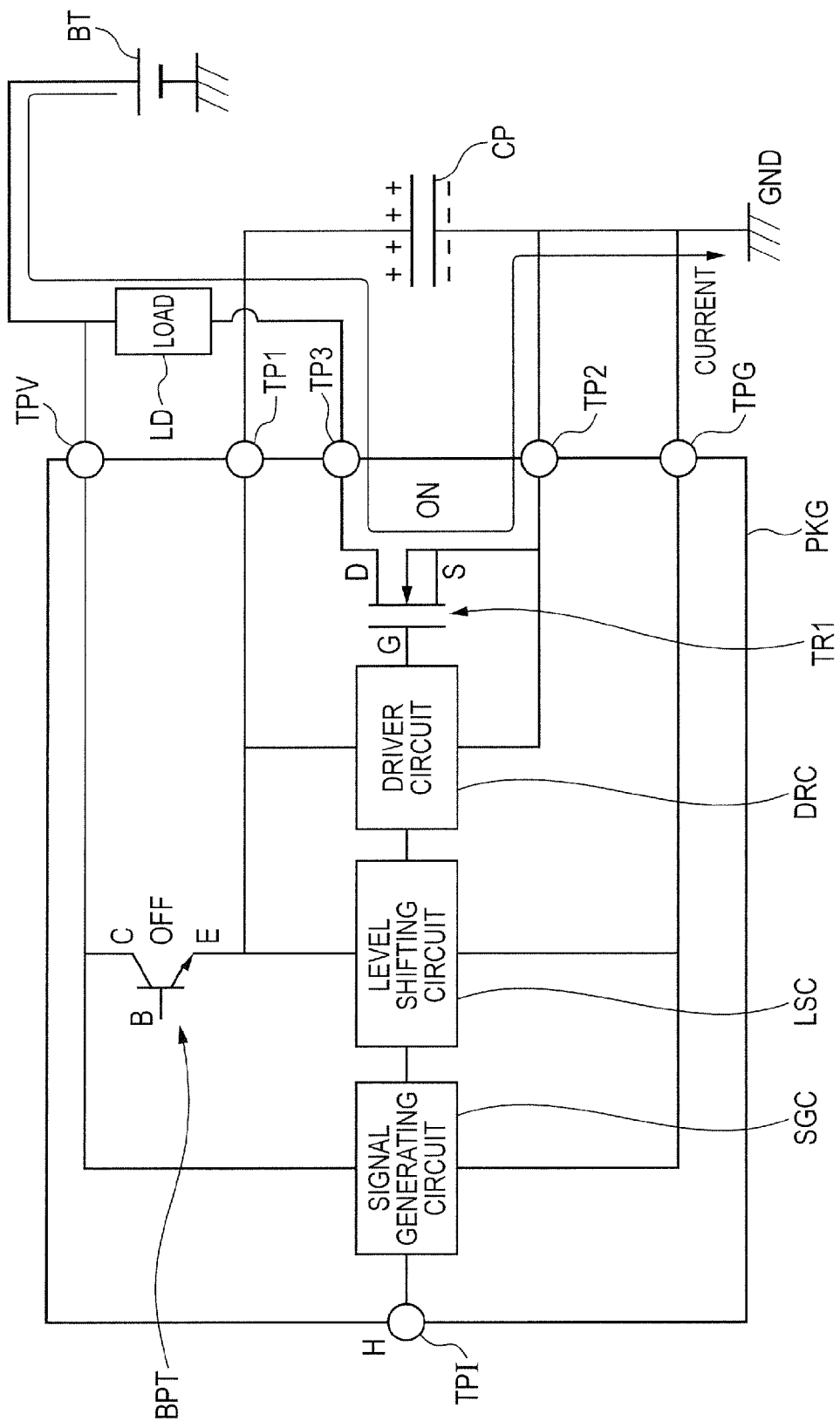
FIG. 37 is a diagram for explaining the operation of the electronic device illustrated in FIG. 35.

Each of FIGS. 36 and 37 is a diagram for explaining operation of the electronic device illustrated in FIG. 35. FIG. 36 corresponds to FIG. 9 of the first embodiment. FIG. 37 corresponds to FIG. 10 of the first embodiment. In an example illustrated in FIG. 36, the transistor TR1 is in the off state, and the bipolar transistor BPT is in the on state. In an example illustrated in FIG. 37, the transistor TR1 is in the on state, and the bipolar transistor BPT is in the off state.

First, in the example illustrated in FIG. 36, the capacitor CP is charged by the power supply BT. Specifically, as described above, the transistor TR1 is in the off state and the bipolar transistor BPT is in the on state. Consequently, as illustrated in the diagram, current flows from the power supply BT to the capacitor CP via the power supply terminal TPV, the bipolar transistor BPT, and the first terminal TP1. In this case, the capacitor CP is charged with the above-described current. When charging progresses, in the capacitor CP, the potential on the first terminal TP1 side (the potential on the + side in the diagram) becomes higher than the potential on the second terminal TP2 side (the potential on the − side in the diagram).

Next, in the example illustrated in FIG. 37, each of the power supply voltage to the level shifting circuit LSC and the power supply voltage to the driver circuit DRC is given by the capacitor CP. Specifically, as described above, the transistor TR1 is in the on state, and the bipolar transistor BPT is in the off state. Consequently, current flows from the power supply BT to the ground (GND) via the load LD, the third terminal TP3, the transistor TR1, and the second terminal TP2. Also in the example illustrated in the diagram, the second terminal TP2 remains grounded. Accordingly, in the capacitor CP, the potential on the first terminal TP1 side (the potential on the + side in the diagram) remains higher than the potential on the second terminal TP2 side (the potential on the − side in the diagram). Consequently, the potential of the first terminal TP1 can be made higher than any of the potential of the second terminal TP2 and the potential of the grounding terminal TPG.

Also in the modification, an effect similar to that of the first embodiment is obtained. The transistor coupling the power supply terminal TPV to the first terminal TP1 is not limited to a bipolar transistor (bipolar transistor BPT). For example, an MOSFET may be provided in place of the bipolar transistor BPT. In this case, for example, an n-type MOSFET is used. In this case, for example, the drain of the n-type MOSFET is coupled to the power supply terminal TPV and the source is coupled to the first terminal TP1.

Second Modification

Figure 38:
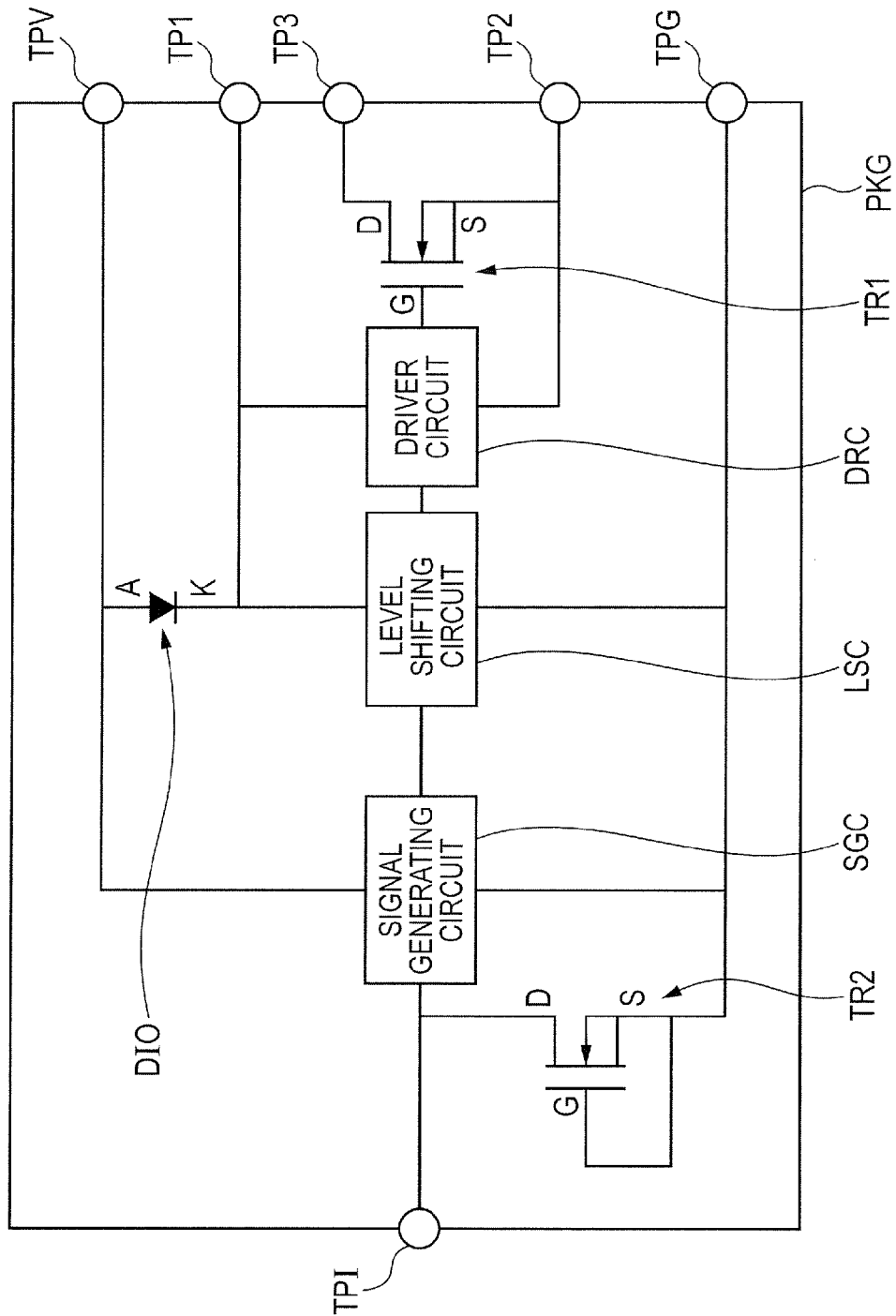
FIG. 38 is a diagram illustrating the circuit configuration of a semiconductor device according to a second modification.

FIG. 38 is a diagram illustrating the circuit configuration of a semiconductor device according to a second modification and corresponds to FIG. 1 of the first embodiment. The semiconductor device according to the modification has a configuration similar to that of the semiconductor device according to the first embodiment except for the point that a transistor TR2 is provided.

In the example illustrated in the diagram, the transistor TR2 is an n-type MOSFET. In the transistor TR2, the drain (D) is coupled to the input terminal TPI, the source (S) is coupled to the grounding terminal TPG, and the gate electrode (G) is coupled to the grounding terminal TPG. More specifically, the drain (D) of the transistor TR2 is electrically coupled between the input terminal TPI and the signal generating circuit SGC.

The transistor TR2 functions as a protection transistor. Concretely, there is a case that ESD (Electro Static Discharge) occurs in the input terminal TPI. When the current generated by the ESD flows in an internal element (for example, the signal generating circuit SGC) in the semiconductor package PKG, the element may be broken. To address the situation, in the example illustrated in the diagram, the transistor TR2 is provided. In this case, even ESD occurs in the input terminal TPI, current generated by the ESD flows to the grounding terminal TPG via the transistor TR2. As a result, the current generated by the ESD can be prevented from flowing in the internal element (for example, the signal generating circuit SGC) in the semiconductor package PKG.

Figure 39:
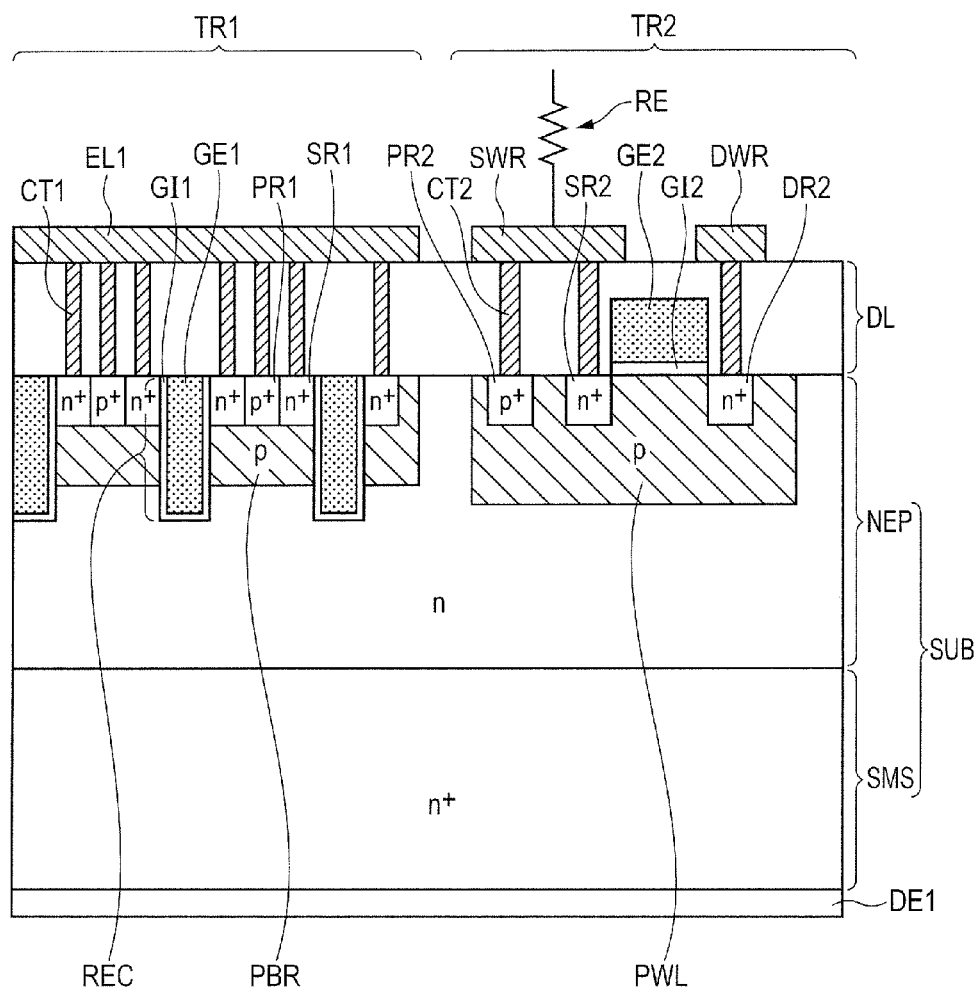
FIG. 39 is a cross section illustrating the configuration of the semiconductor device according to the second modification.

FIG. 39 is a cross section illustrating the configuration of the semiconductor device according to the second modification. In the semiconductor device, the transistor TR1 (FIG. 38) and the transistor TR2 (FIG. 38) are formed by using the same substrate SUB. The transistor TR1 in the example illustrated in the diagram has a configuration similar to that of the transistor TR1 in the example illustrated in FIG. 4 and is a vertical power transistor. On the other hand, the transistor TR2 is a planar transistor.

As illustrated in the diagram, the transistor TR2 has a gate electrode GE2, a gate insulating film GI2, a drain region DR2, a source region SR2, and a second-conduction-type region PR2. In this case, in the first-conduction-type semiconductor layer NEP, a second-conduction-type well PWL is formed. The transistor TR2 is formed by using the second-conduction-type well PWL.

The gate electrode GE2 is positioned over the substrate SUB. The gate insulating film GI2 is positioned between the gate electrode GE2 and the substrate SUB. The gate electrode GE2 is formed by, for example, polysilicon. The gate insulating film GI2 is formed by, for example, a silicon oxide film ($SiO_2$).

The second-conduction-type well PWL has the drain region DR2 and the source region SR2. Each of the drain region DR2 and the source region SR2 is a first-conduction-type region. In the example illustrated in the diagram, the drain region DR2 and the source region SR2 are shallower than the second-conduction-type well PWL.

The second-conduction-type well PWL has the second-conduction-type region PR2. The second-conduction-type region PR2 is a conduction-type region for applying a reference potential to the second-conduction-type well PWL. In the example illustrated in the diagram, the second-conduction-type region PR2 is positioned on the side opposite to the gate electrode GE2 using the source region SR2 as a reference.

In the insulating layer DL, a contact CT2 is buried. Further, on the insulating layer DL, a drain wire DWR and a source wire SWR are formed. The drain region DR2 is coupled to the drain wire DWR via the contact CT2. The source region SR2 and the second-conduction-type region PR2 are coupled to the source wire SWR via the contact CT2. The contact CT2, the drain wire DWR, and the source wire SWR are formed by, for example, aluminum (Al).

To the source wire SWR, a resistive element RE is coupled. The resistive element RE is, for example, a high-resistive metal buried in a wiring layer over the insulating layer DL. As another example, the resistive element RE is a polysilicon resistor positioned over an isolation region (for example, an insulating film formed by STI (Shallow Trench Isolation)) or LOCOS (LOCal Oxidation of Silicon)) formed in the substrate SUB.

In the above-described case, the high-resistive metal is, for example, a metal whose electric resistivity at 25° C. is equal to or higher than 40 μΩ·cm and is equal to or less than 200 μΩ·cm. More concretely, the high-resistive metal is, for example, titanium (Ti), titanium nitride (TiN), tantalum (Ta), or tantalum nitride (TaN). The material of the resistive element RE is not limited to this example.

Figure 40:
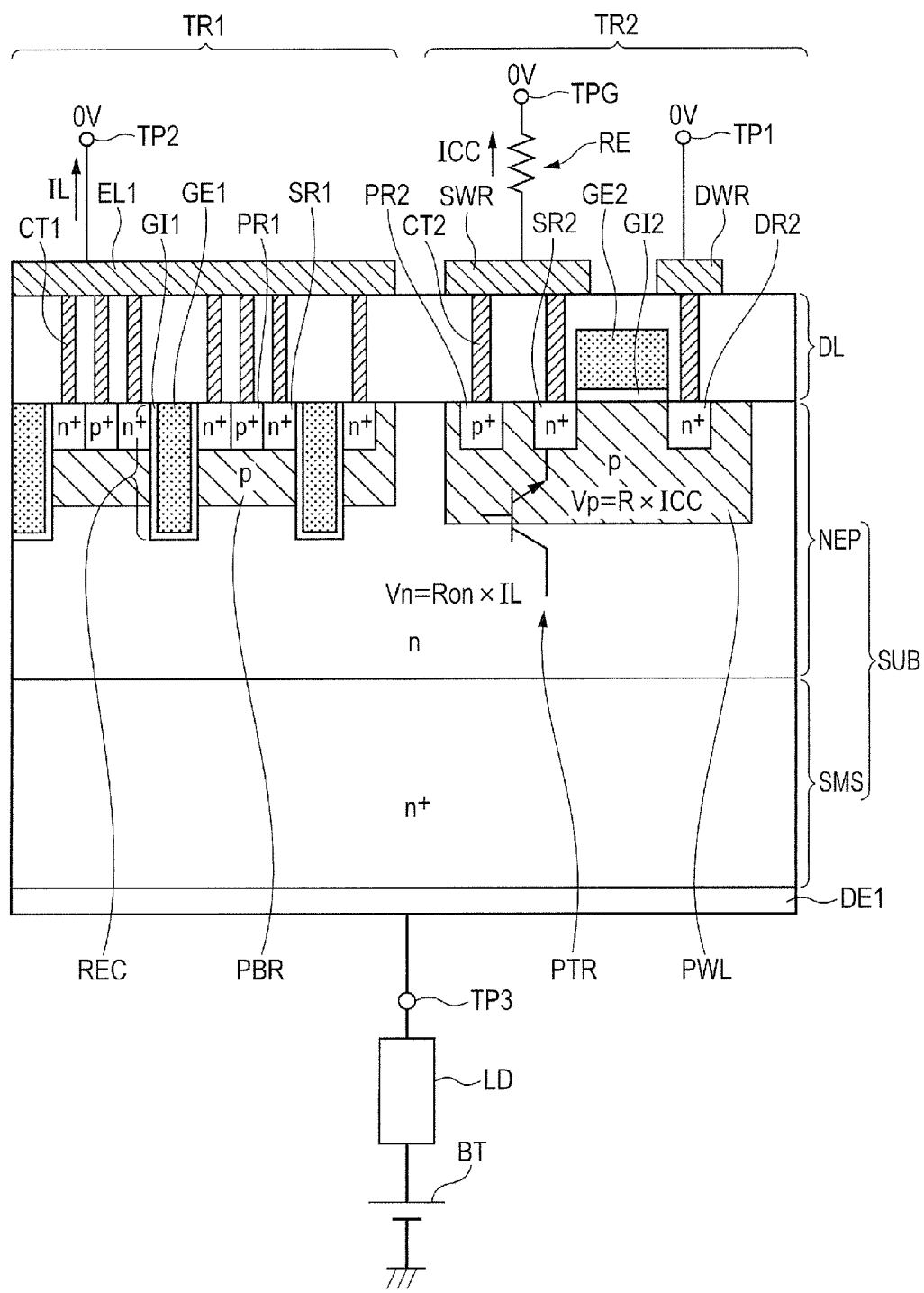
FIG. 40 is a diagram for explaining the operation of the semiconductor device illustrated in FIG. 39.

FIG. 40 is a diagram for explaining the operation of the semiconductor device illustrated in FIG. 39. In the example illustrated in the diagram, the semiconductor package PKG illustrated in FIG. 39 is used as a low-side switch as depicted in FIGS. 8 to 10. In this case, the drain wire DWR is coupled to the input terminal TPI. The resistive element RE is coupled to the grounding terminal TPG (grounding potential: 0V). The electrode EL1 is coupled to the second terminal TP2 (grounding potential: 0V). The drain electrode DE1 is coupled to the third terminal TP3.

As illustrated in FIG. 40, in a region in which the transistor TR2 is formed, there is a case that a parasitic transistor PTR (npn bipolar transistor) is formed by the first-conduction-type semiconductor layer NEP, the second-conduction-type well PWL, and the source region SR2. In this case, current generated by ESD between the power supply BT and the third terminal TP3 may flow into the third terminal TP3 via the load LD. In this case, electro-current constriction may cause destruction of the source region SR2 (n channel).

In the example illustrated in FIG. 40, the source wire SWR is coupled to the grounding terminal TPG via the resistive element RE. Consequently, even when the parasitic transistor PTR is turned on, current flowing in the parasitic transistor PTR is regulated by the resistive element RE. Therefore, electro-current constriction in the source region SR2 can be suppressed.

When rated current of the transistor TR1 flows in the load LD, potential Vp of the second-conduction-type well PW has to be lower than potential Vn of the first-conduction-type semiconductor layer NEP (Vp<Vn). The reason is that if the relation Vn>Vp is satisfied, current flows from the second-conduction-type well PWL to the first-conduction-type semiconductor layer NEP.

To satisfy Vp<Vn, resistance R of the resistive element RE is designed as follows. First, IL is set as current flowing in the load LD (FIGS. 8 to 10). Ron is set as on resistance of the first-conduction-type semiconductor layer NEP. R is set as resistance of the resistive element RE. ICC is set as current flowing in the transistor TR2. In this case, as illustrated in FIG. 40, Vp=R×ICC and Vn=Ron×IL are satisfied. Consequently, to satisfy Vp<Vn, R<(Ron×IL)/ICC has to be satisfied.

As described above, according to the modification, the semiconductor package PKG has the transistor TR2 (protection transistor). With the configuration, even when ESS is generated in the input terminal TPI in the semiconductor package PKG, the internal element in the semiconductor package PKG can be protected. Further, the transistor TR2 is provided with the resistive element RE. With the configuration, even when ESD is generated in the third terminal TP3 in the semiconductor package PKG, the transistor TR2 can be protected.

Third Modification

Figure 41:
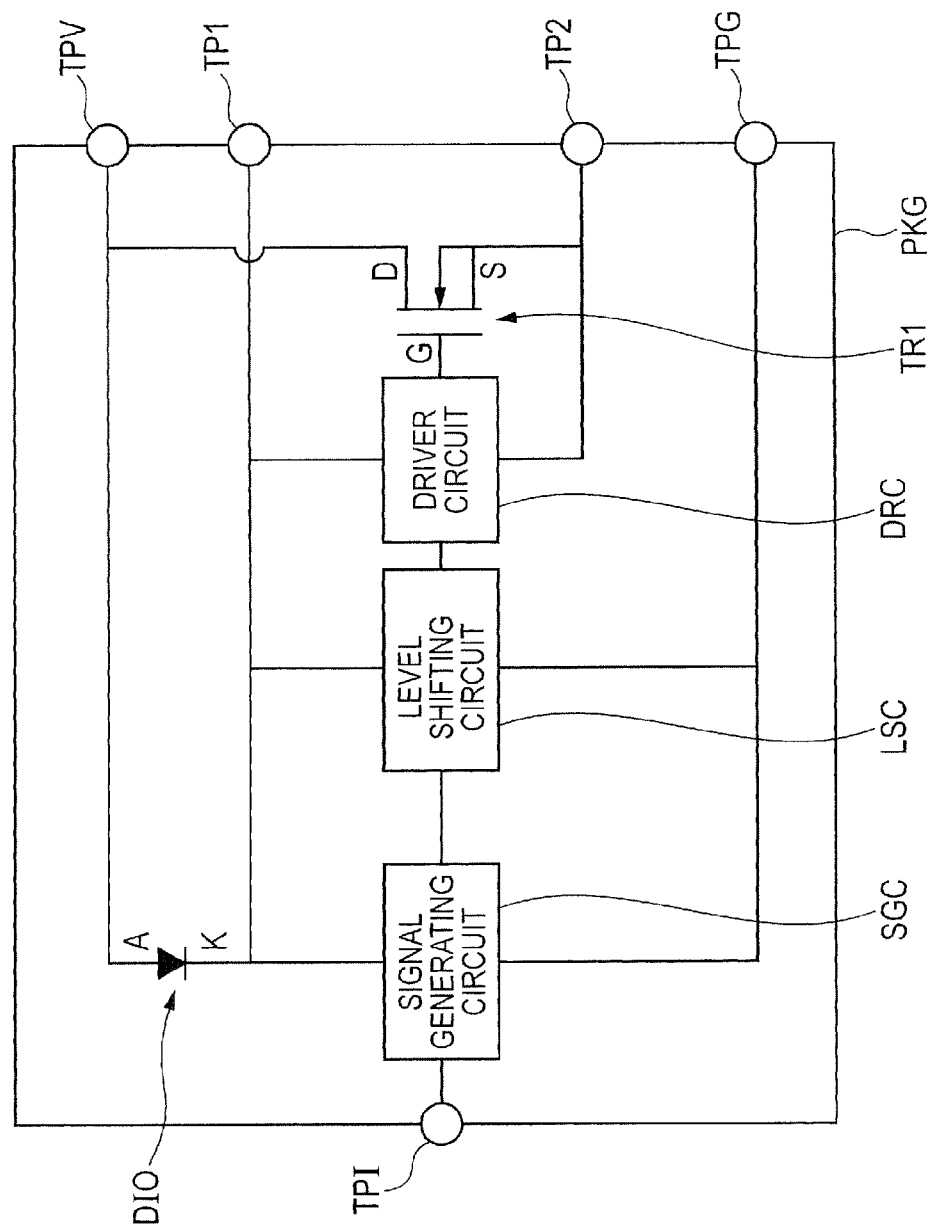
FIG. 41 is a diagram illustrating the circuit configuration of a semiconductor device according to a third modification.

FIG. 41 is a diagram illustrating the circuit configuration of a semiconductor device according to a third modification and corresponds to FIG. 1 of the first embodiment. The semiconductor device of the modification has a configuration similar to that of the semiconductor device according to the first embodiment except for the following points.

In the example illustrated in the diagram, the diode DIO couples the power supply terminal TPV to the first terminal TP1. In this case, the anode (A) of the diode DIO is coupled to the power supply terminal TPV, and the cathode (K) is coupled to the first terminal TP1. The signal generating circuit SGC, the level shifting circuit LSC, and the driver circuit DRC are coupled to the first terminal TP1. In this case, the level shifting circuit LSC and the driver circuit DRC are coupled to the power supply terminal TPV via the diode DIO. In this case, as the details will be described later, drive power can be supplied efficiently to the signal generating circuit SGC.

Further, in the example illustrated in the diagram, the power supply terminal TPV is coupled to the drain (D) of the transistor TR1. With the configuration, the drain voltage of the transistor TR1 is supplied by the power supply terminal TPV.

Figure 42:
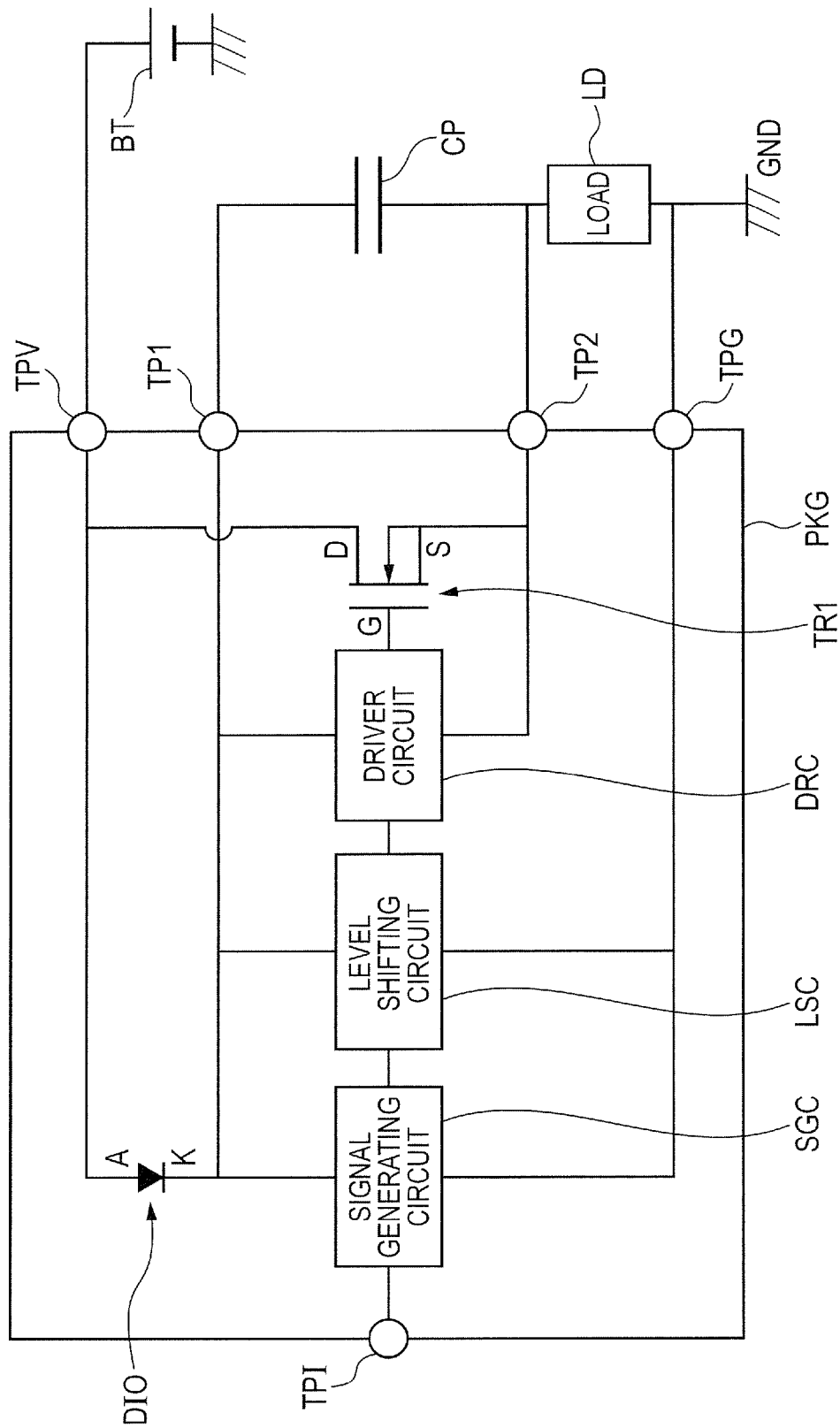
FIG. 42 is a diagram illustrating a first example of the circuit configuration of an electronic device according to the third modification.

FIG. 42 is a diagram illustrating a first example of the circuit configuration of an electronic device according to the modification and corresponds to FIG. 5 of the first embodiment. In the example illustrated in the diagram, the semiconductor package PKG is used as a high-side switch of the load LD. Concretely, the power supply BT, the load LD, and the capacitor CP are provided on the outside of the semiconductor package PKG. In this case, the semiconductor package PKG and the capacitor CP are provided, for example, over the same circuit board (not illustrated). The power supply BT supplies power supply voltage to the power supply terminal TPV. The load LD couples the second terminal TP2 to the grounding terminal TPG. The capacitor CP couples the second terminal TP2 to the first terminal TP1. The grounding terminal TPG is grounded.

Figure 43:
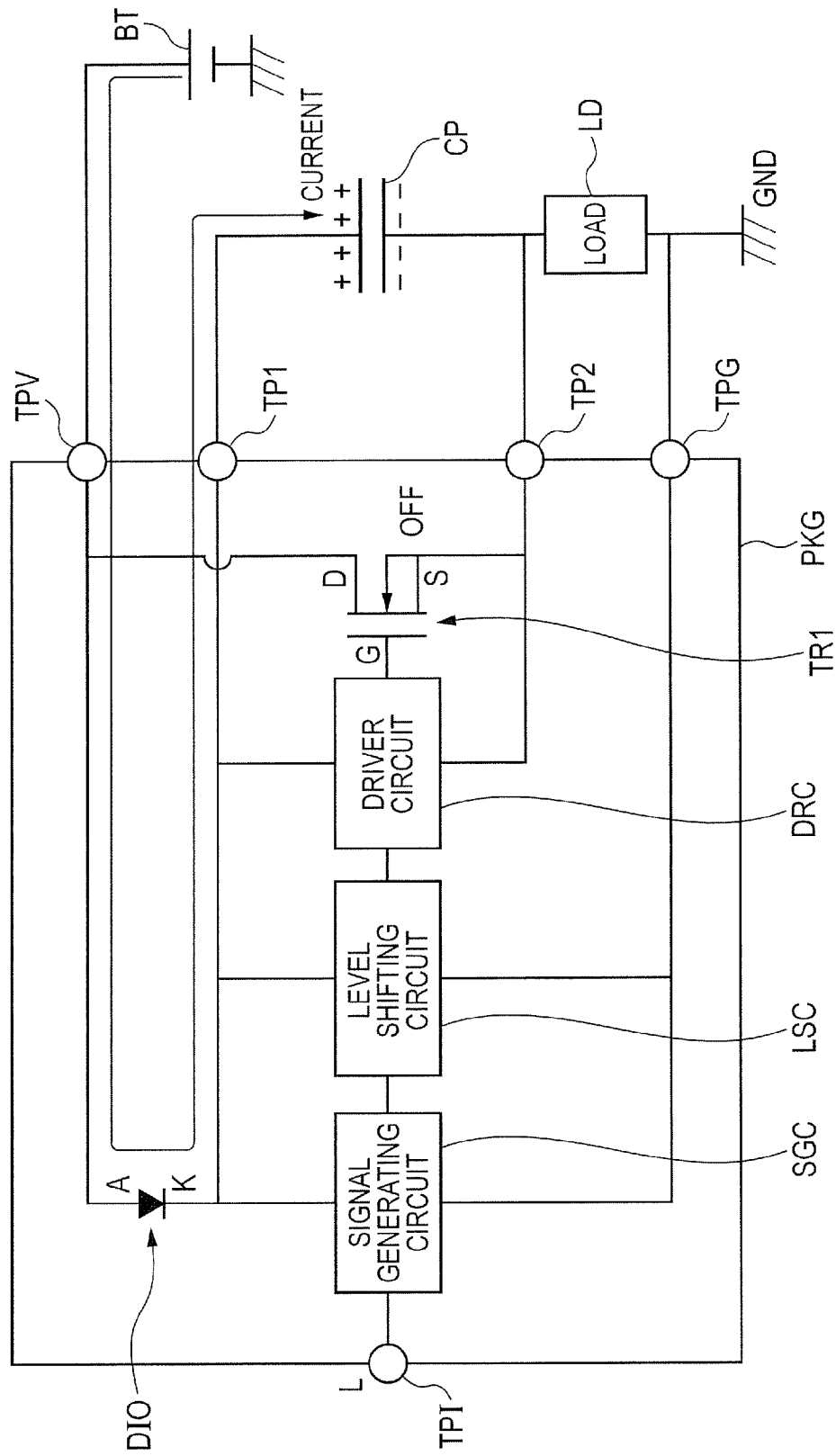
FIG. 43 is a diagram for explaining the operation of the electronic device illustrated in FIG. 42.
Figure 44:
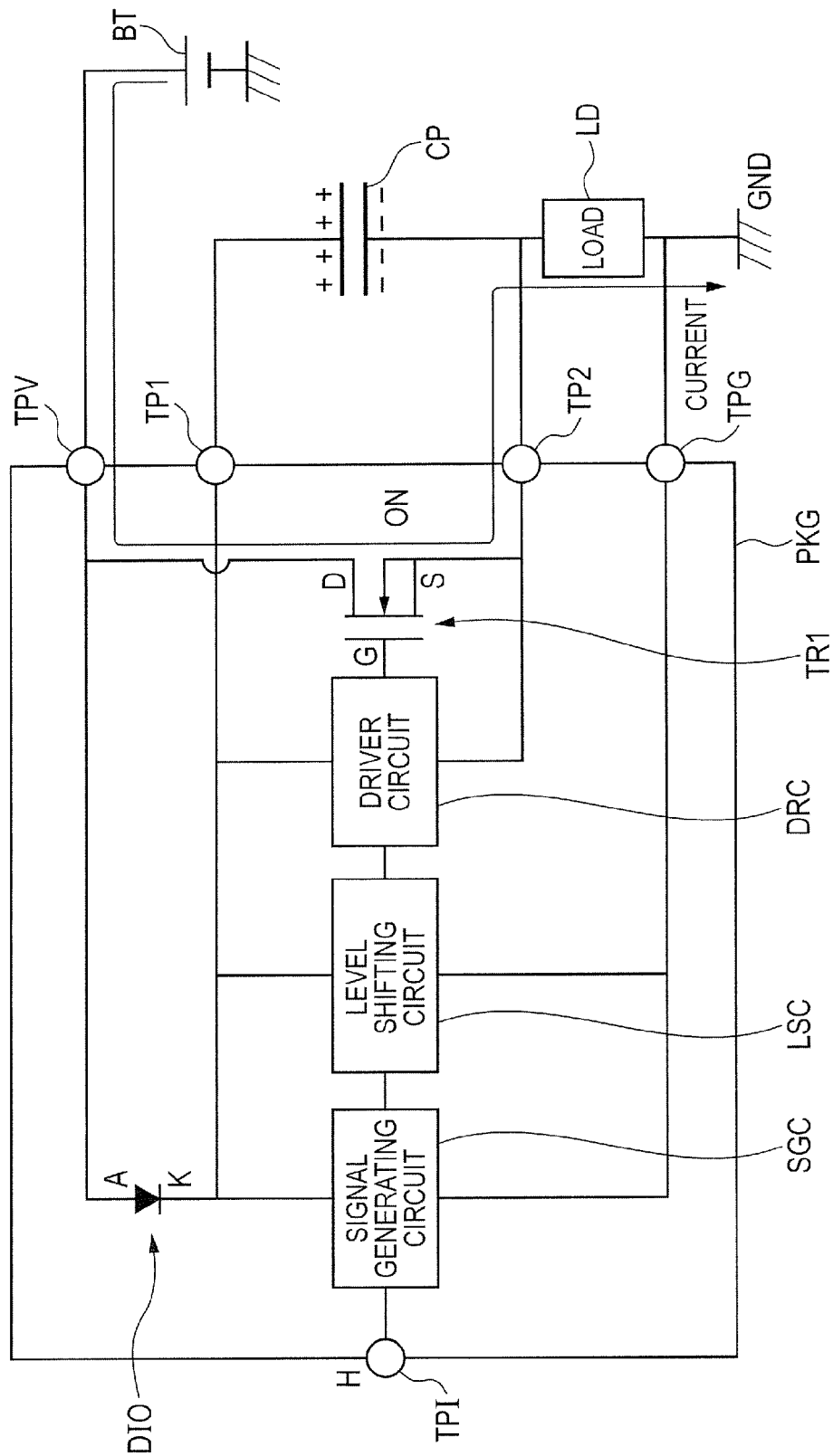
FIG. 44 is a diagram for explaining the operation of the electronic device illustrated in FIG. 42.

Each of FIGS. 43 and 44 is a diagram for explaining operation of the electronic device illustrated in FIG. 42. FIG. 43 corresponds to FIG. 6 of the first embodiment. FIG. 44 corresponds to FIG. 7 of the first embodiment. In an example illustrated in FIG. 43, the transistor TR1 is in an off state. In an example illustrated in FIG. 44, the transistor TR1 is in an on state.

First, in the example illustrated in FIG. 43, the capacitor CP is charged by the power supply BT. Specifically, as described above, the transistor TR1 is in the off state. In this case, no current flows in the transistor TR1. Consequently, as illustrated in the diagram, current flows from the power supply BT to the capacitor CP via the power supply terminal TPV, the diode DIO, and the first terminal TP1. In this case, the capacitor CP is charged with the above-described current. When charging progresses, in the capacitor CP, the potential on the first terminal TP1 side (the potential on the + side in the diagram) becomes higher than the potential on the second terminal TP2 side (the potential on the − side).

Next, in the example illustrated in FIG. 44, each of the power supply voltage to the signal generating circuit SGC, the power supply voltage to the level shifting circuit LSC, and the power supply voltage to the driver circuit DRC is given by the capacitor CP. Specifically, as described above, the transistor TR1 is in the on state. Consequently, as illustrated in the diagram, current flows from the power supply BT to the ground (GND) via the power supply terminal TPV, the transistor TR1, the first terminal TP1, and the load LD. In this case, in the capacitor CP, the potential on the second terminal TP2 side (the potential on the − side in the diagram) is increased by the power supply voltage of the power supply BT. Accordingly, in the capacitor CP, the potential on the first terminal TP1 side (the potential on the + side in the diagram) increases only by the amount of the voltage increased on the second terminal TP2 side. In this case, the potential of the first terminal TP1 can be made higher than the power supply voltage of the power supply BT. In other words, the capacitor CP can function as a boot strap capacitor.

Figure 45:
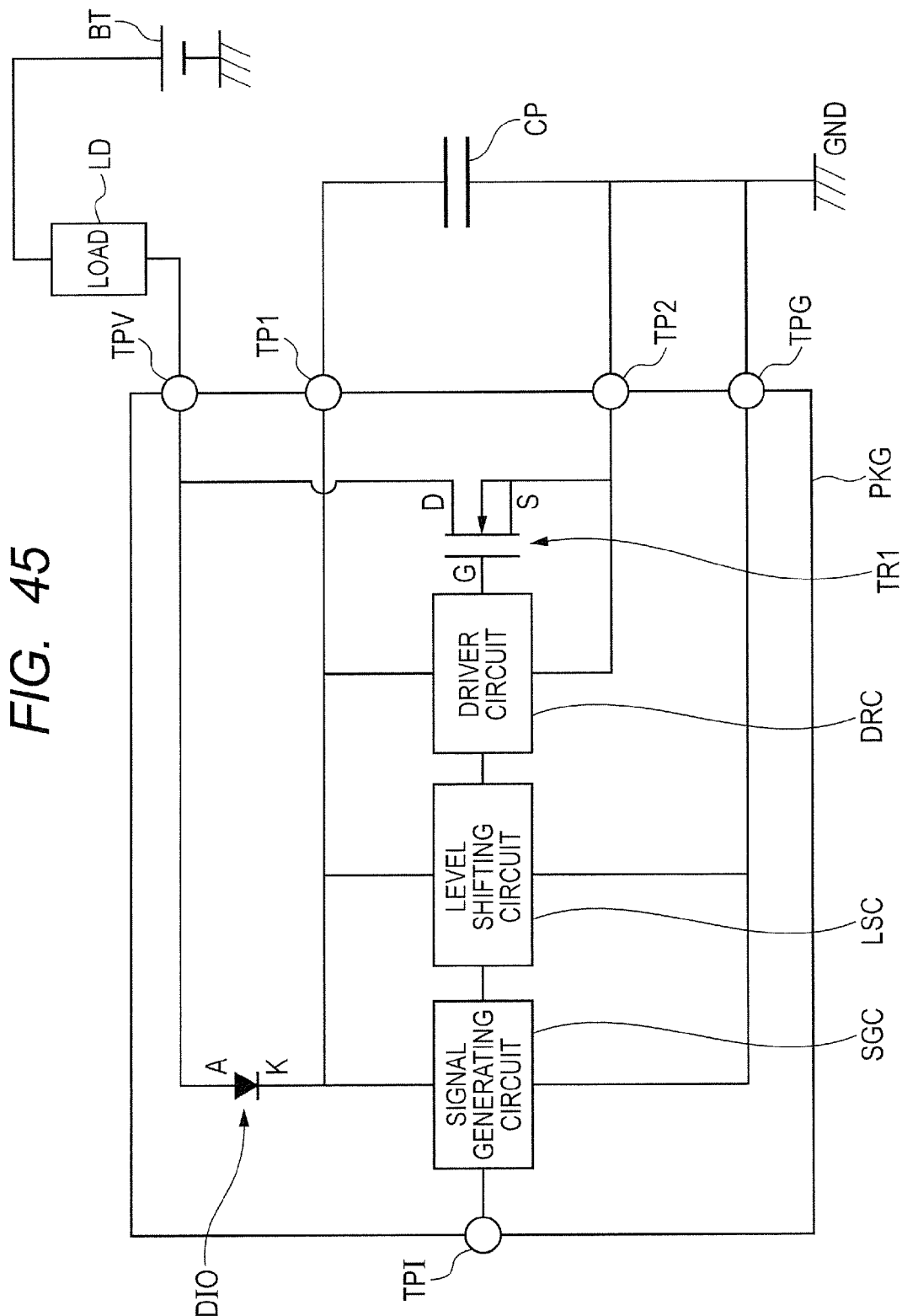
FIG. 45 is a diagram illustrating a second example of the circuit configuration of the electronic device according to the third modification.

FIG. 45 is a diagram illustrating a second example of the circuit configuration of the electronic device according to the modification and corresponds to FIG. 8 of the first embodiment. In the example illustrated in the diagram, the semiconductor package PKG is used as a low-side switch of the load LD. Concretely, the power supply BT, the load LD, and the capacitor CP are provided on the outside of the semiconductor package PKG. In this case, the semiconductor package PKG and the capacitor CP are provided, for example, over the same circuit board (not illustrated). The power supply BT supplies power supply voltage to the power supply terminal TPV via the load LD. The capacitor CP couples the second terminal TP2 to the first terminal TP1. The second terminal TP2 and the grounding terminal TPG are grounded.

Figure 46:
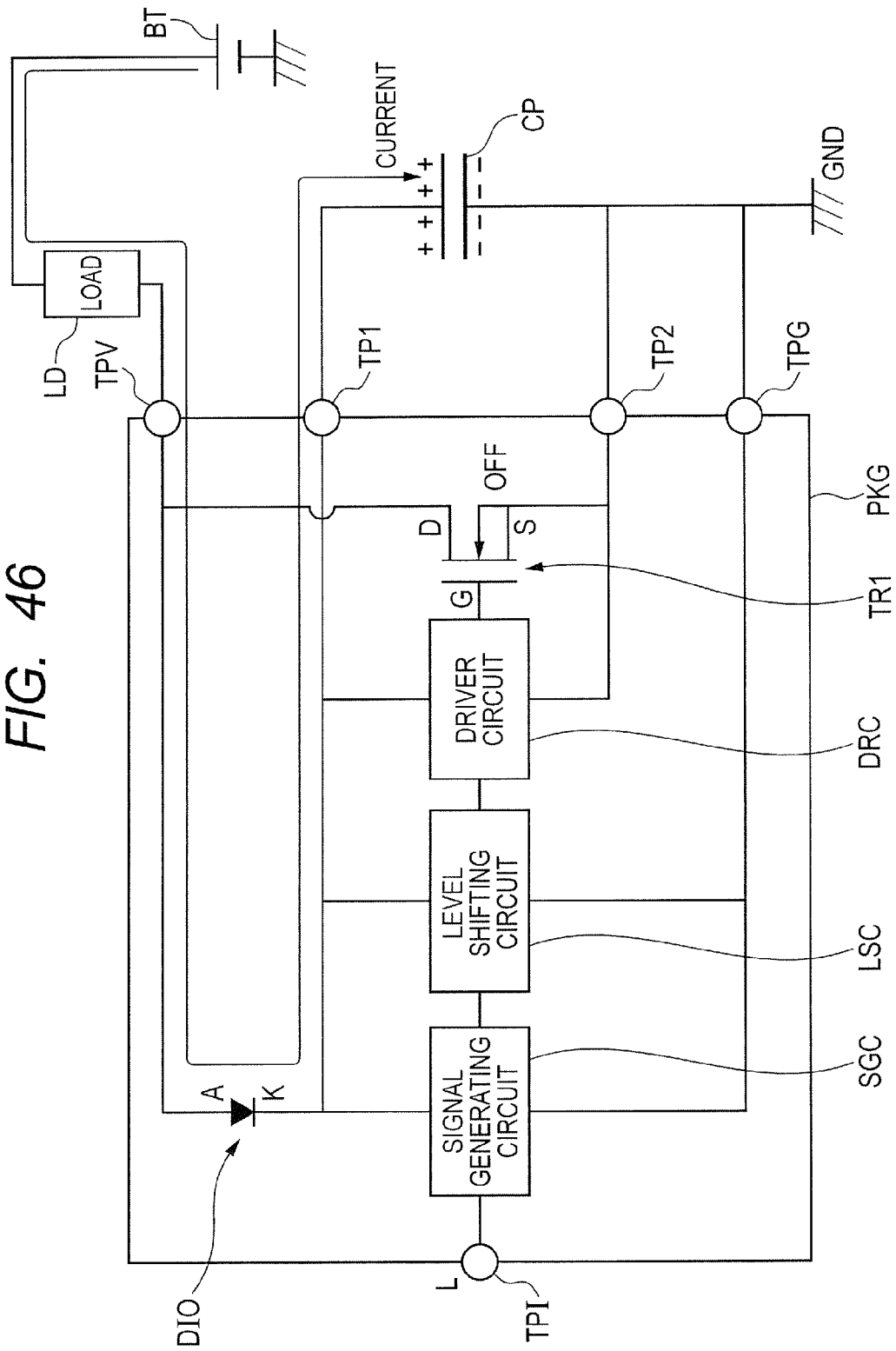
FIG. 46 is a diagram for explaining the operation of the electronic device illustrated in FIG. 45.
Figure 47:
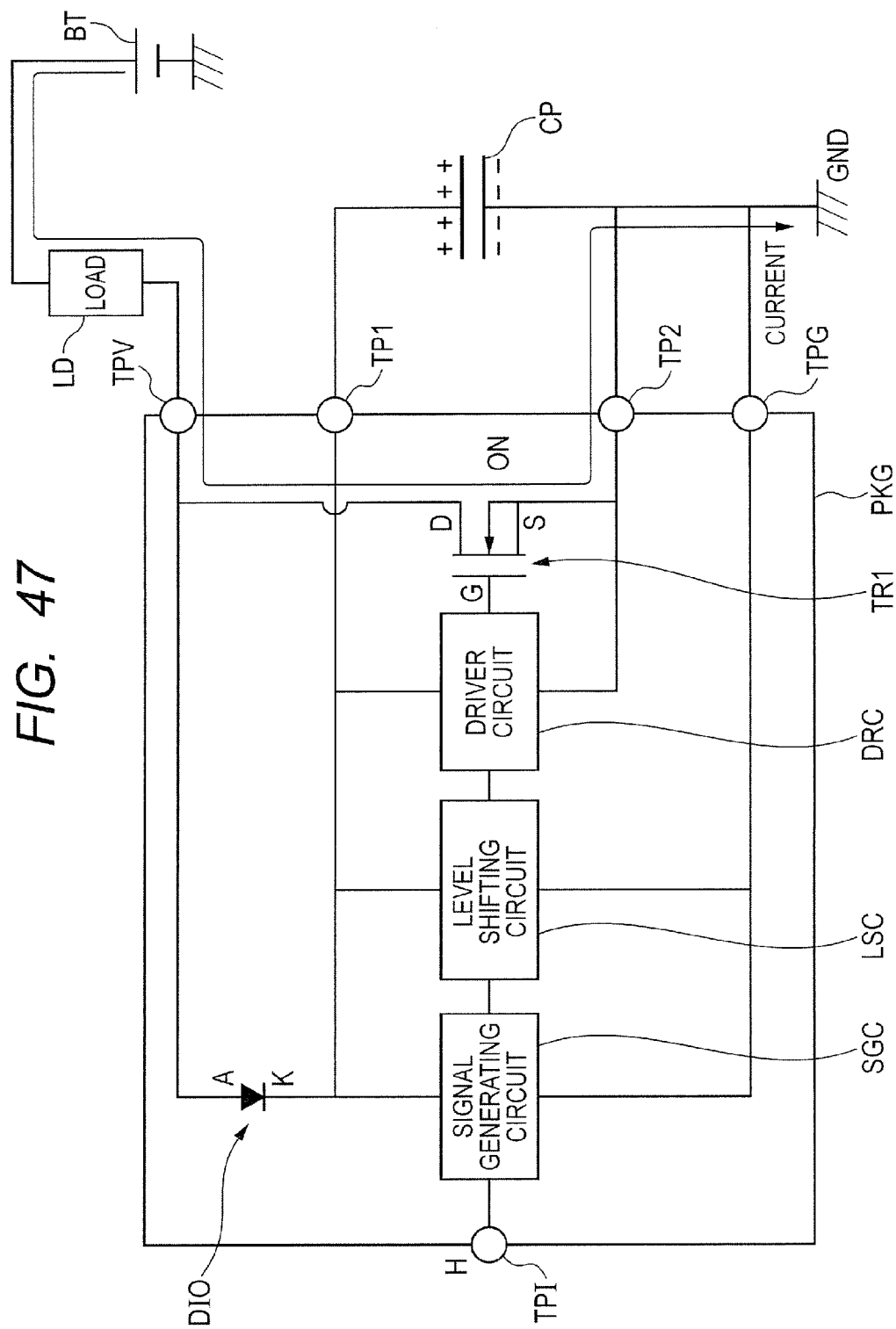
FIG. 47 is a diagram for explaining the operation of the electronic device illustrated in FIG. 45.

Each of FIGS. 46 and 47 is a diagram for explaining operation of the electronic device illustrated in FIG. 45. FIG. 46 corresponds to FIG. 9 of the first embodiment. FIG. 47 corresponds to FIG. 10 of the first embodiment. In an example illustrated in FIG. 46, the transistor TR1 is in an off state. In an example illustrated in FIG. 47, the transistor TR1 is in an on state.

First, in the example illustrated in FIG. 46, the capacitor CP is charged by the power supply BT. Specifically, as described above, the transistor TR1 is in the off state. In this case, no current flows in the transistor TR1. Consequently, as illustrated in the diagram, current flows from the power supply BT to the capacitor CP via the load LD, the power supply terminal TPV, the diode DIO, and the first terminal TP1. In this case, the capacitor CP is charged with the above-described current. When charging progresses, in the capacitor CP, the potential on the first terminal TP1 side (the potential on the + side in the diagram) becomes higher than the potential on the second terminal TP2 side (the potential on the − side in the diagram).

Next, in the example illustrated in FIG. 47, each of the power supply voltage to the signal generating circuit SGC, the power supply voltage to the level shifting circuit LSC, and the power supply voltage to the driver circuit DRC is given by the capacitor CP. Specifically, as described above, the transistor TR1 is in the on state. Consequently, current flows from the power supply BT to the ground (GND) via the load LD, the power supply terminal TPV, the transistor TR1, and the second terminal TP2. Also in the example illustrated in the diagram, the second terminal TP2 remains grounded. Accordingly, in the capacitor CP, the potential on the first terminal TP1 side (the potential on the + side in the diagram) remains higher than the potential on the second terminal TP2 side (the potential on the − side in the diagram). Consequently, the potential of the first terminal TP1 can be made higher than any of the potential of the second terminal TP2 and the potential of the grounding terminal TPG.

In the above-described case, the power supply voltage to the level shifting circuit LCP and the power supply voltage to the driver circuit DRC is supplied by the capacitor CP. Further, the power supply voltage to the signal generating circuit SGC is also supplied by the capacitor CP. In this case, the drive power of the signal generating circuit SGC can be efficiently supplied. Specifically, in the examples illustrated in FIGS. 45 to 47, the power supply BT is coupled to the power supply terminal TPV via the load LD. In this case, electric coupling between the power supply BT and the power supply terminal TPV may be disturbed by the load LD. In the modification, even such a situation occurs, the drive power of the signal generating circuit SGC can be supplied by the capacitor CP.

As described above, in the modification, as illustrated in FIGS. 42 to 44, the semiconductor package PKG can be used as a high-side switch. As illustrated in FIGS. 45 to 47, the semiconductor package PKG can be also used as a low-side switch. In both of the case of using the semiconductor package PKG as a high-side switch and the case of using the semiconductor package PKG as a low-side switch, the configuration of the semiconductor package PKG is the same. As described above, according to the modification, the semiconductor package PKG can be used as any of the high-side switch and the low-side switch depending on a use.

Further, according to the modification, the semiconductor package PKG does not have to include the third terminal TP3 (FIG. 11). Consequently, according to the modification, as compared with the first embodiment, the number of terminals (leads) of the semiconductor package PKG can be decreased.

Fourth Modification

Figure 48:
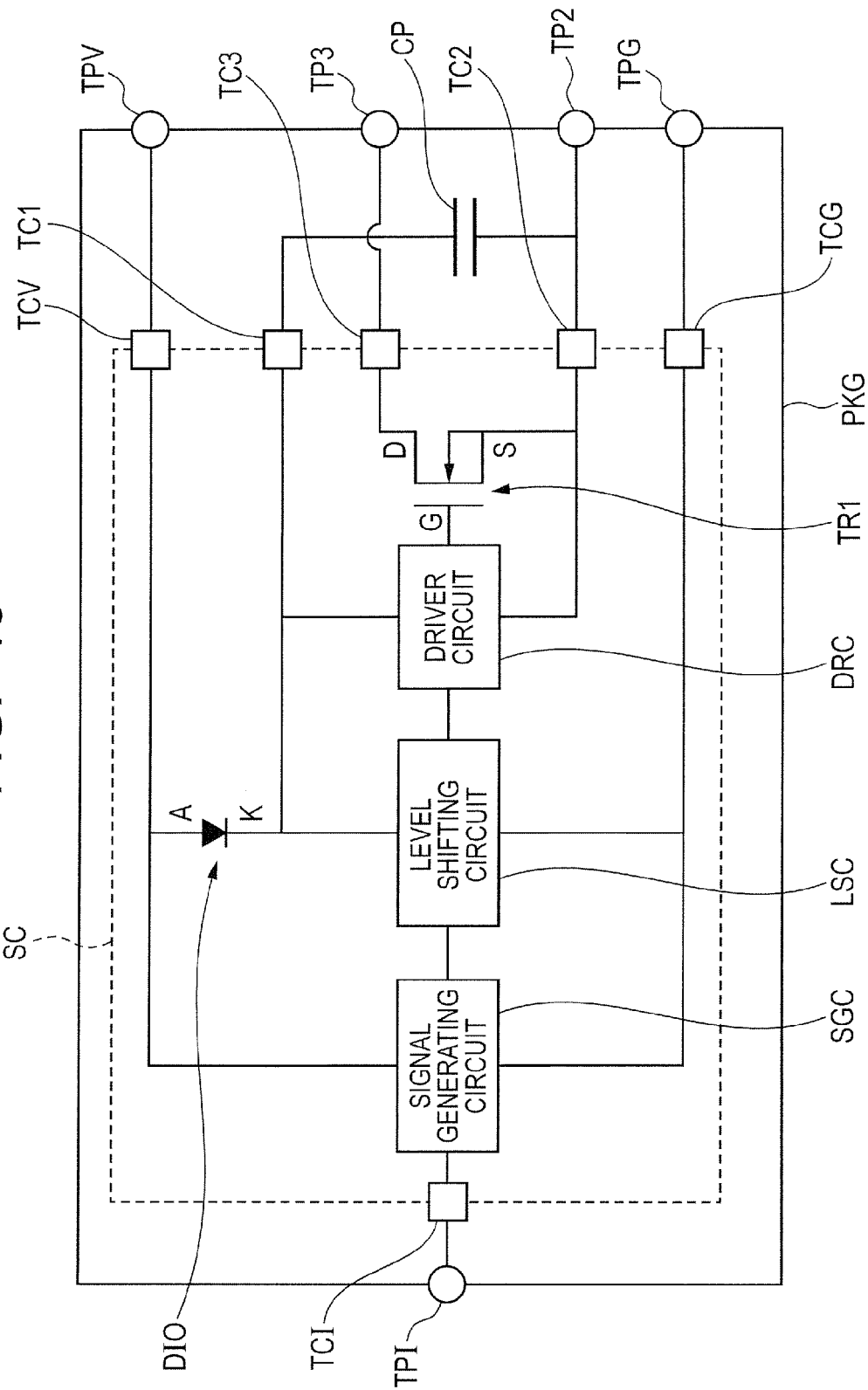
FIG. 48 is a diagram illustrating the circuit configuration of a semiconductor device according to a fourth modification.

FIG. 48 is a diagram illustrating the circuit configuration of a semiconductor device according to a fourth modification and corresponds to FIG. 11 of the first embodiment. The semiconductor device according to the modification has a configuration similar to that of the semiconductor device according to the first embodiment except for the following points.

In an example illustrated in the diagram, the semiconductor package PKG has the semiconductor chip SC and the capacitor CP. In this case, the capacitor CP is provided on the inside of the semiconductor package PKG. Further, the capacitor CP is positioned on the outside of the semiconductor chip SC. Concretely, for example, the semiconductor chip SC and the capacitor CP are sealed by the same sealing resin.

More specifically, the semiconductor package PKG has the power supply terminal TPV, the grounding terminal TPG, the input terminal TPI, the second terminal TP2, and the third terminal TP3. On the other hand, the semiconductor chip SC has the power supply terminal TCV, the grounding terminal TCG, the input terminal TCI, the first terminal TC1, the second terminal TC2, and the third terminal TC3. The power supply terminal TPV is coupled to the power supply terminal TCV. The grounding terminal TPG is coupled to the grounding terminal TCG. The input terminal TPI is coupled to the input terminal TCI. The second terminal TP2 is coupled to the second terminal TC2. Further, the second terminal TP2 is coupled to the first terminal TC1 via the capacitor CP. The third terminal TP3 is coupled to the third terminal TC3.

Also in the modification, like in the first embodiment, the semiconductor package PKG can be used as any of the high-side switch and the low-side switch. In any of the case of using the semiconductor package PKG as the high-side switch and the case of using the semiconductor package PKG as the low-side switch, the configuration of the semiconductor package PKG is the same. As described above, according to the modification, the semiconductor package PKG can be used as any of the high-side switch and the low-side switch depending on a use.

Further, according to the modification, the semiconductor package PKG does not have to include the first terminal TP1 (FIG. 11). Consequently, according to the modification, as compared with the first embodiment, the number of terminals (leads) of the semiconductor package PKG can be decreased.

Although the invention achieved by the inventors of the present invention has been concretely described above on the basis of the embodiments, obviously, the present invention is not limited to the foregoing embodiments but can be variously changed without departing from the gist.

What is claimed is:

1. An electronic device comprising:
    a power supply terminal which is coupled to a power supply voltage;
    a grounding terminal which is coupled to a ground potential;
    an input terminal;
    a first terminal;
    a second terminal;
    a third terminal;
    a level shifting circuit which is coupled to the input terminal, the first terminal, and the grounding terminal and to which drive power is supplied from the first terminal;
    a driver circuit which is coupled to the first and second terminals and to which an output signal of the level shifting circuit is input and drive power is supplied from the first terminal;
    a first transistor whose gate electrode is coupled to the driver circuit, whose source is coupled to the second terminal, and whose drain is coupled to the third terminal; and
    a first element coupling the power supply terminal to the first terminal and the first element is a diode or a second transistor,
    wherein, when the power supply voltage is coupled to both the power supply terminal and the third terminal, a capacitor is coupled between the first terminal and the second terminal in parallel to the driver circuit, a load is coupled between the second terminal and the grounding terminal, and the first transistor is in an on state, a first current flows into the third terminal, through the first transistor, out of the second terminal, through the load, and to the ground potential, and wherein, when the power supply voltage is coupled to the power supply terminal, a capacitor is coupled between the first terminal and the second terminal in parallel to the driver circuit, the load is coupled between the power supply terminal and the third terminal, and the first transistor is in the on state, a second current flows through the load, into the third terminal, through the first transistor, out of the second terminal, and to the ground potential.

2. The electronic device according to claim 1, further comprising:
    a package which includes the power supply terminal, the grounding terminal, the input terminal, the first terminal, the second terminal, the third terminal, the level shifting circuit, the driver circuit, the first transistor, and the first element;
    a first lead coupled to the first terminal;
    a second lead coupled to the second terminal;
    a third lead coupled to the third terminal;
    a fourth lead coupled to the power supply terminal;
    a fifth lead coupled to the grounding terminal; and
    a sixth lead coupled to the input terminal.

3. The electronic device according to claim 1, further comprising:
    a substrate having a first surface and a second surface which are opposed to each other,
    wherein the first transistor has the drain disposed in the first surface and has the source disposed in the second surface, and the power supply terminal is an electrode pad provided on the first surface.

4. The electronic device according to claim 1,
    wherein, when the power supply voltage is coupled to the power supply terminal and the first transistor is in an off state, the capacitor is charged by the power supply voltage.

5. An electronic device comprising:
    a battery;
    a power supply terminal which is coupled to a power supply voltage of the battery;
    a grounding terminal which is coupled to a ground potential;
    an input terminal;
    a first terminal;
    a second terminal;
    a level shifting circuit which is coupled to the input terminal, the first terminal, and the grounding terminal and to which drive power is supplied from the first terminal;
    a driver circuit which is coupled to the first and second terminals and to which an output signal of the level shifting circuit is input and drive power is supplied from the first terminal;
    a first transistor whose gate electrode is coupled to the driver circuit, whose source is coupled to the second terminal, and whose drain is coupled to the third terminal;
    a first element coupling the power supply terminal to the first terminal and the first element is a diode or a second transistor; and
    a capacitor coupled between the first terminal and the second terminal in parallel to the driver circuit,
    wherein, when the power supply voltage is coupled to both the power supply terminal and the third terminal, the capacitor is coupled between the first terminal and the second terminal in parallel to the driver circuit, a load is coupled between the second terminal and the grounding terminal, and the first transistor is in an on state, a first current flows from the battery into the third terminal, through the first transistor, out of the second terminal, through the load, and to the ground potential, and wherein, when the power supply voltage is coupled to the power supply terminal, the capacitor is coupled between the first terminal and the second terminal in parallel to the driver circuit, the load is coupled between the power supply terminal and the third terminal, and the first transistor is in the on state, a second current flows from the battery through the load, into the third terminal, through the first transistor, out of the second terminal, and to the ground potential.

6. The electronic device according to claim 5, further comprising:
a package which includes the power supply terminal, the grounding terminal, the input terminal, the first terminal, the second terminal, the third terminal, the level shifting circuit, the driver circuit, the first transistor, and the first element;
a first lead coupled to the first terminal;
a second lead coupled to the second terminal;
a third lead coupled to the third terminal;
a fourth lead coupled to the power supply terminal;
a fifth lead coupled to the grounding terminal; and
a sixth lead coupled the input terminal.

7. The electronic device according to claim 5, further comprising:
a substrate having a first surface and a second surface which are opposed to each other,
wherein the first transistor has the drain disposed in the first surface and has the source disposed in the second surface, and the power supply terminal is an electrode pad provided on the first surface.

8. An electronic device comprising:
a power supply terminal which is coupled to a power supply voltage;
a grounding terminal which is coupled to a ground potential;
an input terminal;
a first terminal;
a second terminal;
a level shifting circuit which is coupled to the input terminal, the first terminal, and the grounding terminal and to which drive power is supplied from the first terminal;
a driver circuit which is coupled to the first terminal and the second terminal, and to which an output signal of the level shifting circuit is input and drive power is supplied from the first terminal;
a first transistor whose gate electrode is coupled to the driver circuit, whose source is coupled to the second terminal, and whose drain is coupled to the third terminal; and
a first element coupling the power supply terminal to the first terminal and the first element is a diode or a second transistor,
wherein, when the power supply voltage is coupled to both the power supply terminal and the third terminal, a capacitor is coupled between the first terminal and the second terminal in parallel to the driver circuit, a load is coupled between the second terminal and the grounding terminal, and the first transistor is in an on state, a first current flows into the third terminal, through the first transistor, out of the second terminal, through the load, and to the ground potential, and
wherein, when the power supply voltage is coupled to the power supply terminal, a capacitor is coupled between the first terminal and the second terminal in parallel to the driver circuit, the load is coupled between the power supply terminal and the third terminal, the second terminal is coupled to the grounding terminal, and the first transistor is in the on state, a second current flows through the load, into the third terminal, through the first transistor, out of the second terminal, and to the ground potential.

9. The electronic device according to claim 8, further comprising:
a package which includes the power supply terminal, the grounding terminal, the input terminal, the first terminal, the second terminal, the third terminal, the level shifting circuit, the driver circuit, the first transistor, and the first element;
a first lead coupled to the first terminal;
a second lead coupled to the second terminal;
a third lead coupled to the third terminal;
a fourth lead coupled to the power supply terminal;
a fifth lead coupled to the grounding terminal; and
a sixth lead coupled to the input terminal.

* * * * *